(12) United States Patent
Kamenomostskiy

(10) Patent No.: US 8,924,187 B1
(45) Date of Patent: Dec. 30, 2014

(54) TOOL FOR OPTIMIZED THIN WALL PROFILE MEMBER (TPM) AND TPM-PANEL DESIGN AND SELECTION

(71) Applicant: Aleksandr I. Kamenomostskiy, New York, NY (US)

(72) Inventor: Aleksandr I. Kamenomostskiy, New York, NY (US)

(73) Assignee: Fair LLC, New York, NY (US)

( * ) Notice: Subject to any disclaimer, the term of this patent is extended or adjusted under 35 U.S.C. 154(b) by 7 days.

(21) Appl. No.: 13/842,488

(22) Filed: Mar. 15, 2013

Related U.S. Application Data

(63) Continuation-in-part of application No. 13/317,871, filed on Oct. 31, 2011, now Pat. No. 8,458,988, which is a continuation-in-part of application No. 12/462,521, filed on Aug. 5, 2009, now abandoned, which is a continuation of application No. 10/913,616, filed on Aug. 6, 2004, now abandoned, which is a continuation of application No. 10/149,049, filed as application No. PCT/RU00/00494 on Dec. 1, 2000, now abandoned.

(51) Int. Cl.
*G06F 7/60* (2006.01)
*G06F 17/10* (2006.01)
*G06F 17/50* (2006.01)

(52) U.S. Cl.
CPC .................. *G06F 17/5004* (2013.01)

USPC .............................................. 703/2

(58) Field of Classification Search
None
See application file for complete search history.

(56) References Cited

PUBLICATIONS

Kamenomostskiy, A.J. "Structural Mechanics and Design of Buildings", 1990.*
Boeing Design Manual BDM-6080, Rev. A, May 1, 1992, pp. 1-44.
Cohen, G.A., "Optimum Design of Truss-Core Sandwich Cylinders Under Axial Compression", Mar. 20, 1963, pp. 162-168, Aeronutronic Division, Ford Motor Company.

* cited by examiner

*Primary Examiner* — Omar Fernandez Rivas
*Assistant Examiner* — Bernard E Cothran
(74) *Attorney, Agent, or Firm* — Adams & Wilks

(57) ABSTRACT

The present disclosure describes tools and associated computational analysis methodologies employed therein for improved minimum weight design of thin wall profile members (TPMs). The tools draw on inter-dependent parameters relating to TPM cross-section dimensions ratio values and established constructive restrictions to calculate, using appropriate algorithmic computational analysis, the optimum cross-section dimensions values of a given TPM. A design selection serves as a blueprint for the next stage, which is the actual fabrication or manufacturing of the component. For a given set of constructive restrictions, the final product is based on optimum configurations selected from a fixed set of TPMs with varied cross-sectional shapes.

24 Claims, 47 Drawing Sheets

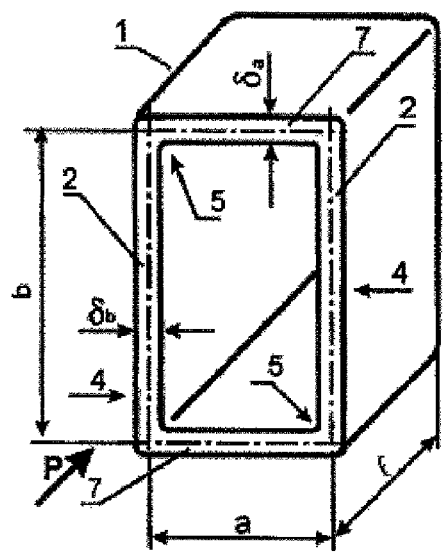
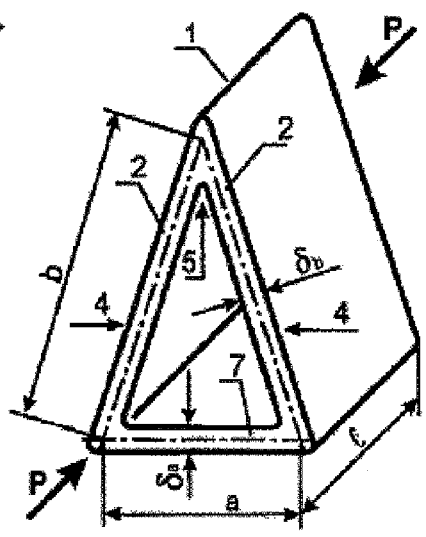
FIG.1
FIG.2
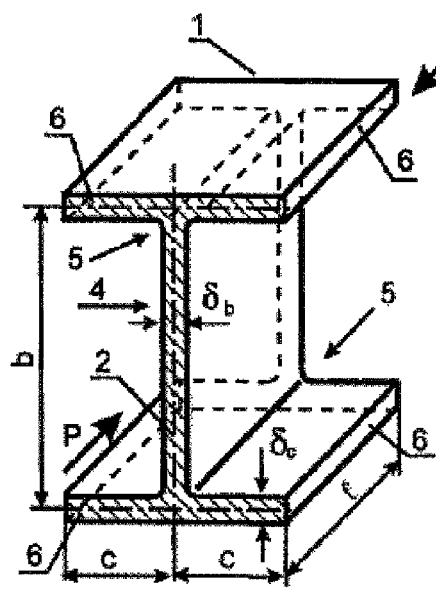
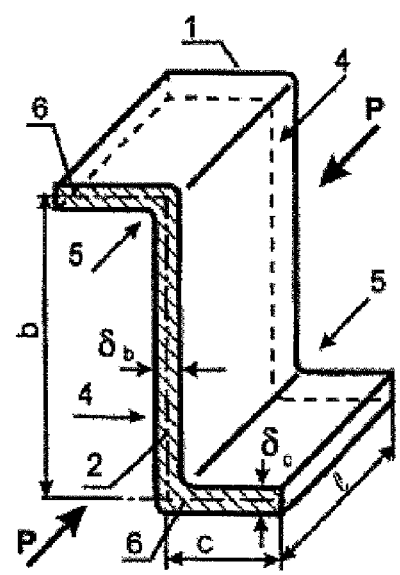
FIG.3
FIG.4

Feasible dimensions of U-shaped TPM

| Profile No. | $a_3=a_4=\frac{\delta_a}{\delta_b}=\frac{\delta_c}{\delta_b}$ | $a_2=\frac{b}{a}$ | $a_1=\frac{c}{b}$ | $A$ | $K_s$ | $A_1$ | $A_2$ |
|---|---|---|---|---|---|---|---|
| 1 | 1.0 | 2.1 | 0.3 | 0.4042 | 1.16 | 0.596 | 0.26 |
| 2 | 1.5 | 2.3 | 0.3 | 0.4141 | 0.54 | 0.531 | 0.346 |
| 3 | 2.0 | 2.3 | 0.3 | 0.4155 | 0.35 | 0.513 | 0.416 |

FIG. 41

Range of allowable values for the stringer panel stress factors

| Description | Material D-16T | | | Material B95 | | |
|---|---|---|---|---|---|---|
| Panel stress factor \ Stringer profile shape | 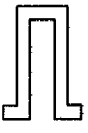 | 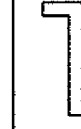 |  | 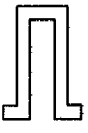 | 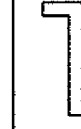 |  |
| $q_p$ [daN/cm²] | 71-128 | 65-∞ | 113-∞ | 161-287 | 147-∞ | 258-∞ |

Features of real and optional-design panels

| Panel \ Feature | Real | | Designed | |
|---|---|---|---|---|
| | I | II | I | II |
| $q_p$ [daN/cm] | 934 | 555 | 934 | 555 |
| $l_s$ [cm] | 45 | 40 | 45 | 40 |
| $B$ [cm] | 31.4 | 33.4 | 31.4 | 33.4 |
| $a_1$ [mm] | 20 | 20 | 13 | 13 |
| $\delta_{a1}$ [mm] | 2.5 | 2 | 1.8 | 1.2 |
| $a_2$ [mm] | 30 | 25 | 26 | 17 |
| $\delta_{a2}$ [mm] | 2 | 1.6 | 1 | 1 |
| $a_3$ [mm] | 20 | 20 | 13 | 13 |
| $\delta_{a3}$ [mm] | 2.5 | 1.5 | 1.8 | 1.2 |
| $\delta$ [mm] | 1.5 | 1.25 | 1 | 1 |
| $b_s$ [mm] | 70 | 58 | 32 | 30 |
| $\sigma$ [daN/cm²] | 2307 | 1719 | 2852 | 2128 |
| $F_{tot}$ [cm²] | 4.71 | 4.18 | 3.14 | 3.34 |
| $F_{tot}$ [%] | -- | -- | 33.5 | 20 |
| $F_s$ [cm²] | 8 | 6.6 | 7.14 | 5.37 |
| $\Delta F_s$ [%] | -- | -- | 12 | 18.6 |
| $F_p$ [cm²] | 12.71 | 10.78 | 10.28 | 8.71 |
| $\Delta F_p$ [%] | -- | -- | 19.1 | 19.2 |

FIG. 57

TOOL FOR OPTIMIZED THIN WALL PROFILE MEMBER (TPM) AND TPM-PANEL DESIGN AND SELECTION

CROSS-REFERENCE TO RELATED APPLICATIONS

This application is a continuation-in-part of patent application Ser. No. 13/317,871, filed 31 Oct. 2011, which is a continuation-in-part of patent application Ser. No. 12/462,521, filed 5 Aug. 2009, which is a continuation of patent application Ser. No. 10/913,616, filed 6 Aug. 2004, which is a continuation of patent application Ser. No. 10/149,049, filed 4 Jun. 2002, which is the National Stage of International Application No. PCT/RU 00/00494, filed 1 Dec. 2000.

BACKGROUND OF THE INVENTION

1. Field of the Invention

The present disclosure is related to modeling and analysis tools for design and selection of weight-optimized structural members subject to load-bearing forces.

2. Background Information

Compressed thin wall structural members ("thin wall structures") are well suited for a variety of applications— ranging from construction projects to mechanical equipment and machinery design—that require low weight, high strength and high stability and flexibility.

It is a great challenge, from a design standpoint, to achieve optimum weight thin wall structures, especially, when one must also account for maximum expected load-bearing capacity along several cross-sections and different materials.

Thin wall structures are traditionally formed from thin wall profile members (TPMs) generally referred to as thin wall shapes. There are many applications where thin wall structures, due to low weight, are the only design choice for engineers and designers.

In some instances, in order to enhance the load-bearing capacity of thin wall shapes, the same TPMs may be "reinforced' using reinforcing plates and/or shells (collectively referred to as "panels"). For purposes of discussion, we shall refer to reinforced TPMs as "TPM-panel combinations" or simply "TPM-panels."

Structural design optimization has been developed, in general, for such simple structural members as thick wall beams, heavy cross-section bars, trusses, arches and frames. Thin wall plates, shells and shapes (TPMs) are significantly less researched.

In the same way as designing thick structures, thin wall structures must be designed to satisfy a variety of "constructive restrictions." For example, the end design product must "fit" or "accommodate" the physical space for which it is designed. Other constructive restrictions may include, depending on the application, additional criteria such as weight, strength, stability, and flexibility constraints, as well as factors having to do with temperature (heat/cold resistance), conductivity, and other well-known material-selection criteria.

Modern design optimization relies heavily on computers which model and analyze a configuration to ensure that a particular design is suitable. Conventional tools, however, rely heavily on modeling techniques that draw mainly from thick wall structures, and which may be used for example to select an I-beam for a bridge or other extremely heavy load bearing project, where weight optimization, while important, it is not as critical as applications involving for example, aircrafts components.

Consequently, modern design of thin wall structures is focused more on single parameter-by-parameter optimization, with little emphasis on inter-dependencies of these parameters to other parameters. For example, critical stress, external compressed load, material properties, cross-section dimensions, and other criteria all impact, separately and inter-dependently, optimum design configuration and material selection.

Because inter-dependencies are not properly mapped out with the goal of weight optimizing a design for a given constructive restriction, the process is relatively unsophisticated.

It is desirable to be able to improve weight-optimization processes in design particularly in applications where TPMs may be employed.

SUMMARY

The present disclosure describes tools and associated computational analysis methodologies employed therein for improved TPM and TPM-panel weight-optimization and selection.

The tools draw on inter-dependence parameters relating to TPM cross-section dimensions ratio values and established constructive restrictions to calculate—using appropriate algorithmic computational analysis—the optimum cross-section dimensions values of a given TPM.

The proposed computational analysis is used in the selection of weight-optimized TPM-panels.

A design selection serves as a blueprint for the next stage, which is the actual fabrication or manufacturing of the component. For a given set of constructive restrictions, the final product is based on optimum configurations selected from a fixed set of TPMs with varied cross-section shapes; or in the case of TPM-panels, on optimum configurations selected from a fixed set of TPM-panel combinations of varied cross-section dimensions.

BRIEF DESCRIPTION OF THE DRAWINGS

The appended drawings illustrate exemplary configurations of the disclosure and, as such, should not be considered as limiting the scope of the disclosure that may admit to other equally effective configurations. Correspondingly, it has been contemplated that features of some configurations may be beneficially incorporated in other configurations without further recitation.

FIGS. 1-8 depict TPMs of various configurations, each characterized by a main strip and having a dimensional component (width b), in accordance with an exemplary embodiment.

versus TPM stress factor $$\overline{P}_s = \frac{P_s}{l_{re}^2},$$

U-shaped TPM.

Figure 28:
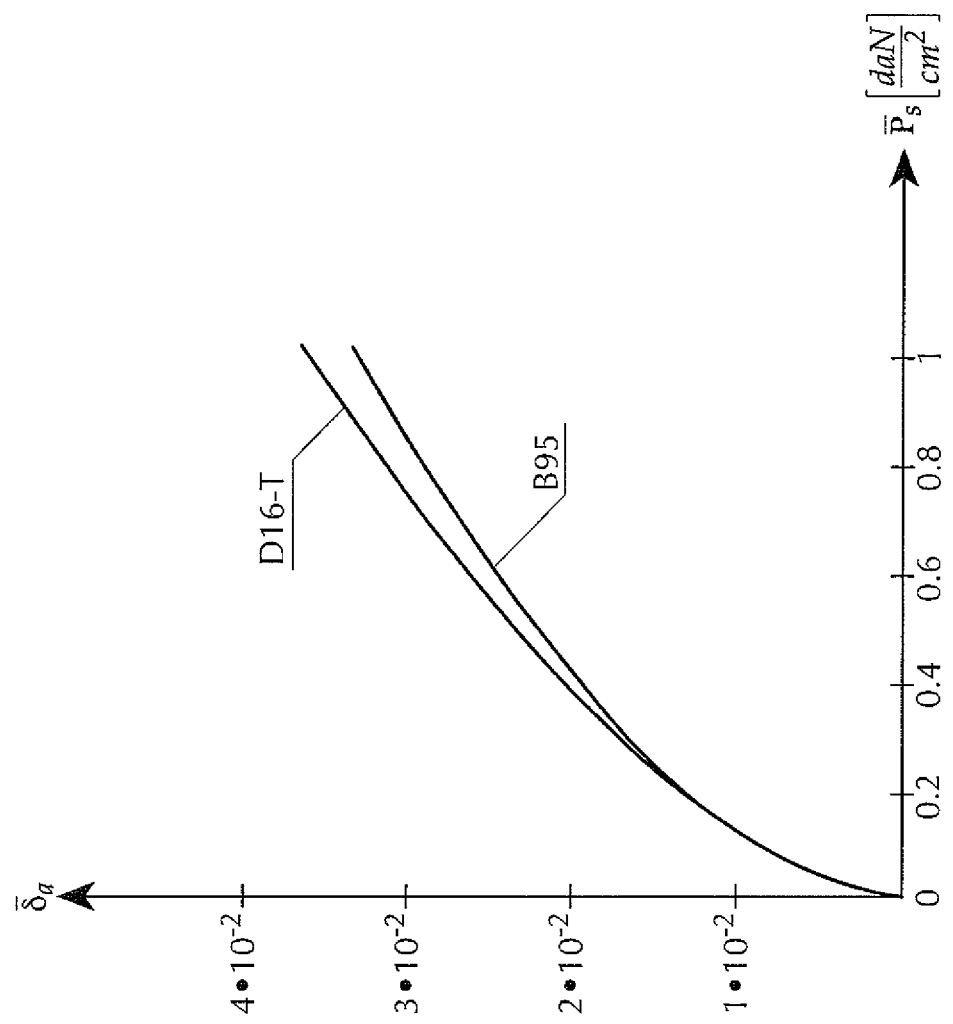

FIG. 28 is a plot showing scaled (dimensionless) characteristic dimension $$\overline{\delta}_a = \frac{\delta_a}{l_{re}}$$

versus TPM stress factor $$\overline{P}_s = \frac{P_s}{l_{re}^2},$$

U-shaped TPM.

Figure 29:
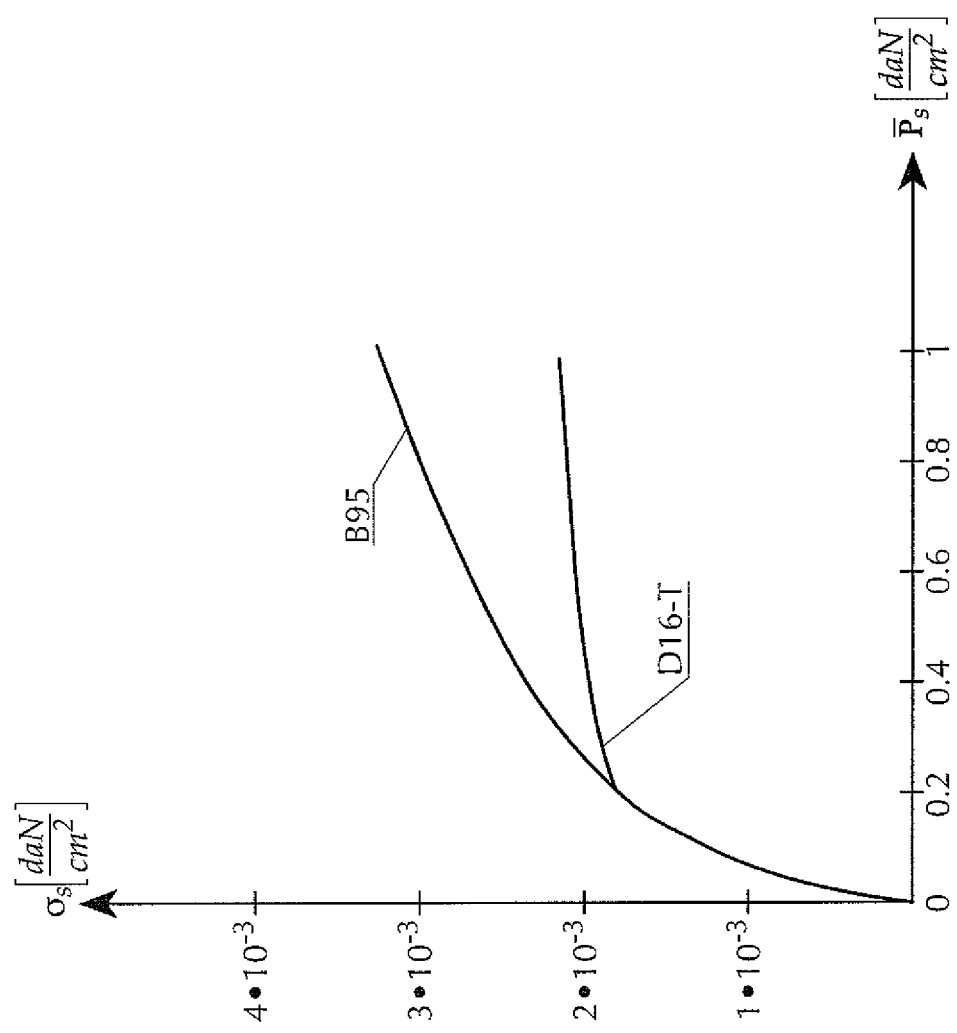

FIG. 29 is a plot showing optimum stress $\sigma_s$ versus TPM stress factor $$\overline{P}_s = \frac{P_s}{l_{re}^2},$$

U-shaped TPM.

Figure 30:
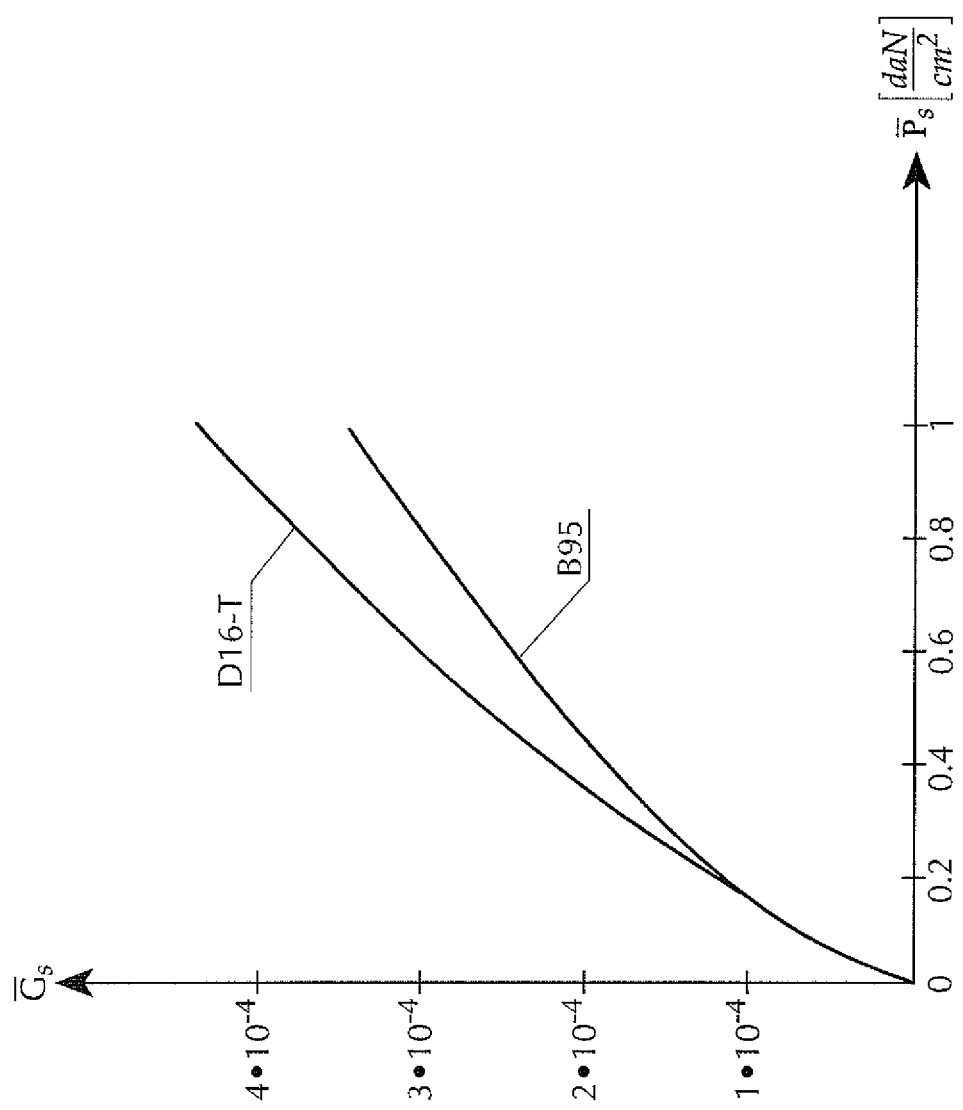

FIG. 30 is a plot showing dimensionless weight $$\overline{G}_s = \frac{G_s}{l_s \cdot l_{re}^2 \cdot \gamma},$$

versus TPM stress factor $$\overline{P}_s = \frac{P_s}{l_{re}^2},$$

U-shaped TPM.

Figure 31:
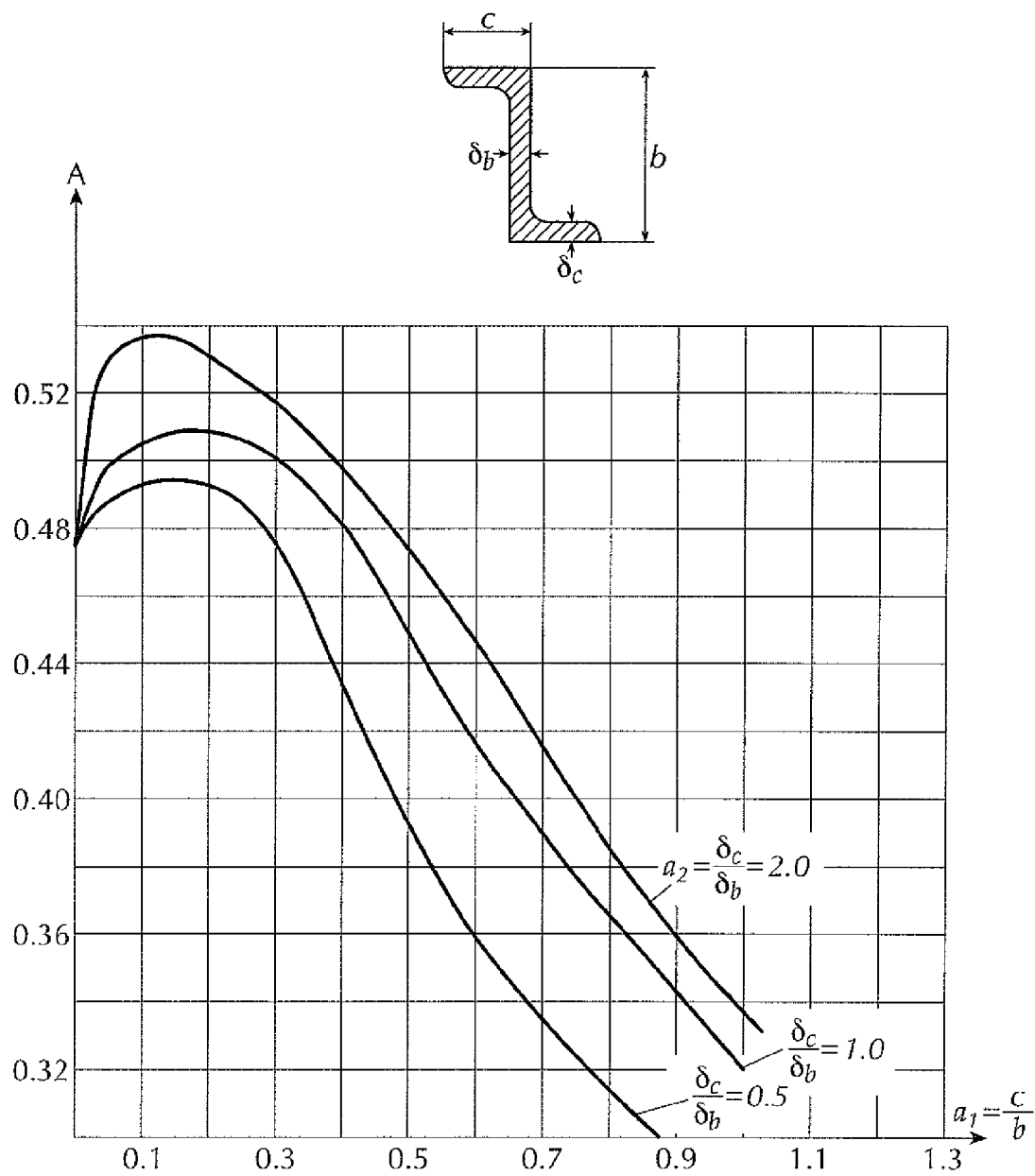

FIG. 31 is a plot showing shape efficiency factor A versus ratios of Z-shaped TPM dimensions.

Figure 32:
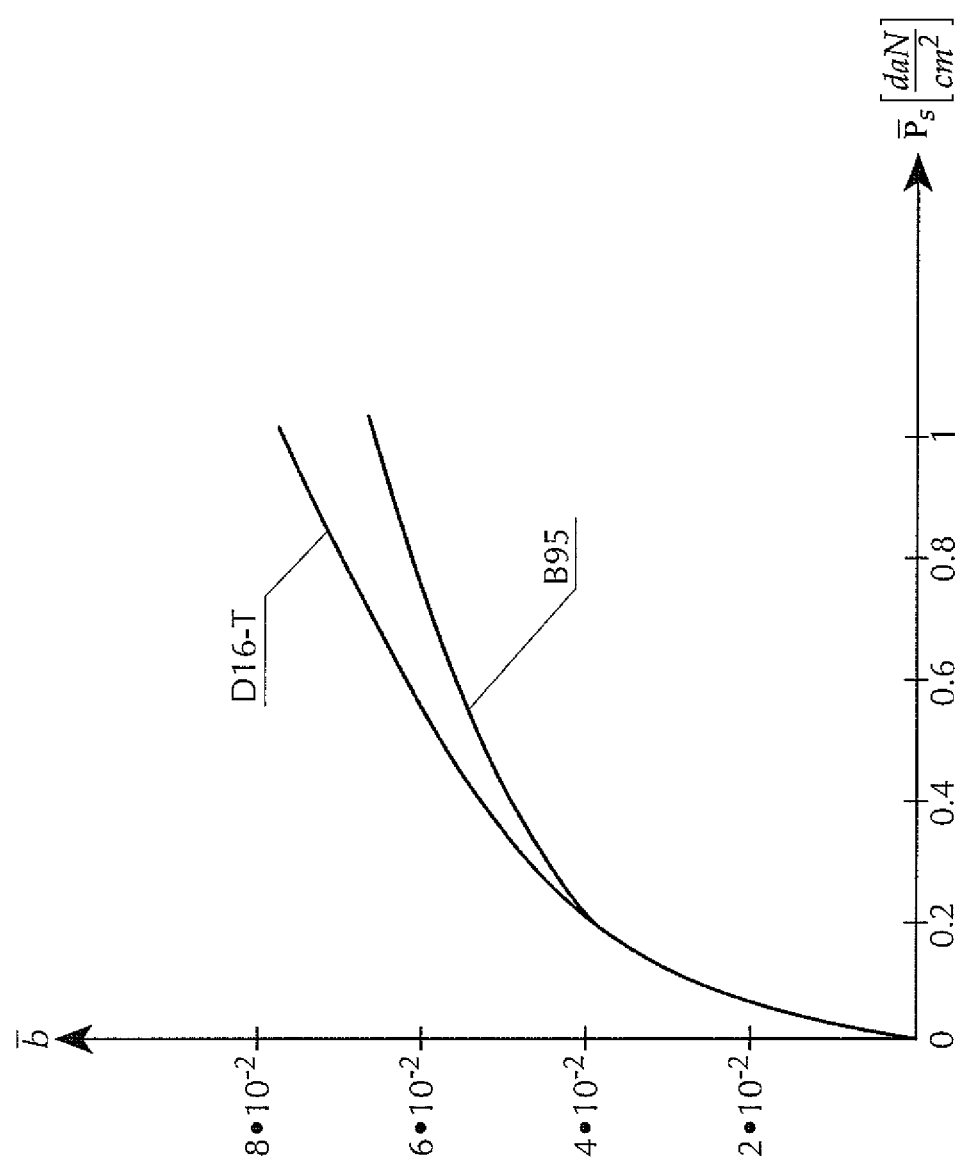

FIG. 32 is a plot showing scaled (dimensionless) characteristic dimension $$\overline{b}_s = \frac{b}{l_{re}}$$

versus TPM stress factor $$\overline{P}_s = \frac{P_s}{l_{re}^2},$$

Z-shaped TPM.

Figure 33:
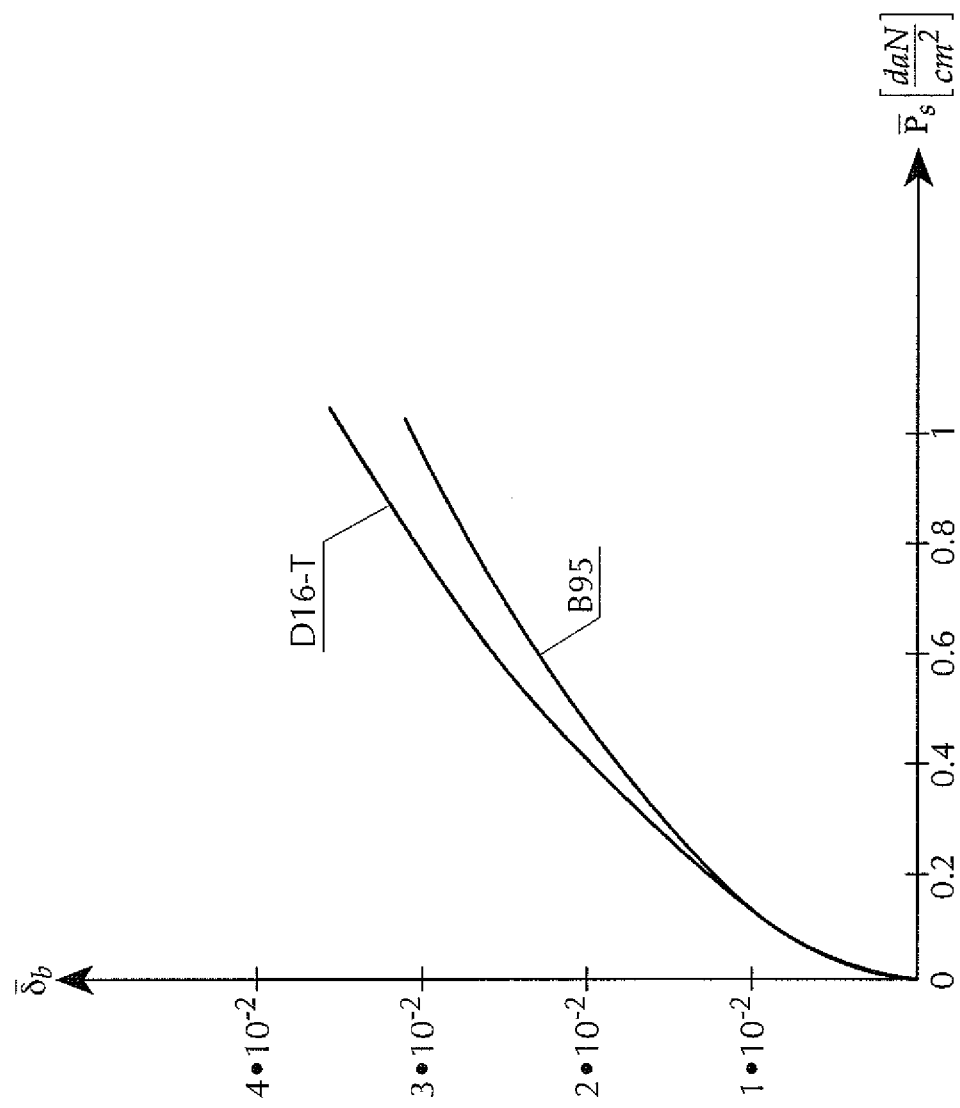

FIG. 33 is a plot showing scaled (dimensionless) characteristic dimension $$\overline{\delta}_b = \frac{\delta_b}{l_{re}}$$

versus TPM stress factor $$\overline{P}_s = \frac{P_s}{l_{re}^2},$$

Z-shaped TPM.

Figure 34:
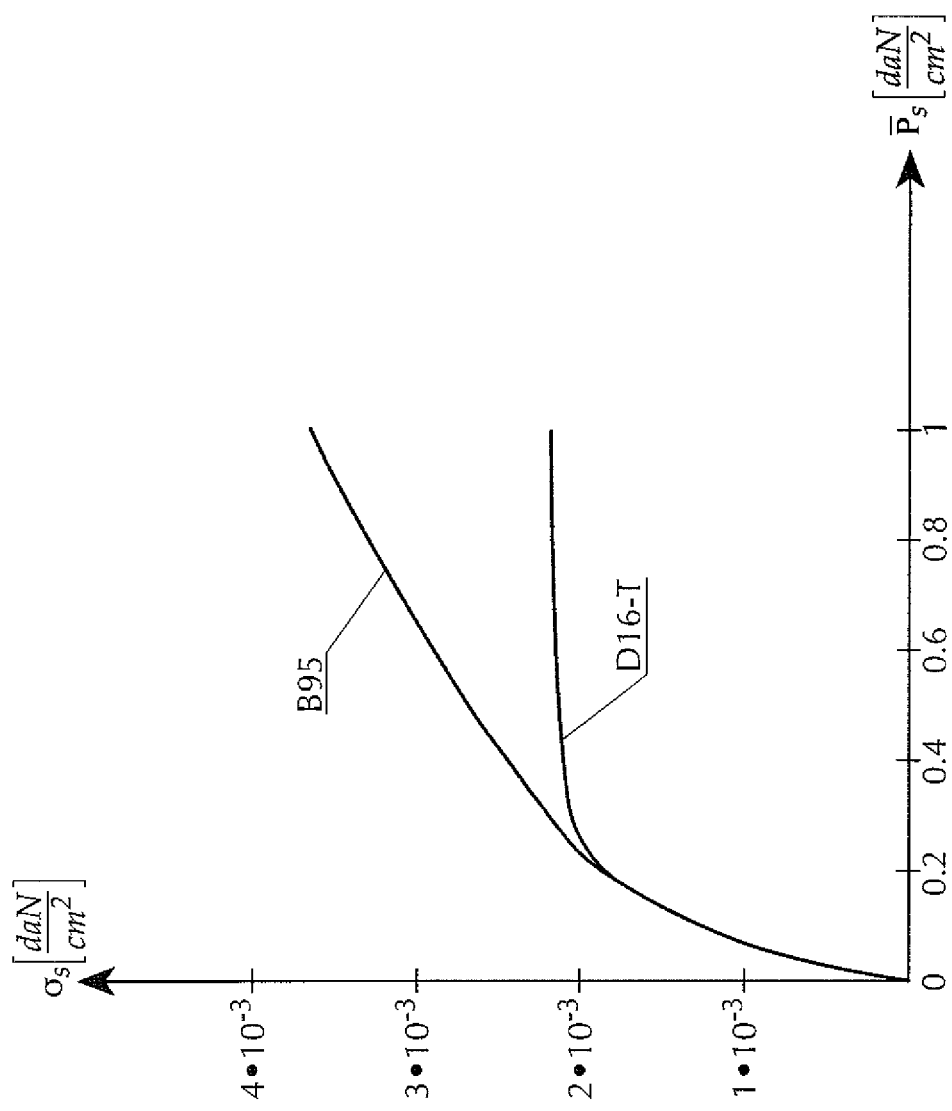

FIG. 34 is a plot showing optimum stress $\sigma_s$ versus TPM stress factor $$\overline{P}_s = \frac{P_s}{l_{re}^2},$$

Z-shaped TPM.

Figure 35:
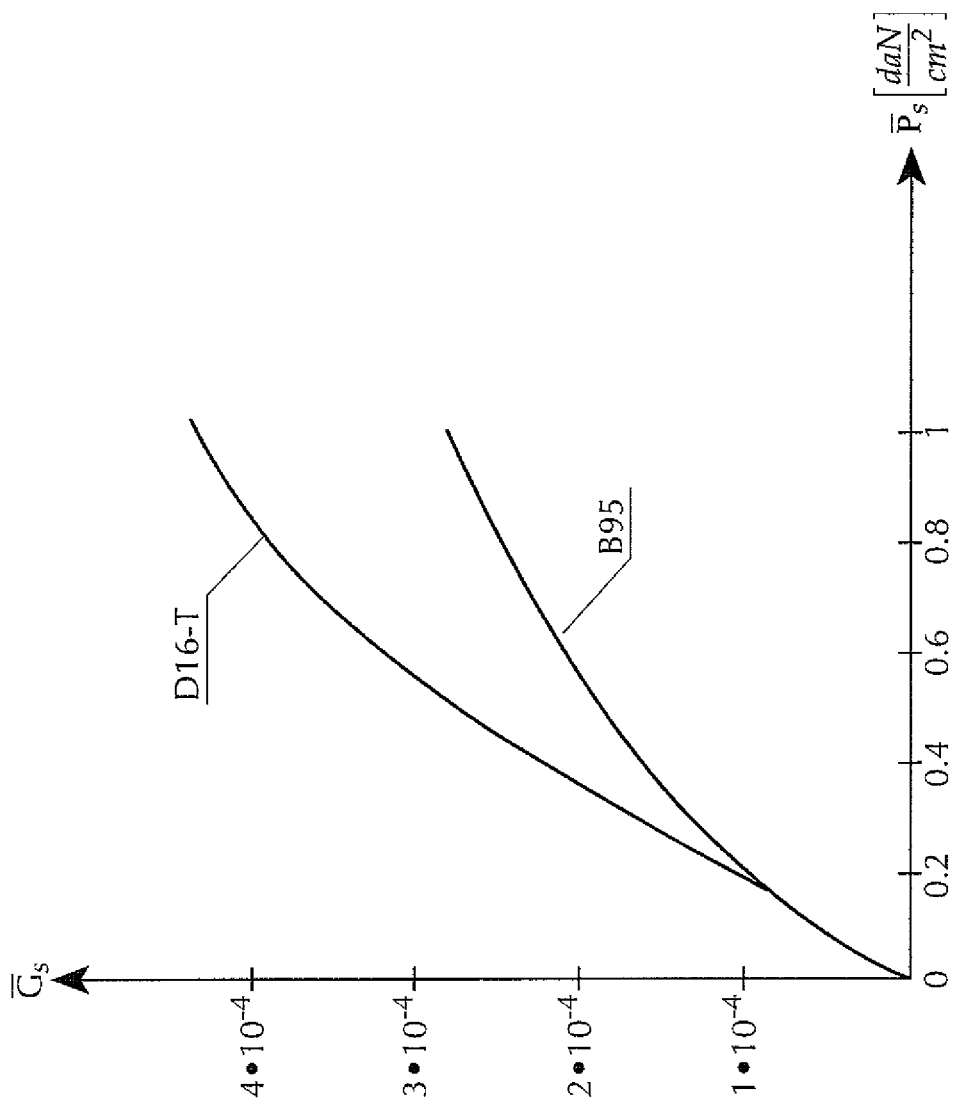

FIG. 35 is a plot showing dimensionless weight $$\overline{G}_s = \frac{G_s}{l_s \cdot l_{re}^2 \cdot \gamma}$$

versus TPM stress factor $$\overline{P}_s = \frac{P_s}{l_{re}^2},$$

Z-shaped TPM.

Figure 36:
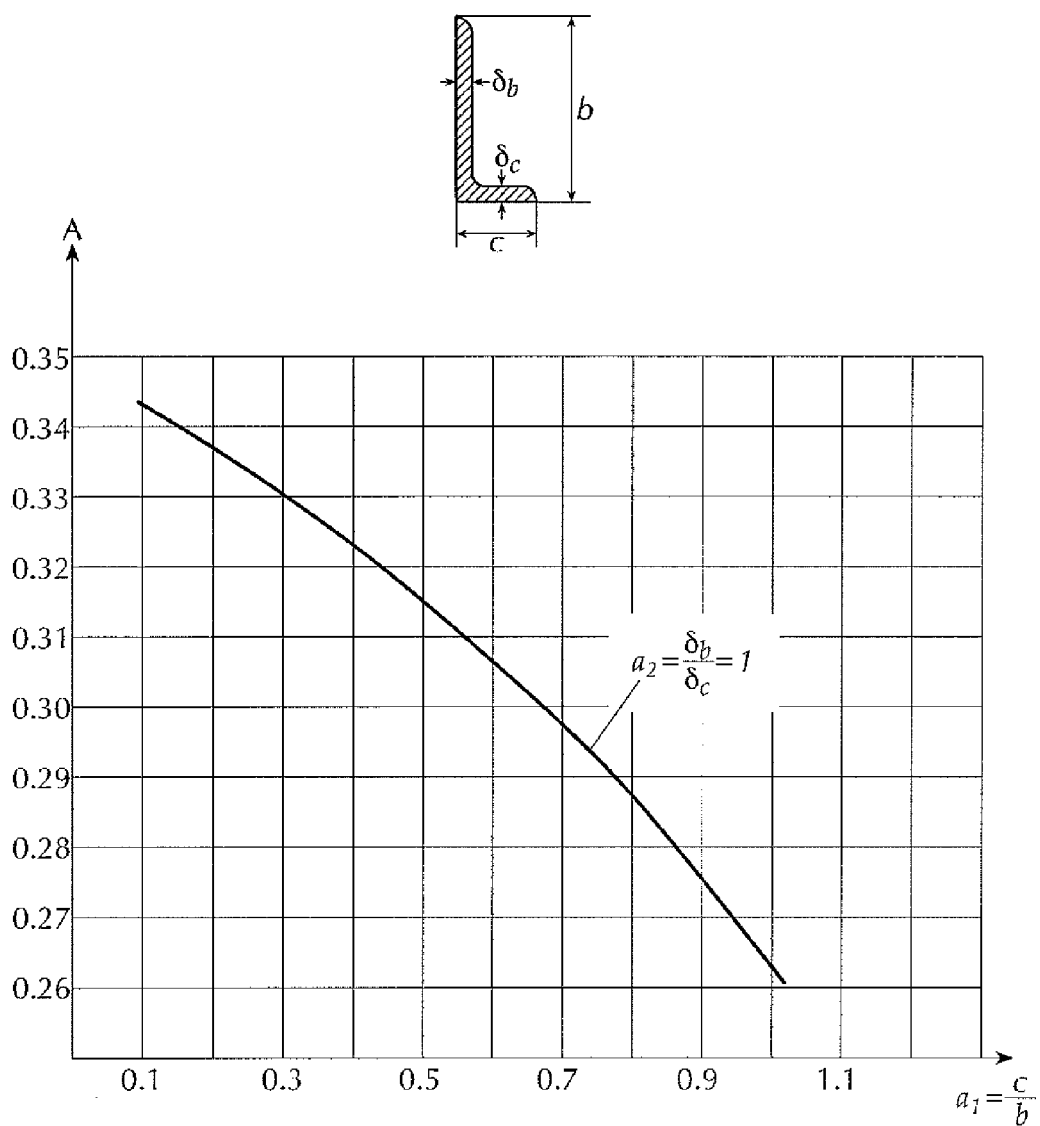

FIG. 36 is a plot showing shape efficiency factor A versus ratios of L-shaped TPM dimensions.

Figure 37:
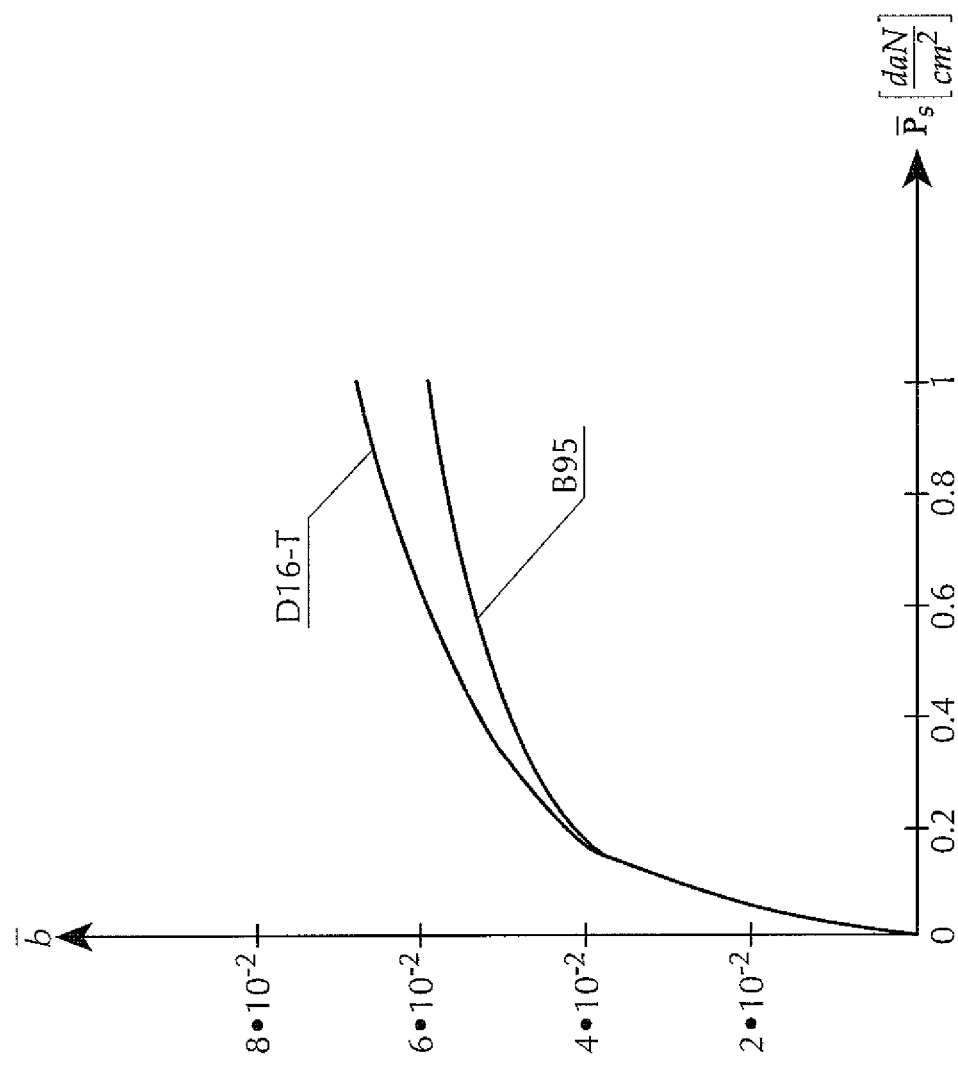

FIG. 37 is a plot showing scaled (dimensionless) characteristic dimension $$\overline{b}_s = \frac{b}{l_{re}}$$

versus TPM stress factor $$\overline{P}_s = \frac{P_s}{l_{re}^2},$$

L-shaped TPM.

Figure 38:
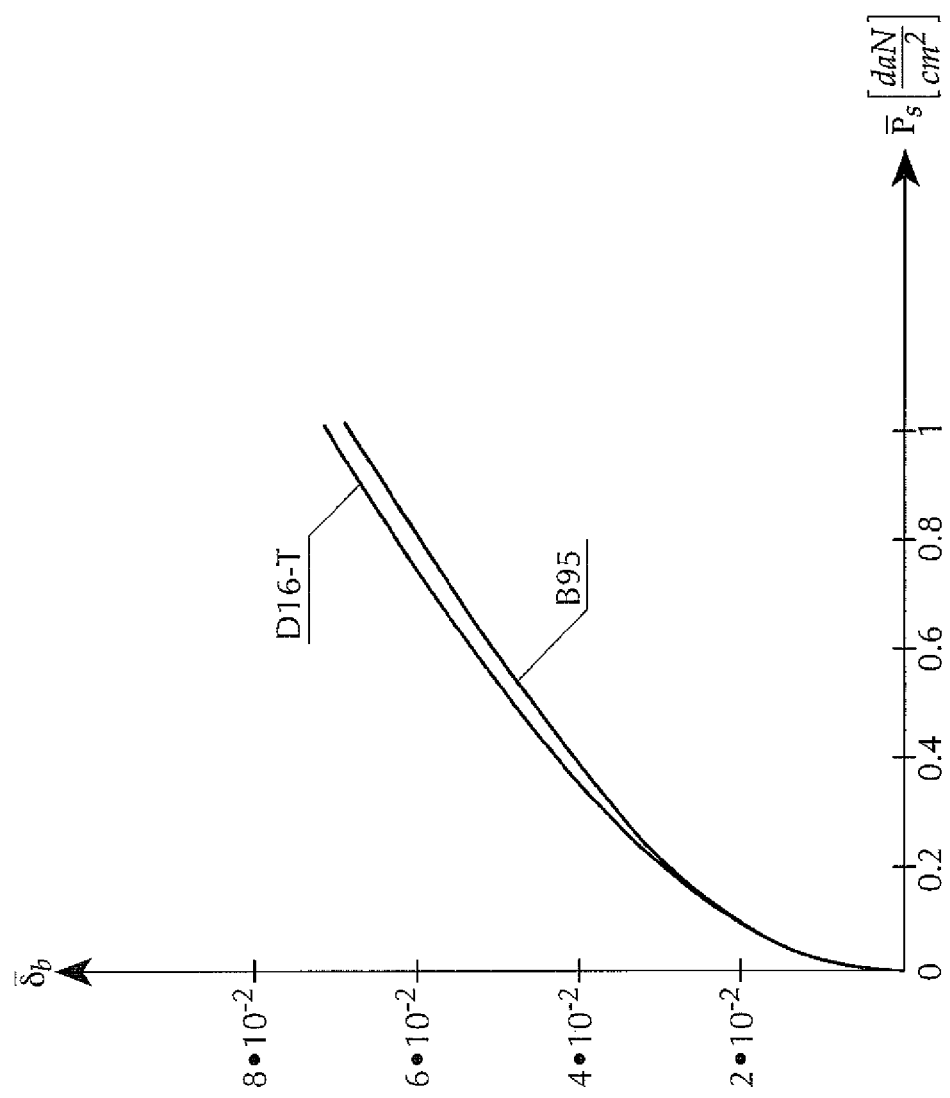

FIG. 38 is a plot showing scaled (dimensionless) characteristic dimension $$\overline{\delta}_b = \frac{\delta_b}{l_{re}}$$

versus TPM stress factor $$\overline{P}_s = \frac{P_s}{l_{re}^2},$$

L-shaped TPM.

Figure 39:
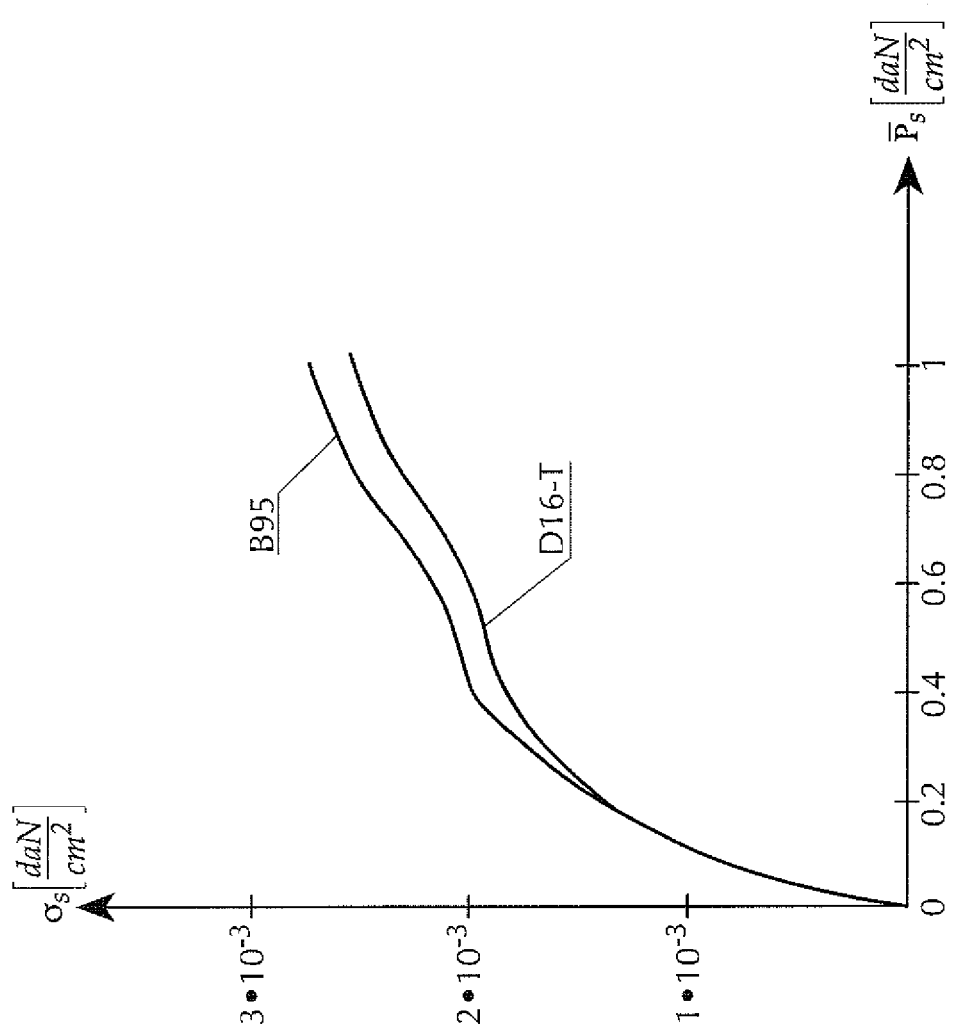

FIG. 39 is a plot showing optimum stress $\sigma_s$ versus TPM stress factor $$\overline{P}_s = \frac{P_s}{l_{re}^2},$$

L-shaped TPM.

Figure 40:
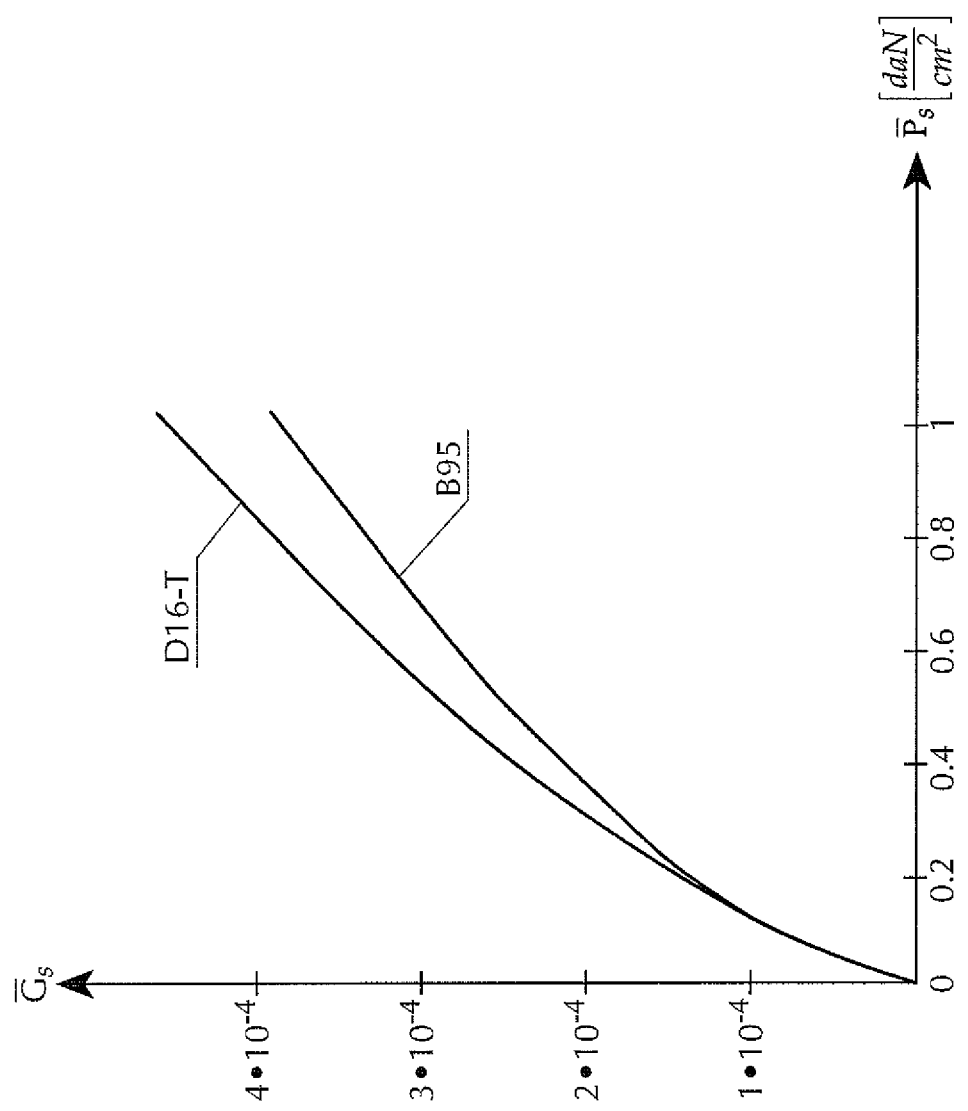

FIG. 40 is a plot showing dimensionless weight $$\overline{G}_s = \frac{G_s}{l_s \cdot l_{re}^2 \cdot \gamma}$$

versus TPM stress factor $$\overline{P}_s = \frac{P_s}{l_{re}^2},$$

L-shaped TPM.

FIG. 41 is a table showing feasible dimensions of U-shaped TPM.

Figure 42:
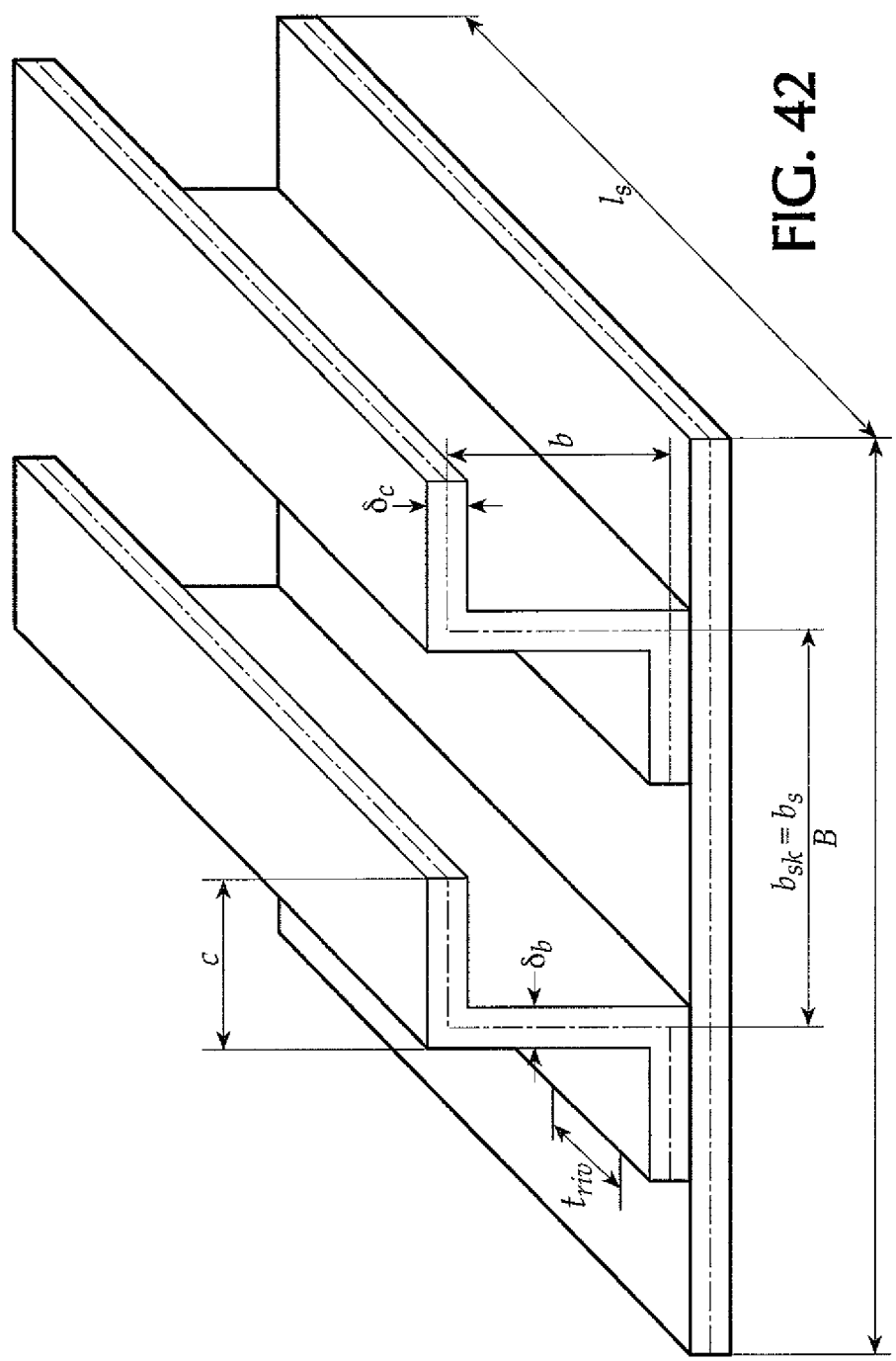

FIG. 42 shows a panel with Z-shaped TPM.

Figure 43:
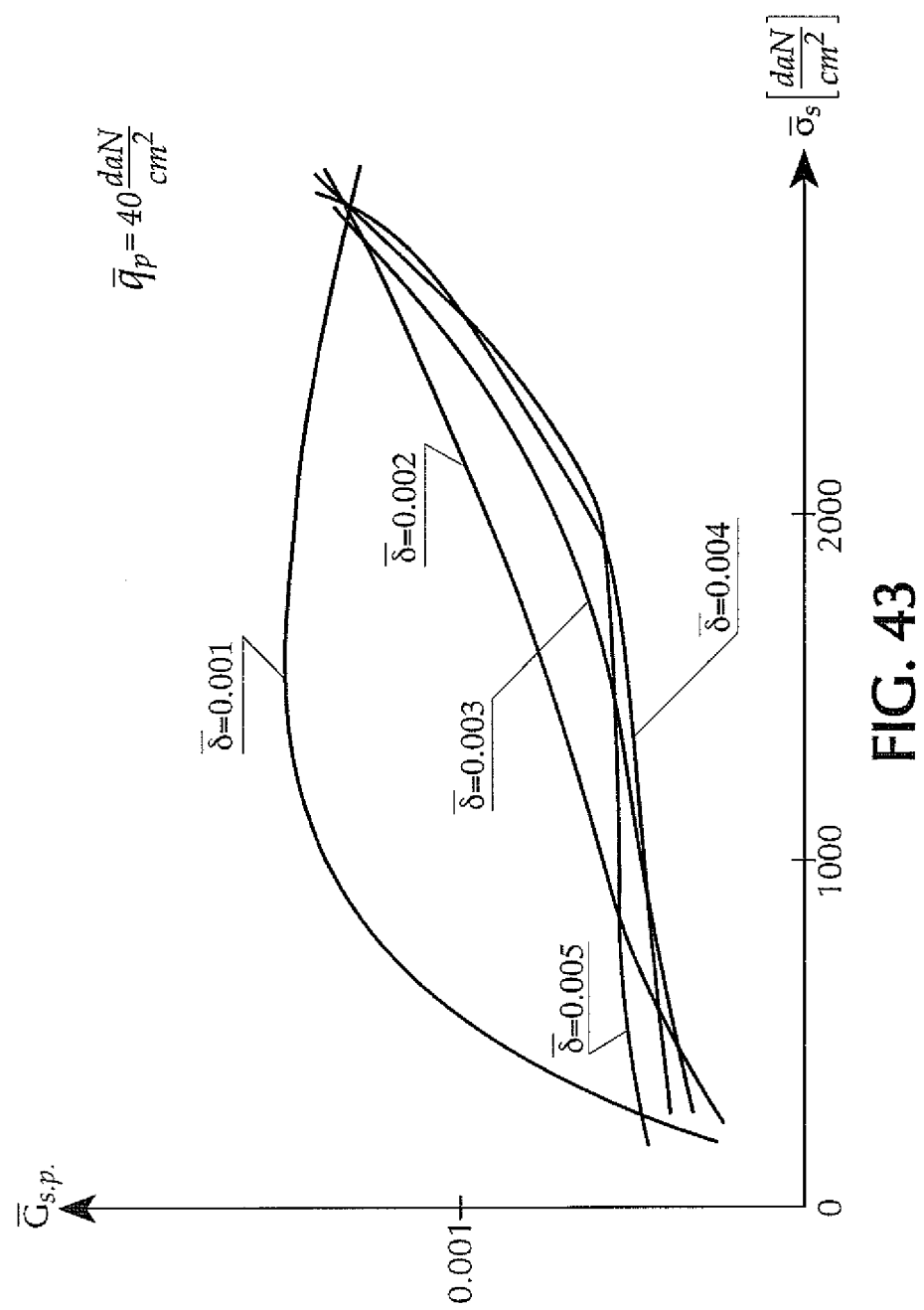

FIG. 43 is a plot showing dimensionless panel weight $$\overline{G}_s = \frac{G_s}{l_s \cdot l_{re}^2 \cdot \gamma}$$

versus TPM stress $\sigma_s$, U-shaped TPM.

Figure 44:
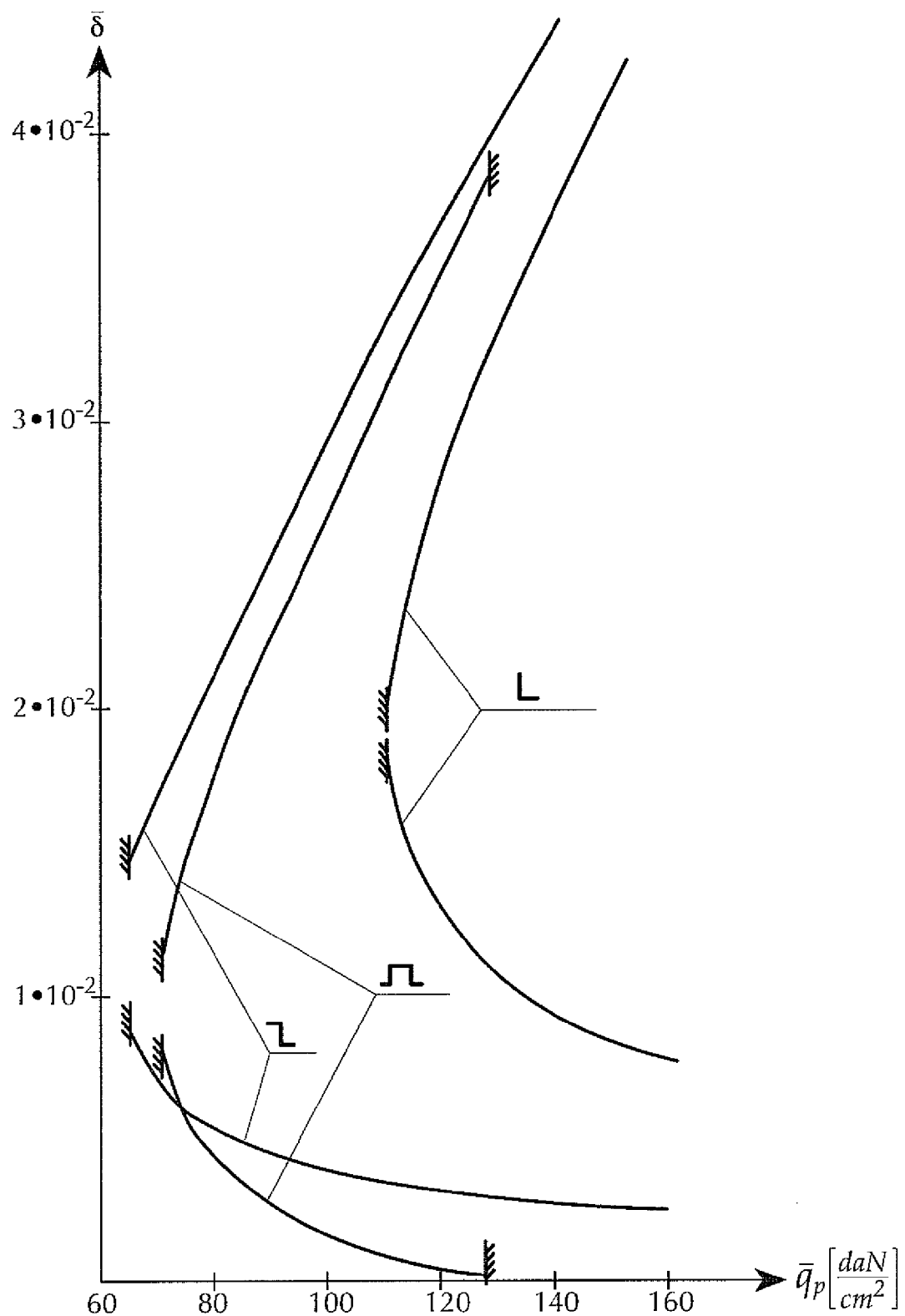

FIG. 44 is a plot showing dimensionless skin thickness $$\overline{\delta} = \frac{\delta}{l_{re}}$$

versus the panel stress factor $$\overline{q}_p = \frac{q_p}{l_{re}},$$

material D16-T (minimum weight panel).

Figure 45:
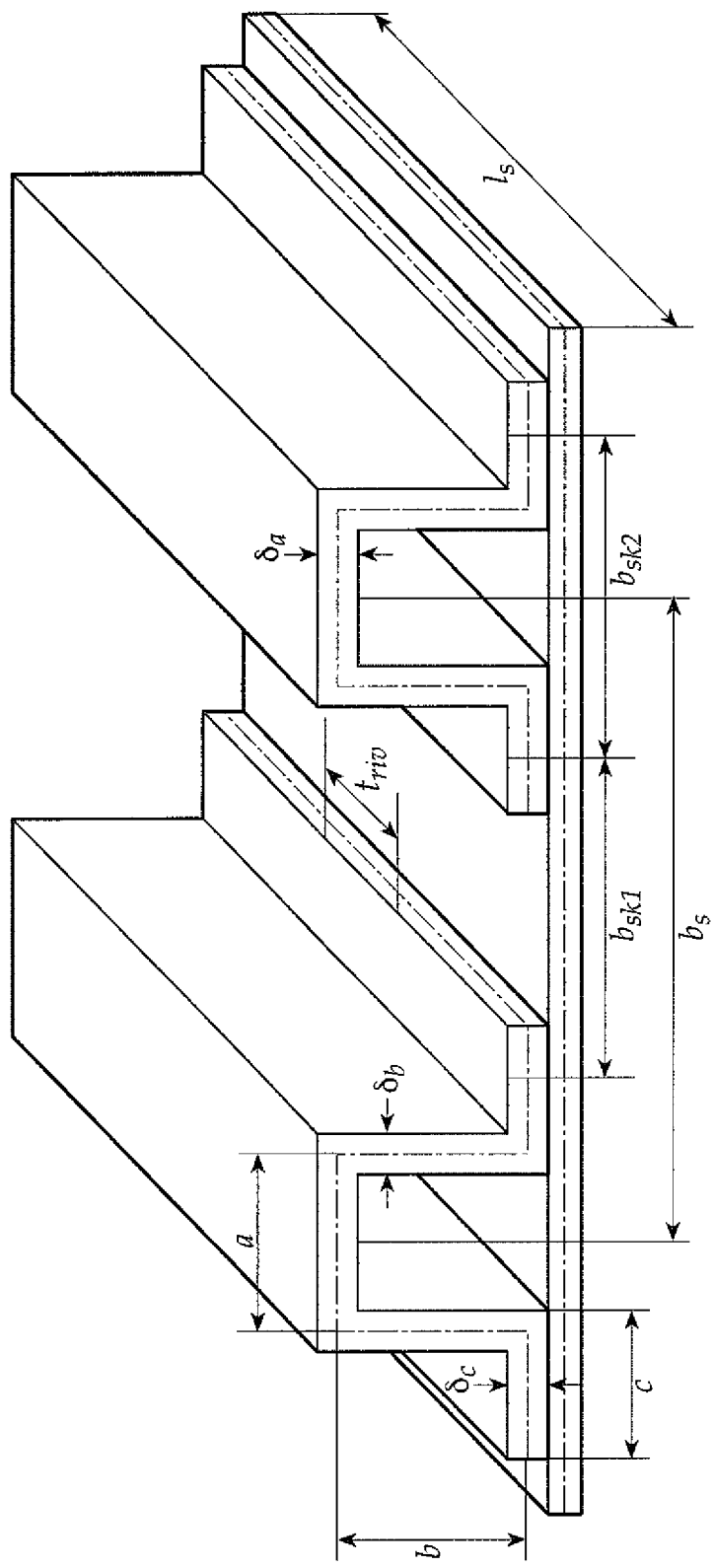

FIG. 45 is a stringer panel with U-shaped TPM.

Figure 46:
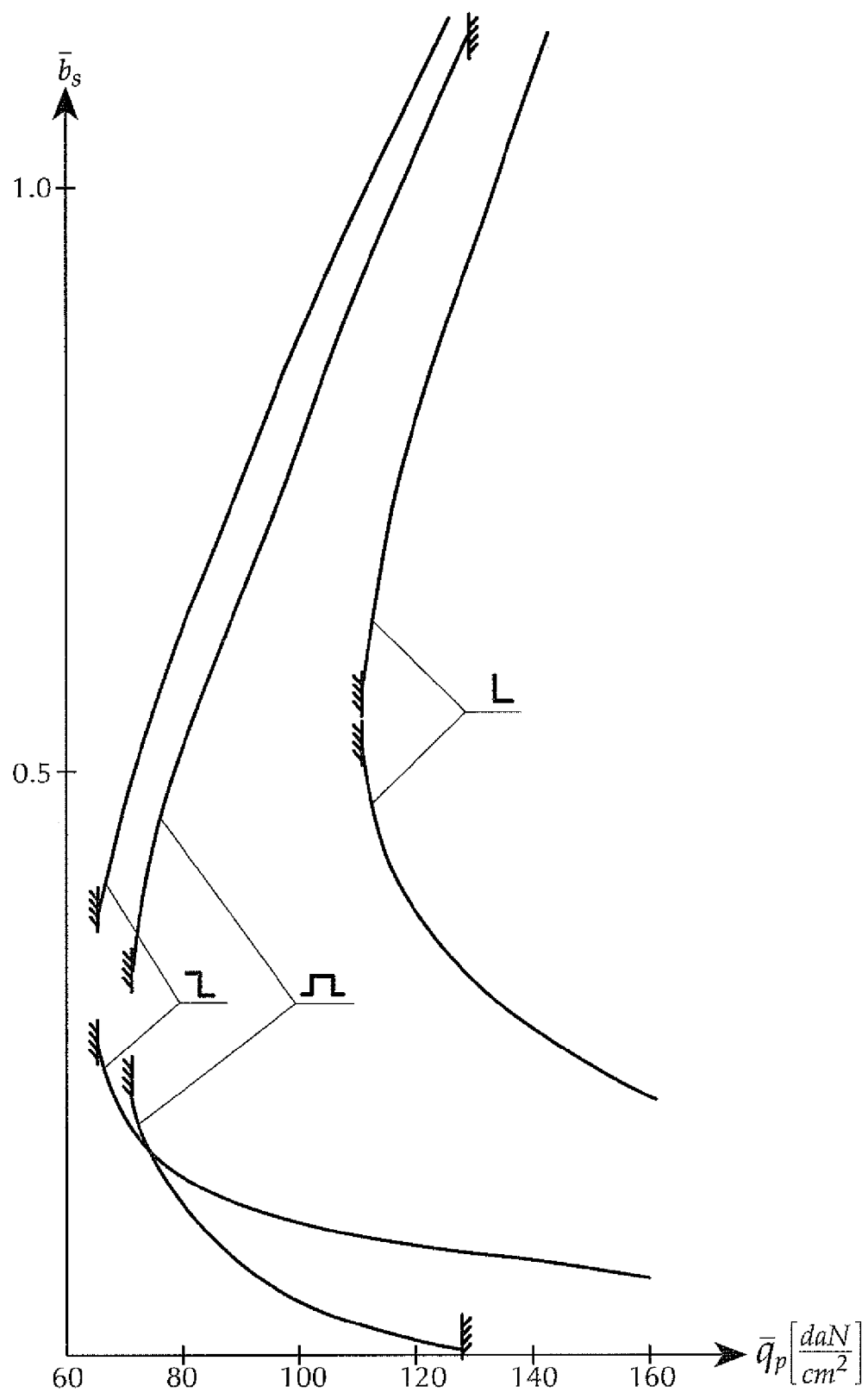

FIG. 46 is a plot showing dimensionless distance between stringers $$\overline{b}_s = \frac{b_s}{l_{re}}$$

versus the panel stress factor $$\overline{q}_p = \frac{q_p}{l_{re}},$$

material D16-T (minimum weight panel).

Figure 47:
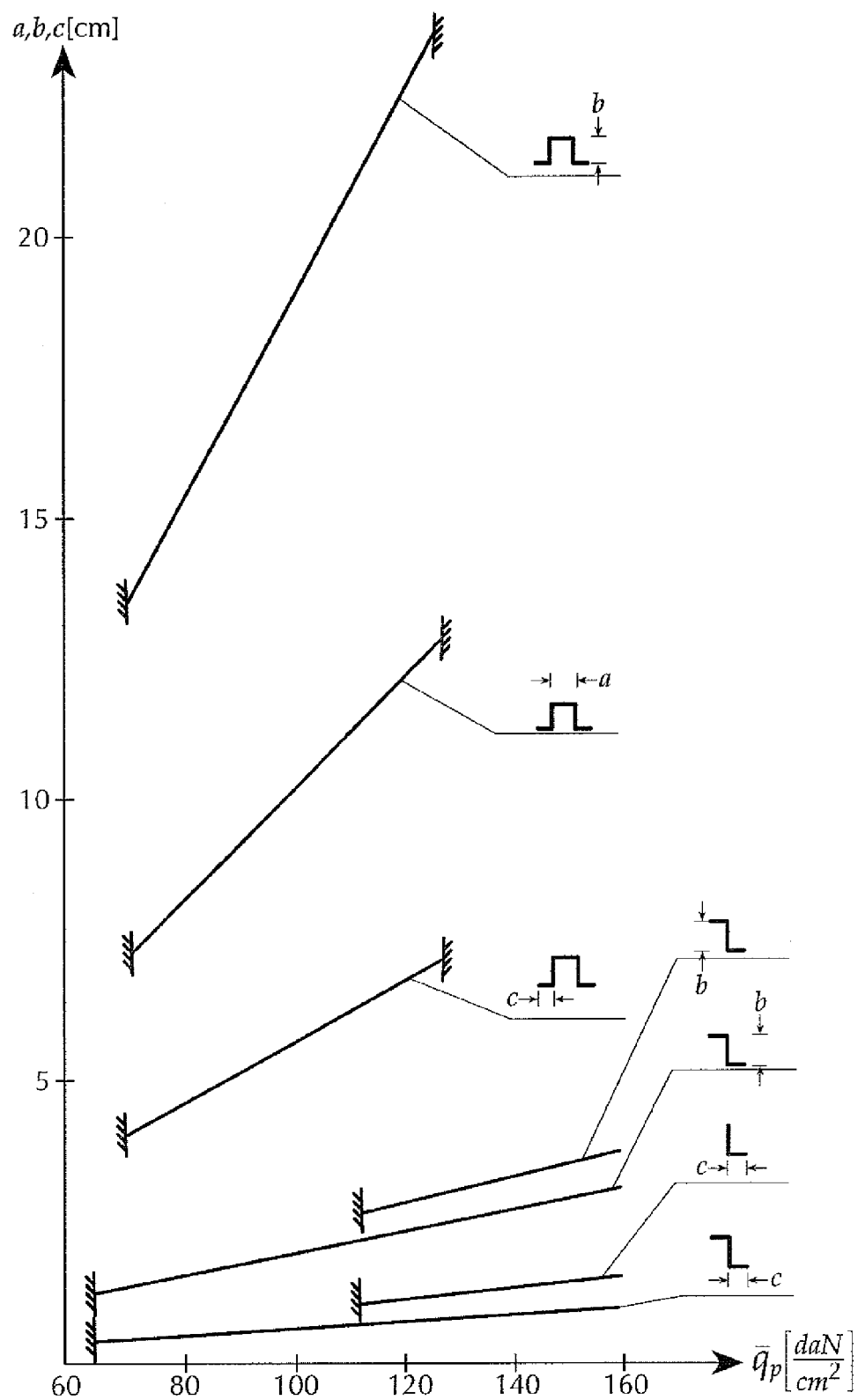

FIG. 47 is a plot showing TPM shape width a, b, c versus the panel stress factor $$\overline{q}_p = \frac{q_p}{l_{re}},$$

material D16-T (minimum weight panel).

Figure 48:
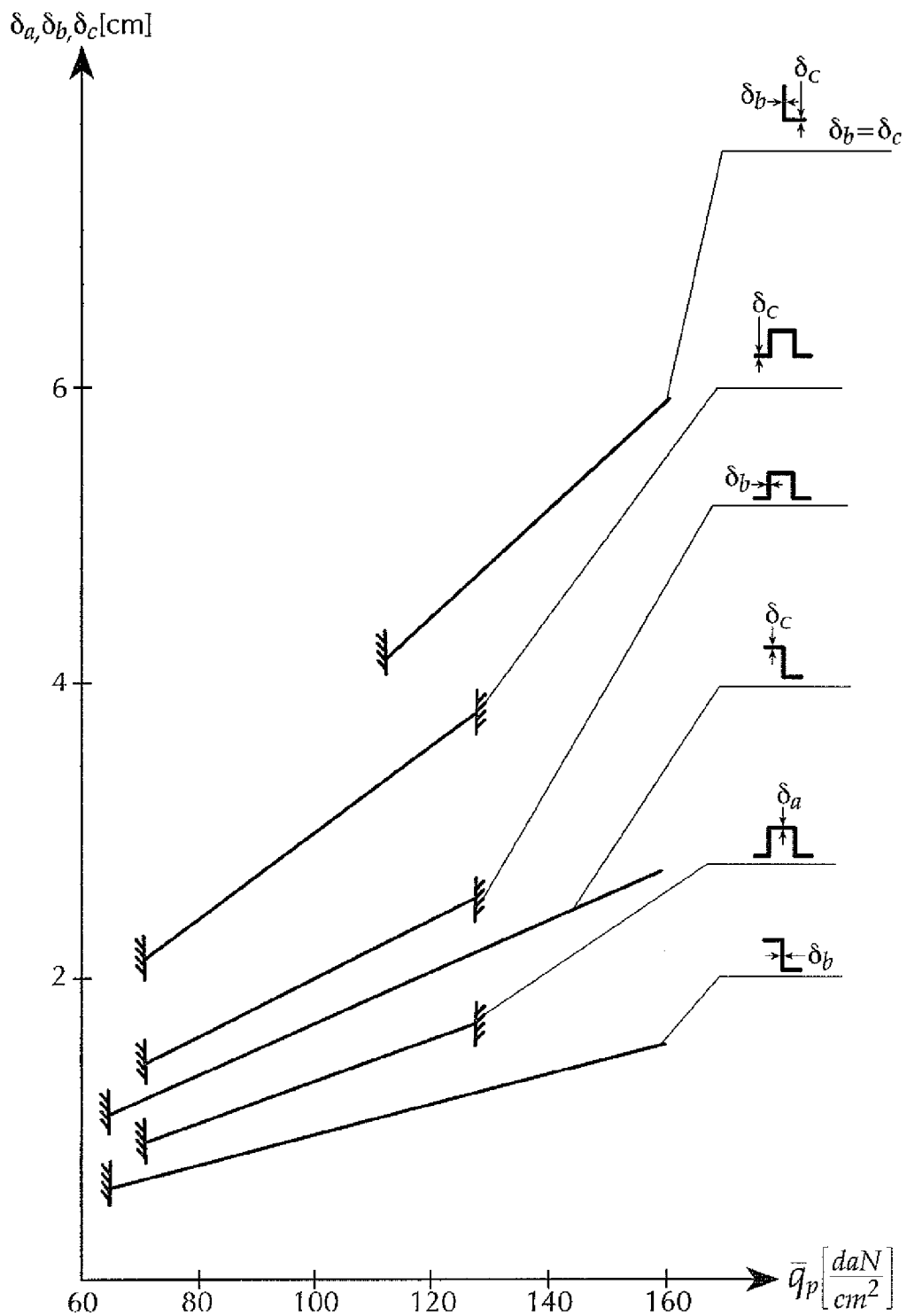

FIG. 48 is a plot showing TPM shape thickness $\delta_a$, $\delta_b$, $\delta_c$ versus the panel stress factor $$\overline{q}_p = \frac{q_p}{l_{re}},$$

material D16-T (minimum weight panel).

Figure 49:
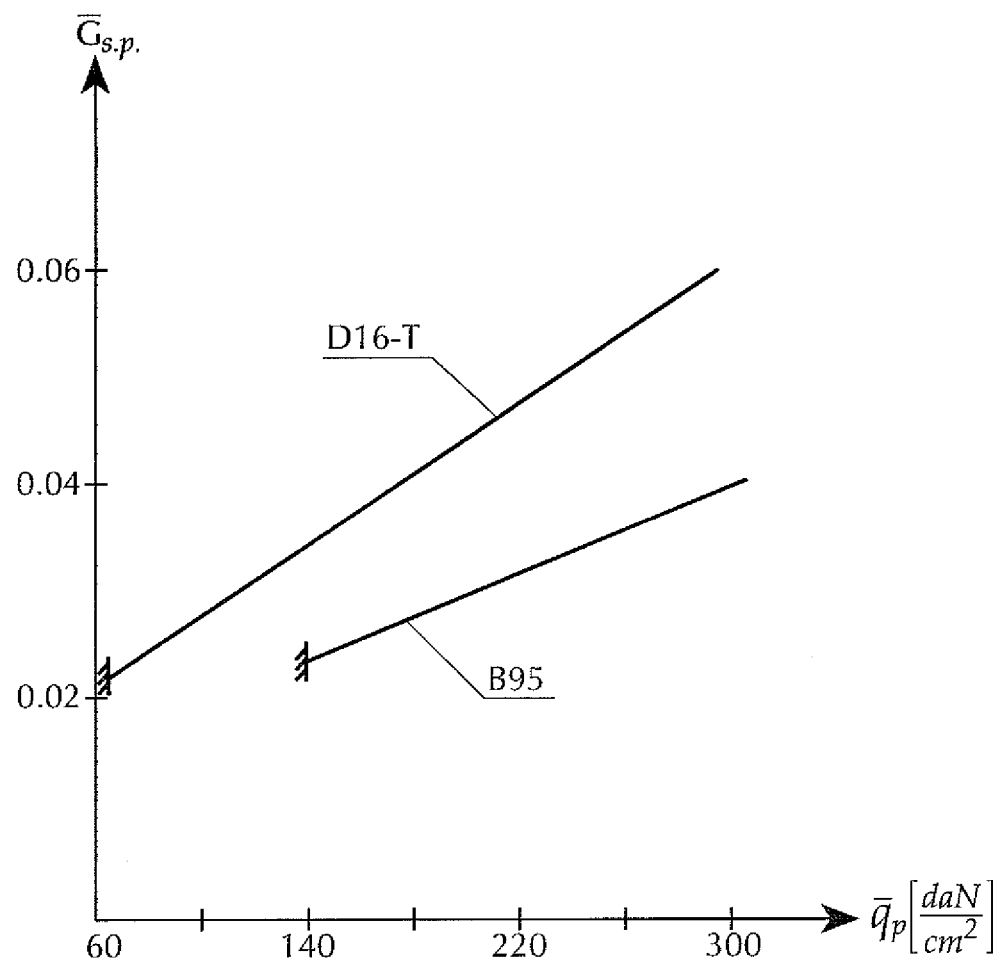

FIG. 49 is a plot showing dimensionless panel weight $$\overline{G}_s = \frac{G_s}{l_s \cdot l_{re}^2 \cdot \gamma}$$

versus the panel stress factor $$\overline{q}_p = \frac{q_p}{l_{re}},$$

materials D16-T and B95 (minimum feasible weight panel).

Figure 50:
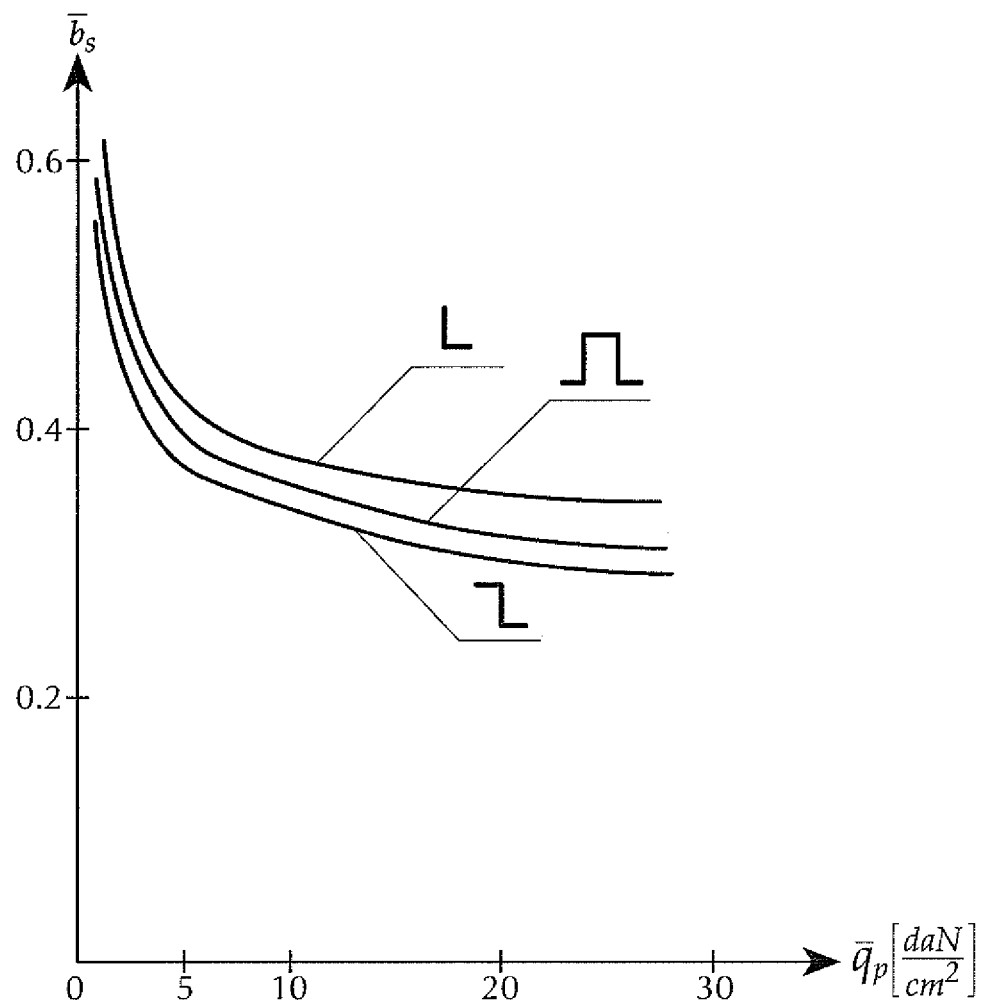

FIG. 50 is a plot showing dimensionless distance between stringers $$\bar{b}_s = \frac{b_s}{l_{re}}$$

versus the panel stress factor $$\bar{q}_p = \frac{q_p}{l_{re}},$$

material D16-T (minimum feasible weight panel).

Figure 51:
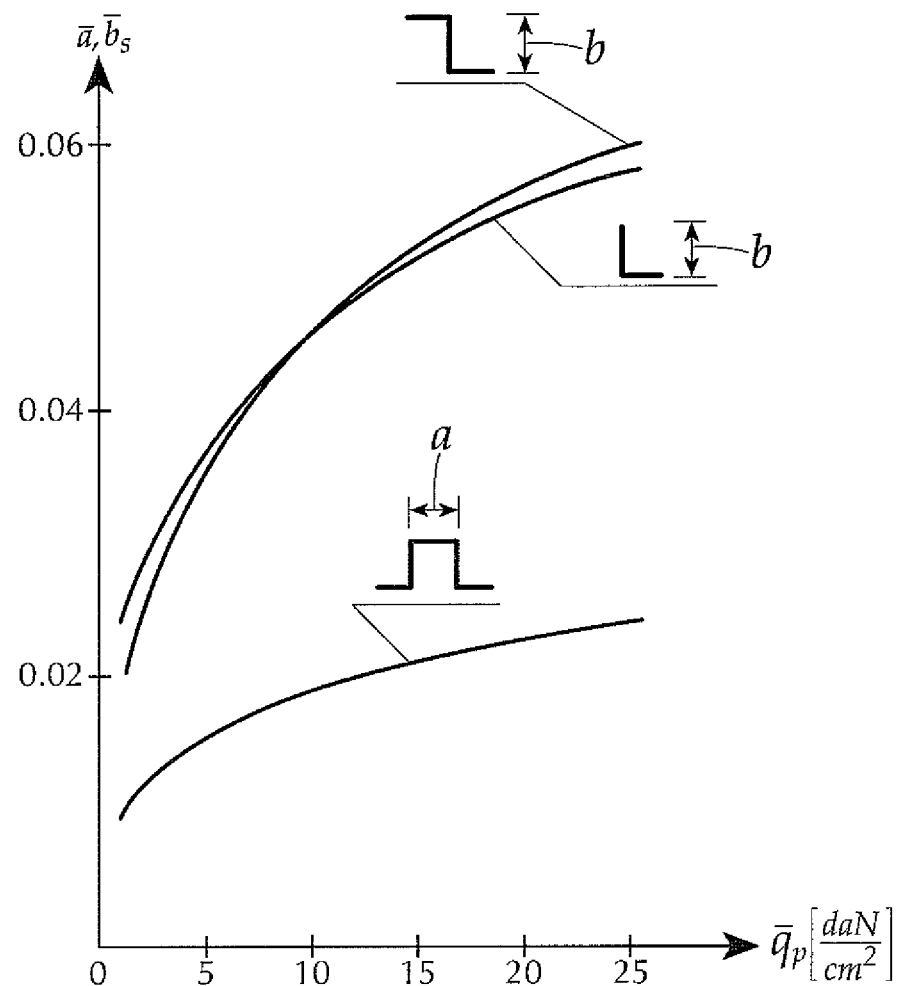

FIG. 51 is a plot showing dimensionless length of TPM shapes $\bar{a} = a/l_{re}$, $$\bar{b}_s = \frac{b}{l_{re}}$$

versus the panel stress factor $$\bar{q}_p = \frac{q_p}{l_{re}},$$

material D16-T (minimum feasible weight panel).

Figure 52:
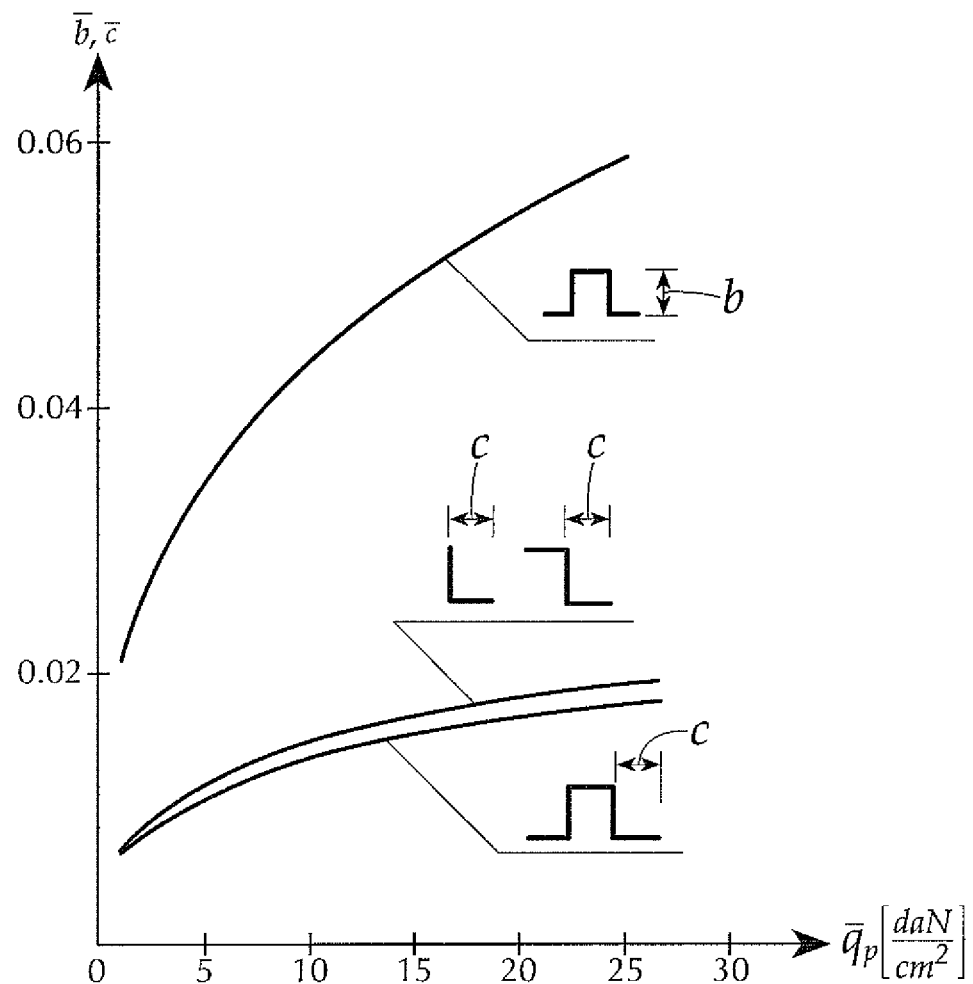

FIG. 52 is a plot showing dimensionless length of TPM shapes $$\bar{b} = \frac{b}{l_{re}},$$

$$\bar{c} = \frac{c}{l_{re}}$$

versus the panel stress factor $$\bar{q}_p = \frac{q_p}{l_{re}},$$

material D16-T (least minimum weight panel).

Figure 53:
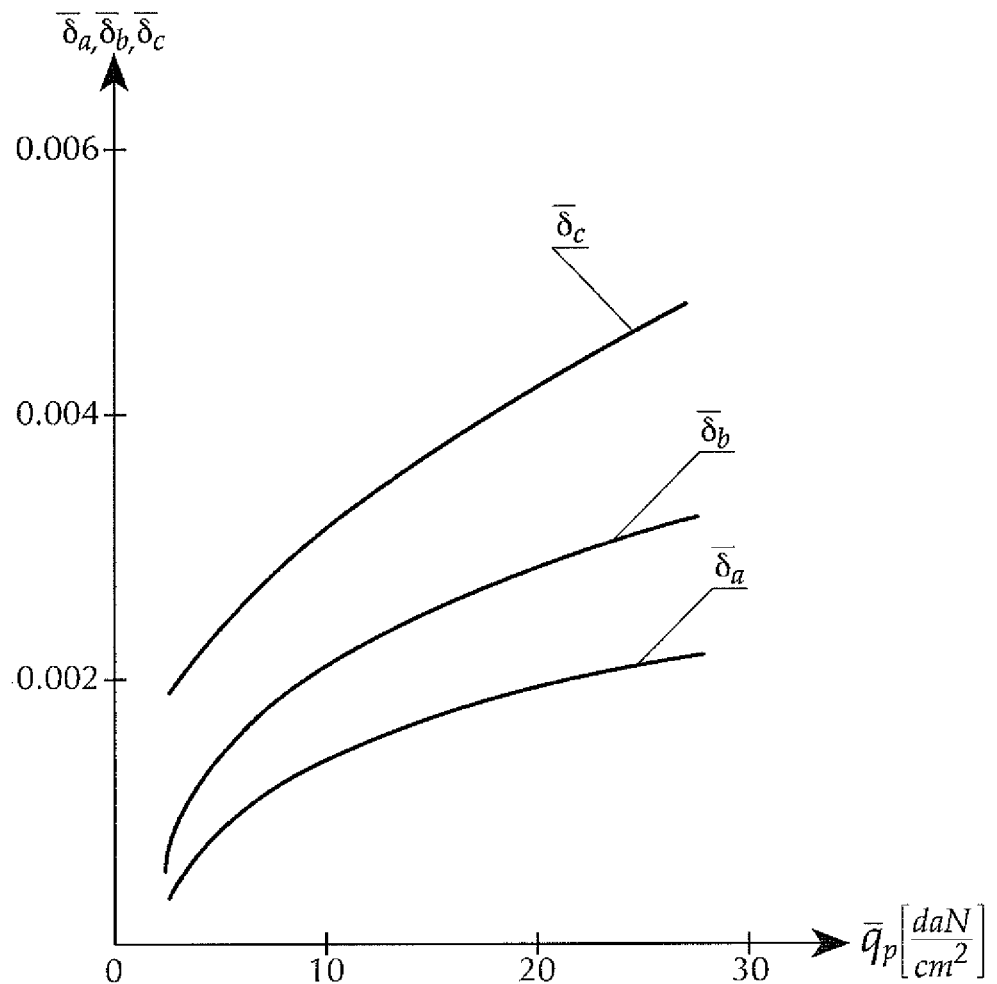

FIG. 53 is a plot showing dimensionless thickness of U-shaped TPM $\bar{\delta}_a =$ $$\frac{\delta_a}{l_{re}}, \bar{\delta}_b = \frac{\delta_b}{l_{re}}, \bar{\delta}_c = \frac{\delta_c}{l_{re}}$$

versus panel stress factor $$\bar{q}_p = \frac{q_p}{l_{re}^2},$$

material D16-T (least minimum weight panel).

Figure 54:
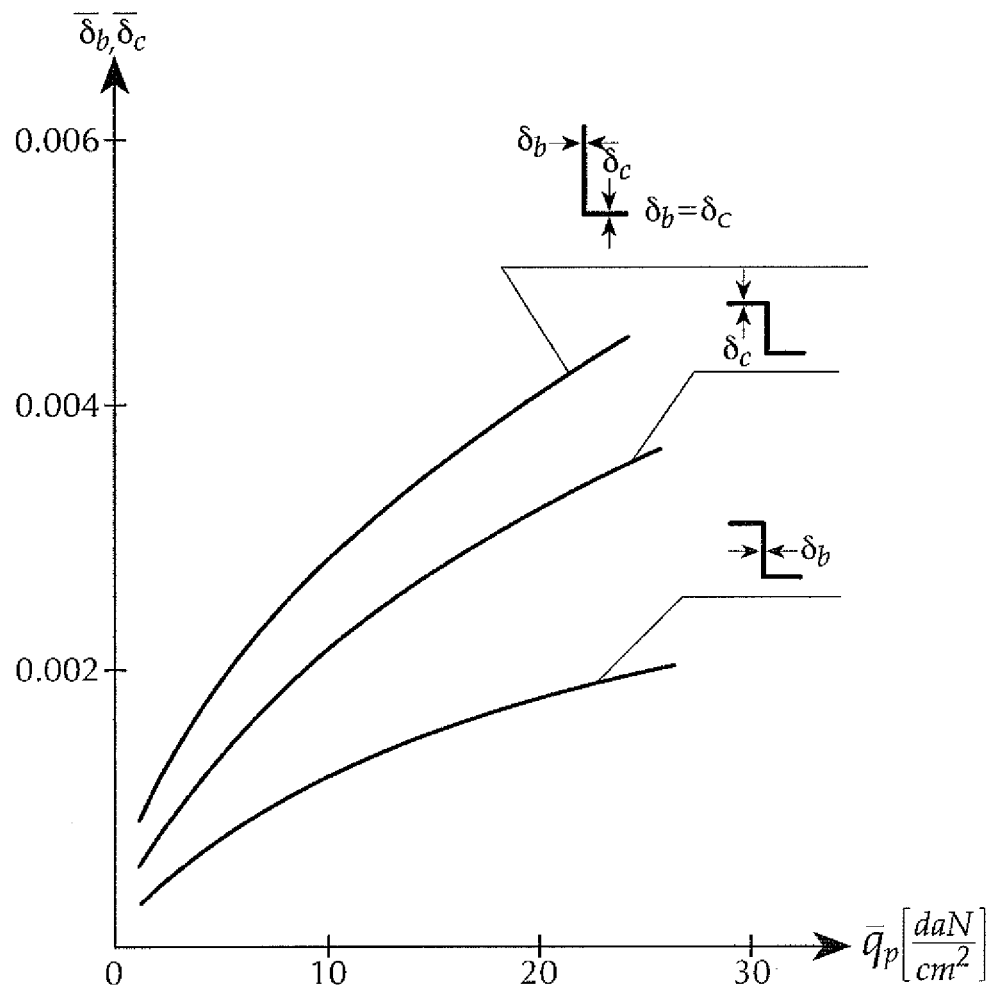

FIG. 54 is a plot showing dimensionless thickness of TPM $$\bar{\delta}_b = \frac{\delta_b}{l_{re}}, \bar{\delta}_c = \frac{\delta_c}{l_{re}}$$

versus panel stress factor $$\bar{q}_p = \frac{q_p}{l_{re}^2},$$

material D16-T (least minimum weight panel).

Figure 55:
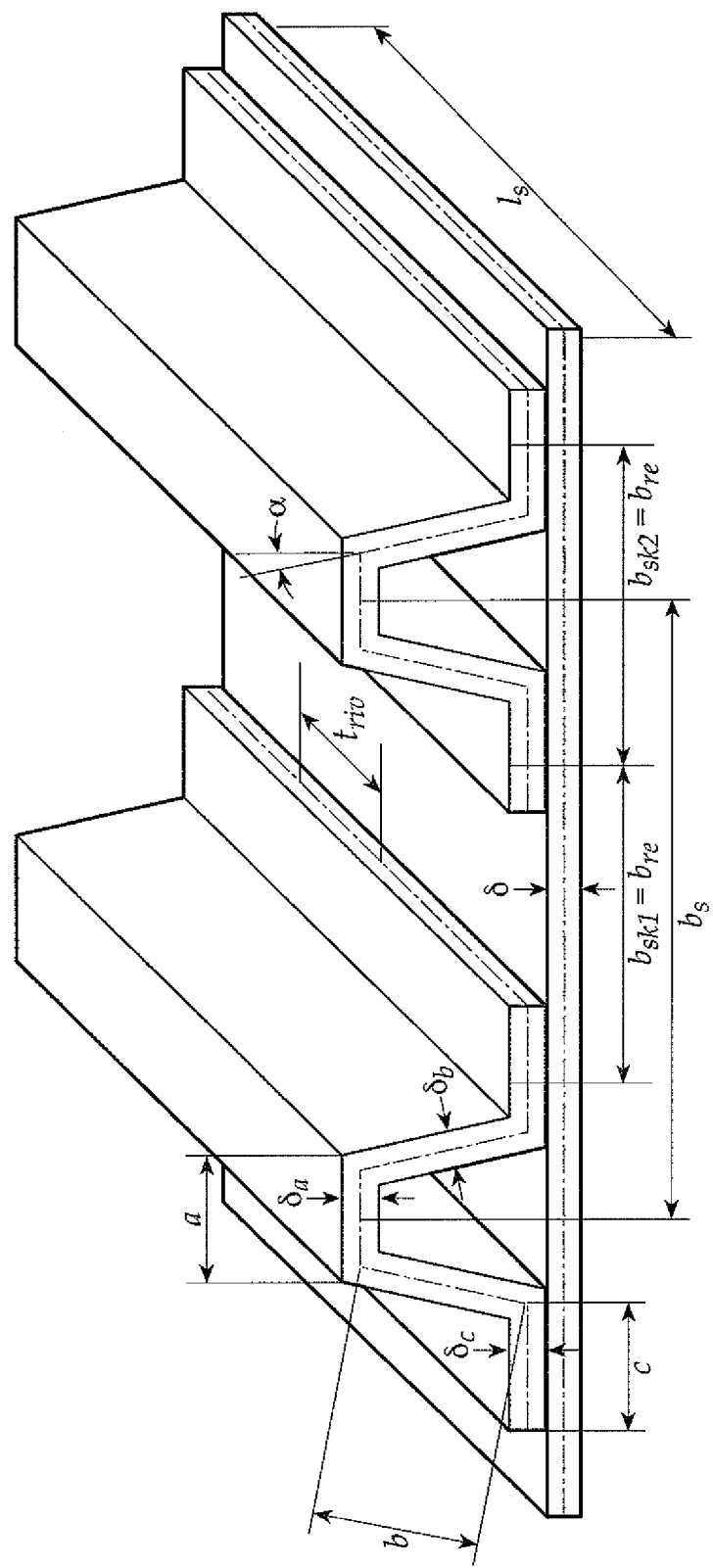

FIG. 55 is a stringer panel with U-shaped TPM possessing inclined lateral web.

Figure 56:
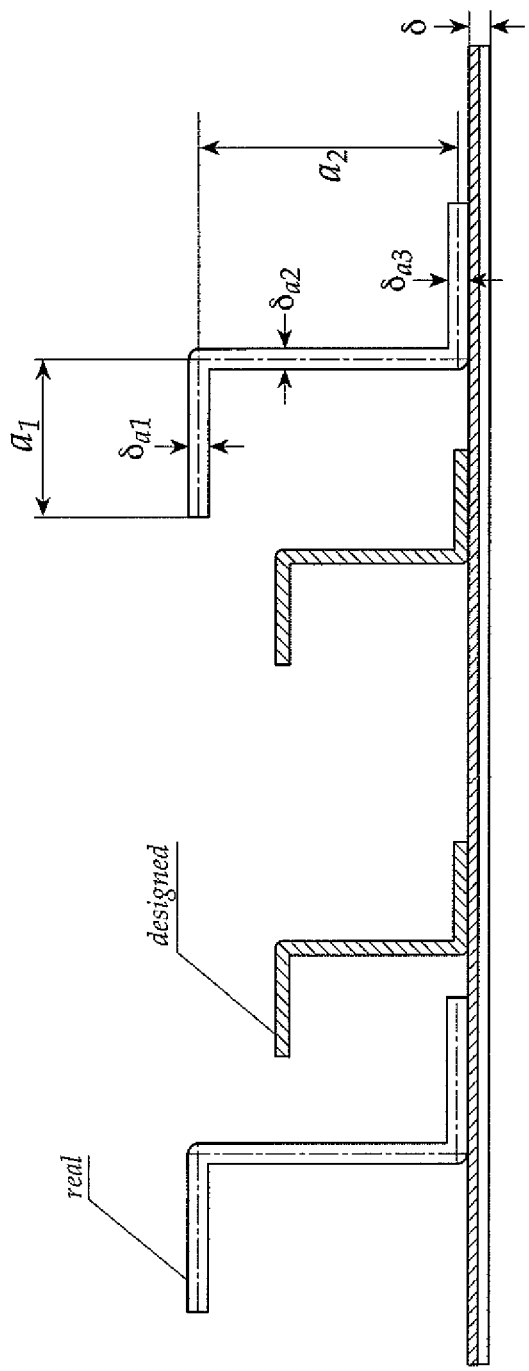

FIG. 56 shows real and optimum-design stringer panels.

FIG. 57 are tables showing (i) a range of allowable values for stringer panel stress factors, and (ii) features of real and optimum-design panels.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in schematic form with no additional detail in order to avoid obscuring the novelty of the exemplary embodiments presented herein.

The word "exemplary" is used herein to mean "serving as an example, instance, or illustration." Any embodiment described herein as "exemplary" is not necessarily to be construed as preferred or advantageous over other embodiments.

The subject matter of the present inventions may best be understood by reference to the following descriptions taken in connection with the accompanying drawings.

The present disclosure describes improved TPM and TPM-panel design optimization techniques. The techniques utilize advanced mathematical modeling techniques to perform practical multi-parameter associations.

The term "constructive restrictions" is used herein to refer to TPM dimensionality necessary to achieve desired structural, material and fabrication requirements and specifications.

Structural requirements for load-carrying TPMs and TPM-panel combinations are set to ensure stability and stiffness under compressive load. An excessive compressive load could, for example, lead to buckling, an unstable condition affecting the TPM but also potentially the surrounding environment.

Material requirements for load-carrying TPMs and TPM-panel combinations are set to ensure minimum weight objectives at maximum expected load-bearing capacity.

Fabrication requirements for load-carrying TPMs and TPM-panel combinations are typically associated with manufacture or design specific parameters relating to sizing, cost, proper fit, etc. An example set of fabrication type requirements may be requirements that call for minimum thickness of TPM to allow mass production, providing a panel sheet thickness which conforms to standard thickness values, and ensuring that any design allows for any flanges incorporated thereon, for example, to allow the mounting of rivets.

For purposes of the present disclosure, a constructive restriction is any variable which plays any role whatsoever in the ability to achieve the best possible weight optimization limited only by the availability of TPM configurations for selection by a designer as part of the design process.

| GLOSSARY OF TERMS TO BE USED | |
|---|---|
| Bow | Longitudinal curvatures of rod, bar, shape and tube. |
| Buckle | A distortion of the surface of the material. |
| Elasticity | The ability of a material or body to return to its original shape and dimensions after being deformed by stress. |
| Profile/shape | A product that is long in relation to its cross-section dimensions (not a wire, a rod, or a bar), formerly termed a "shape". |
| Proportionality limit stress | The maximum stress which a metal still obeys Hooke's Law. |
| Structural shape | A section of any design accepted as standard by the structural industry; such shapes include I-beam, wide flange of H-beam, channels, angles, tees and zees. |
| Ultimate stress | The maximum stress (tensile, compressive, or shear) that a material can withstand. |
| Yield stress | The stress at which a material exhibits a specified permanent set. For aluminum alloy and steel yield stress is 0.2% of gauge length; for aluminum alloy the yield stresses in tension and compression are approximately equal. |
| Thin wall structures | Three dimensions of these structures are expressed by three values of different magnitude (shapes, tubes, wires, rods, bars), or two out of three dimensions of such structures are expressed by values of the same magnitude, and the third one, related to thickness, represents a smaller value with respect to those two (thin plates, shells, thick planks). The basic ultimate condition of thin wall structures is buckling under compressive load. |

| NOMENCLATURE | |
|---|---|
| Structural Property Notation | |
| $M$ | bending moment in calculated wing section, [daN.cm] |
| $M_{t.s}$, or $M_{tor}$ | torsion moment in calculated wing section, [daN.cm] |
| $Q$ | lateral or transversal force in calculated wing section, [daN] |
| $q$ | uniform or linear compressive force, [daN/cm] |
| $P$ | concentrated compressive force, [daN] |
| $l$ | distance between calculated wing sections, [cm] |
| $B$ | width of box beam in calculated wing section, [cm] |
| $c_{max}$ | maximum thickness of wing aerodynamic profile, [cm] |
| $h_{ef}$ | effective height of wing box, [cm] |
| $h_w$ | height of wing box section vertical wall, [cm] |
| $\delta$ | thickness of shape-stiffened plate, [cm] |
| $t$ | thickness of vertical wall of wing box section, [cm] |
| $b_s$ | longitudinal installation shape spacing (stringer spacing), [cm] |
| $b_{re}$ | reduced width of shape-stiffened plate, [cm] |
| $l_s$ | shape length, [cm] |
| $l_{re}$ | shape effective length, $l_{re} = l_s/\sqrt{cs}$, [cm] |
| $l_r$ | lateral installation shape spacing (rib spacing), [cm] |
| $r$ | pillar spacing (pillars supporting vertical walls), [cm] |
| $a, \delta_a, b, \delta_b, c, \delta_c$ | shape cross-section dimensions, [cm] |
| $F$ | shape cross-section area, [cm$^2$] |
| $J$ | shape moment of inertia, [cm$^4$] |
| $i_s$ | shape radius of gyration, $i_s = \sqrt{(J/F)}$, [cm] |
| $W$ | wing box moment of resistance [cm$^3$] |
| $\Omega$ | wing box area, [cm$^2$] |

| NOMENCLATURE | |
|---|---|
| $\sigma, \tau$ | normal and shear stress, [daN/cm$^2$] |
| $\bar{P}_c$ | shape load intensity or stress factor, $\bar{P}_c = P/l_{re}^2$, [daN/cm$^2$] |
| $\bar{q}_p$ | panel load intensity or stress factor, $\bar{P}_p = P/(B \cdot l_{re}) = q/l_{re}$, [daN/cm$^2$] |
| Material Property Notation | |
| $\sigma_{pr}, \tau_{pr}$ | compression and shear proportionality limit stress, [daN/cm$^2$] |
| $\sigma_{0.2}, \tau_{0.2}$ | compression and shear yield (0.2% offset) stress, [daN/cm$^2$] |
| $\sigma_b, \tau_b$ | tensile and shear ultimate stress, [daN/cm$^2$] |
| $\sigma_0, \tau_0$ | compression and shear limiting stress, [daN/cm$^2$] |
| $E$ | compression normal modulus (Young's modulus), [daN/cm$^2$] |
| $G_{s.p.}$ or $G_{p.s}$ | stringer panel weight, [kg] |
| $G_{p.r.}$ or $G_{r.p}$ | rib stringer panel weight, [kg] |
| $G_w$ | pillar wall weight, [kg] |
| $G$ | wing box beam weight, [kg] |
| $\gamma$ | density of material, [kg/cm$^3$] |
| Non Dimensional Factors | |
| $f$ | shape factor |
| $\eta_\omega, \eta_\tau$ | compression and shear plasticity or elastic ductility factors |
| $\beta$ | rib strength factor |
| $K_e$ | bending stiffness rib factor |
| $A, \Sigma$ | shape efficiency factor |
| $K_\omega, K_\tau$ | compression and shear crippling plate or cell factors |
| $\theta$ | pillar moment of inertia factor |
| $\Psi$ | shape dimensions variation factor |
| $c_s$ | stringer end fixity factor |
| Sub- and superscripts | |
| ts | torsion |
| cr | critical |
| l | local |
| tot | total (overall) |
| r | rib |
| sk | skin (plate) |
| p | panel |
| s | stringer |
| pi | pillar |
| w | wall |
| ef | effective |
| re | reduced |
| pr | proportional |
| s.p. or p.s. | stringer panel |
| r.p.or p.r. | ribbed panel |
| ex | experimental |
| op | optimum |
| n | normative (feasible) |
| rq | required |
| riv | rivet |
| av | average |
| tr | transversal |
| d | design |

INTRODUCTION

A structural design optimization methodology and tool is herein described. The technology pertains to thin wall structures in respect of minimum weight criterion. Technology emphasis is the weight optimization of structural metal thin wall load bearing shapes of various configurations and panels. Intended uses include applications spanning the aerospace, construction, transportation and other industries.

The technology aims in part to take advantage of the widespread commercial availability of extruded (rolled) thin wall structures, which come in a wide variety of standards and sizes, with H, L, Z, I, C, T, and U-shaped configurations being widely deployed for this reason. Aluminum alloy and steel structures are particularly plentiful and common design choices by designers across industries with load bearing design needs.

The aim of structural design optimization is to be able to achieve reliable thin wall structures which are at the same time light in weight and lower cost if possible.

A software tool capable of addressing the inefficiencies and lack of precision in prevailing structural optimization processes would be quickly embraced by structural engineers, designers and developers.

The presently proposed solution solves inverse task of structural mechanics for TPMs and TPM-panels: given load, material, pattern of axes, overall size (length, width), and constructive restrictions on the structure, cross-section dimensions are found corresponding to the optimum weight structure.

In a real world environment, a structural design optimization is considered solved when demonstrating changes of weight value in a wide range of structural parameters for different types of structures and materials. For instance, it is not sufficient only to find out that the optimum height or thickness of the shape corresponds to their optimum values. Because the calculated optimum values may not be implemented due to structural, material, or fabrication restrictions, it is equally important to demonstrate how optimum weight values will change for others shapes, in view of these restrictions. The designer should not only select the best suited material, but he should also know how the structure's weight will change in case a different material is used. Because the basic ultimate condition of thin wall structures is buckling under compressive load, these data cannot be obtained by direct comparison of mechanical properties specifications of materials, because the weight of buckling thin wall structure depends on the compressive load value when the material's mechanical properties are changed.

Modern structural optimization design concepts rely heavily on mathematical modeling, using as principles functional analysis theory, theory of random functions, and the theory of operations.

Many structural optimization concepts however suffer from an "academic" approach to addressing the problem. Traditional approaches rely on single-discipline optimization, at best coupling low accurate modeling of other relevant disciplines during the detailed design phase without consideration of all design variables and restrictions. Omission or poor formulation of even one restriction leads to undesirable effects and dismissal of the result as irrelevant.

It would be very much desirable to be able to make generalization that on the one hand make it possible to single out optimization methods that combine certain main conditions from perspective of strength, overall and local buckling, stiffness, according to the industry standards, while at the same time, leave room for structural, material, and/or fabricated restrictions in arriving at optimum design configurations and parameters.

Because the final output of a designer's work is a structural blueprint, design methodologies should allow being able to determine optimum suitable configurations based in large extent on profile of cross-sections and cross-section dimensions of structures.

Because of high labor intensity of computations, getting accurate results of simultaneous optimization even of three- or four-parameter problems is practically possible only by utilization of significant computer resources and time. Several search methods for the optimum are known of multi-parameter problem solving using a computer: classical analysis method (variation calculation); deterministic approach—scanning, mathematical programming (gradient based methods); probabilistic (random) search. The variation calculation method requires solving an equations system with partial derivatives for variable parameters. The disadvantages of this method are: cumbersome equations and, more importantly, this method do not allow any discontinuities or functions' extreme points and their derivatives. The latter does not allow using this method for optimization of some parameters.

In the deterministic approach, the gradient method is a two-step one: first, partial derivatives for variable parameters are calculated. Then, the system shifts in the direction opposite to the gradient one (the scalar function gradient vector is co-directional with this function's largest increase). The gradient method is well suited to solving linear problems. The majority of practical parameter optimization problems are nonlinear ones. In this case, the method is time consuming.

Structural design optimization has been developed in general for such simple structural members as thick wall beams, weighted cross-section bars, trusses, arches, and frames. Thin wall plates, shells, and shapes are significantly less researched. Only those inverse tasks of structural mechanics that have the simplest mathematical models are explored in the thin wall structural design optimization.

Traditional approach for determining optimum geometrical parameters is to use cross-section area as variable parameters rather than cross-section dimensions (perhaps allowing reduction of number of variables.) Local stability is ensured by restricting the cross-section dimensions based on the results of the separate local stability problem solved with the consideration of design issues in mind.

The constructive restrictions are taken into consideration when cross-section dimension values are calculated based on the results of the area optimization problem by using the iterative search technique. However, iterative search does not allow one to determine how close the selected set of cross-section dimensions is to the optimum one, neither does it ensure correspondence to the minimum cross-section area. Therefore, such problem formulation is less accurate than when cross-section dimensions are assumed as variables during the optimization process.

For example, Boeing Design Manual (BDM—6080) is able to combine buckling and crippling modes to optimize simple round tube columns of different aluminum alloys because the task only involved two variable geometric parameters and two equations. However, it could not adapt this approach to the more complex structures it sought to optimize due to the complexity of the task, which involved multiple variable geometric parameters.

In one scenario, BDM notes "a Z section has no common relationship such as Dit" and enforces "some geometric constraints to dictate its optimum dimensions," declaring that "In the physical behavior of the Z section, however, this is difficult to achieve." In BDM, local stability (crippling) is ensured by restricting the cross-section dimensions based on the results of the separate local stability problem solved with cross-section area as a variable.

The presently proposed approach, described in greater detail below, has shown great promise in design optimization of practical multi-parameter thin wall structures using only mathematical analysis and modeling.

An important distinction in the proposed approach is in its reducing the dimensionality of a problem (by decreasing the number of simultaneous variable parameters) by employing a general scheme and incorporating common design approaches. This is achieved in principle by an initial process of:

1) transition from simple calculation schemes to more complex ones based on the analysis of work and different stability failure modes in a structure; 2) introduction of integrating factors—design indexes; 3) introduction of constructive restrictions; and 4) use of the equal stability principle.

After this initial process is completed, a scanning methodology is employed (e.g., direct enumeration methodology) and a small number of resulting variables used. The proposed process was found to make it possible to scale down the optimization process of a wing box, for example, from 20 to 4 variable geometric parameters. This is described and explained further below.

The proposed solution does require a high level of familiarity and advanced know-how of load and material science. During aircraft design, the present methodology may be utilized during the advanced detailed design stage.

A better practice would be to identify optimum weight structural shape designs and configurations at the earliest possible stage in design, which in the case of aircrafts, are the preliminary and concept design phases. This also leaves room for being able to make more informed decisions on matters of design and, of course, to reduce wasteful efforts.

Using the extensive data from practical application of the technology to different shapes, materials, and constructive restrictions and analysis of plots of the new geometric index, ranges of cross-section dimension ratio values critical for optimum weight have been established. For each TPM shape, inside the ranges, the values of the shape efficiency factor have insignificant deviation from its theoretical maximum values and thus insignificant deviation from its theoretical minimum weight values. Therefore, constructive restrictions to actual cross-section dimensions need be factored into the ratio values inside the ranges to achieve optimum weight.

Outside the ranges, the weight of the shapes increases significantly. The ranges are the same for all loads, materials, shapes, and constructive restrictions and serve as an essential criterion of quality and efficiency of the developed design.

By further reducing the parameters of the optimization task, the ranges can be used early in design to assure a minimum weight structure that will perform with integrity under any load and using any material. The ranges enable decreased labor intensity and simplify computation standardization as well as development of standard optimum design programs and design manuals.

Model and Analysis Tool—High Level Description

The present invention employs a software-based, model and analysis tool that performs computational analysis on designer-selected TPMs to help in the selection of the appropriate TPM with minimum weight and size for a particular application.

The analysis uses criteria that have never been used before to select a TPM of optimum weight, and in fact, for this reason, it is believed that conventional techniques do not provide an opportunity for a designer to be able to use computationally-determined solutions to ensure that a particular TPM or TPM-panel is weight-optimized for a given application or use.

The proposed approach employs a process whereby the number of simultaneously relevant variables under consideration are decreased using a number of design approaches. One such design approach involves a process whereby, starting with an initial structure, a modeling and simulation process is initiated which applies work and stability failure analysis, starting with initial simple calculation methodologies and transitioning to higher level of calculation complexity. In parallel or subsequent thereto, (i) integrated factors-design indexes, (ii) equal stability principle, and (iii) constructive restriction parameters are all introduced.

The design output serves as a blueprint for the next stage which is the actual fabrication or manufacturing of the component. For a given set of constructive restrictions, the final product is based on optimum configurations selected from a fixed set of TPMs with varied cross-sectional shapes; or in the case of TPM-panels, on optimum configurations selected from a fixed set of TPM-panel combinations of varied cross-sectional dimensions.

The present disclosure uses mathematical modeling to weight-optimize the design process without using conventional iterative process analysis and modeling.

Where TPMs have been deployed with selected cross-section dimensions, at no time has the effect of "spacing" of cross-section material been taken into consideration in determining optimum weight. As a result, at a higher moment of inertia, while higher overall stability is achieved, local stability is reduced.

TPM-panel combination arrangements are also known, but as has already been explained, design tools all rely on iterative modeling techniques which suffer the drawbacks already described.

The present disclosure describes new and novel techniques for selecting optimum weight design TPMs and TPM-panel combinations that meet constructive restrictions.

The proposed approach is a system of optimization including a problem formulation strategy that is based on applying the inverse task of structural mechanics. The system minimizes the number of parameters varied simultaneously, thereby reducing time to design as well as cost of design while a weight optimized solution is achieved.

FIGS. 1-8 show a set of distinct TPM configurations associated with a number of different variants defined later below.

Likewise, FIGS. 10-15 show various TPM-panel combinations and in some cases from differing perspectives.

Each TPM is defined by at least a main strip (b) and one or more additional strips which form web- and flange-type strips. A web (or web strip) is characterized by two common longitudinal reinforcing ribs, while a flange (or flange strip) is characterized by one common longitudinal reinforcing rib and one free longitudinal reinforcing rib.

Referring back to the figures, FIG. 1 shows a TPM (variant TPM I) having a closed rectangular shape, two main web strips and two additional web strips in accordance with an exemplary embodiment of the invention.

FIG. 2 shows a TPM (also variant TPM I) with closed triangular shape, two main web strips and one further web strip.

FIG. 3 shows an I-shaped TPM (variant TPM II) which has one main web strip and four flanges.

FIG. 4 shows a Z-shaped TPM (also variant TPM II) which has one main web strip and two flanges.

Figure 5:
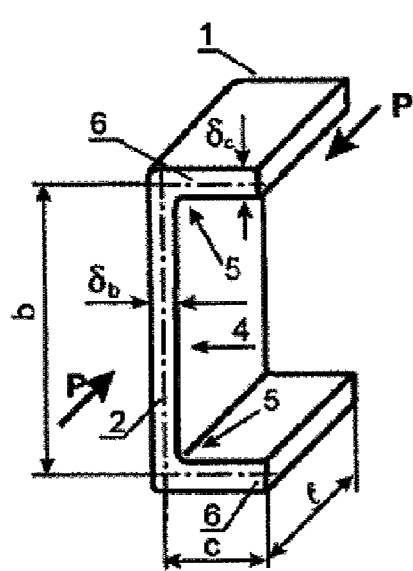

FIG. 5 shows a C-shaped TPM (variant TPM II) with one main web strip and two flanges.

Figure 6:
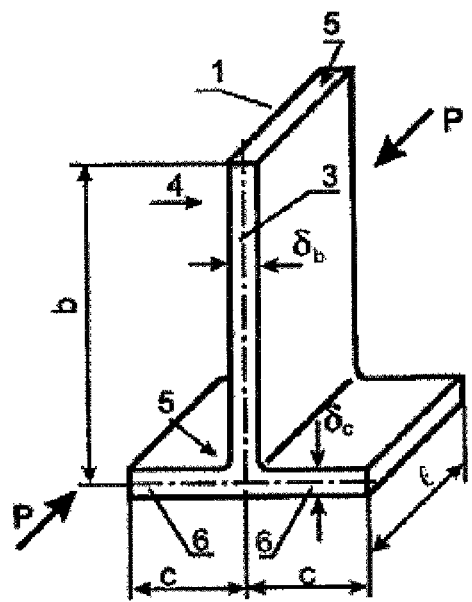

FIG. 6 shows a T-shaped TPM (variant TPM II) with one main flange and two further flanges.

Figure 7:
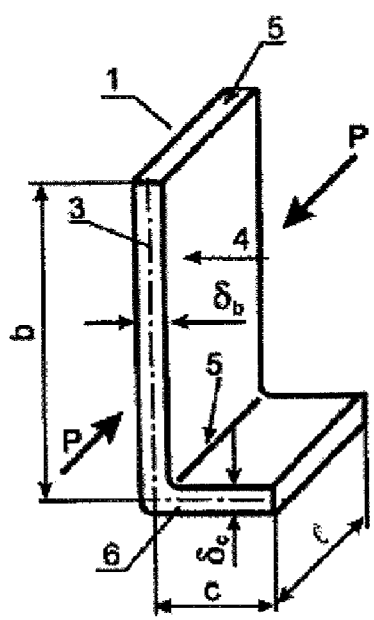

FIG. 7 shows an L-shaped TPM (variant TPM II) with one main flange and one further flange.

Figure 8:
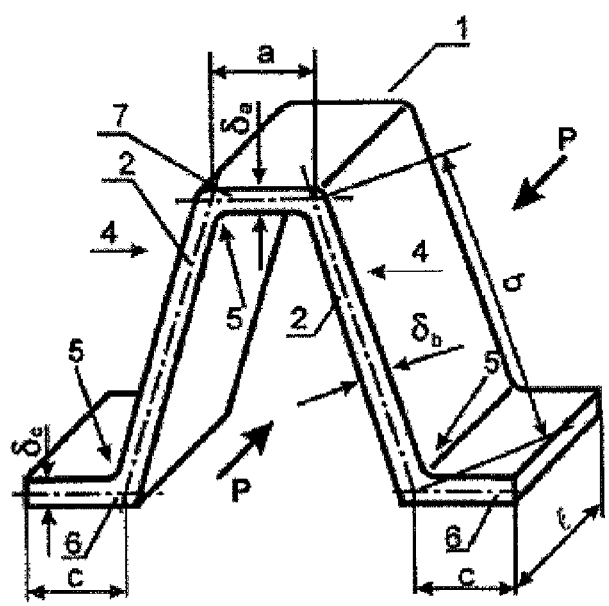

FIG. 8 shows a U-shaped TPM (variant TPM III) with two main inclined web strips, one web strip and two flanges.

Figure 9:
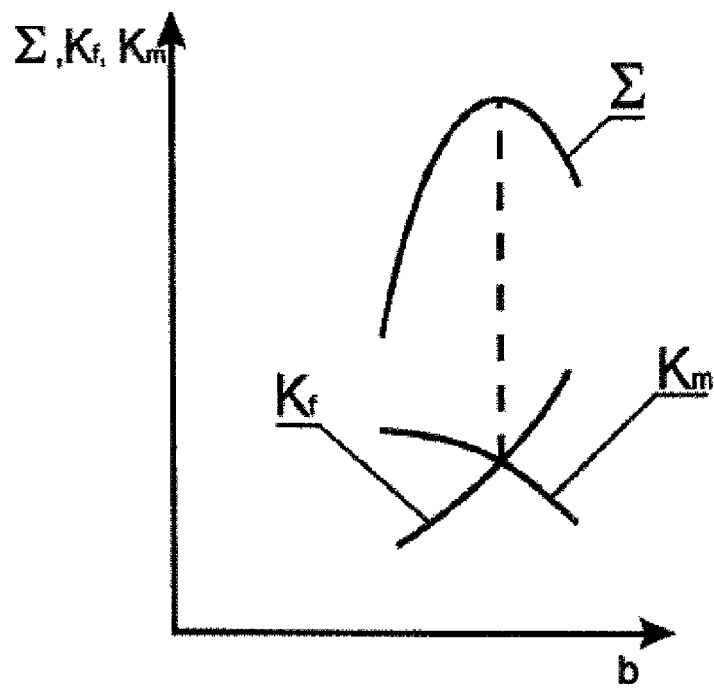
FIG. 9 diagrammatically maps shape efficiency factor value $\Sigma$ as a function of width b.

FIG. 9 diagrammatically maps shape efficiency factor $\Sigma$ as a function of width b, which shall be discussed in greater detail below.

Figure 10:
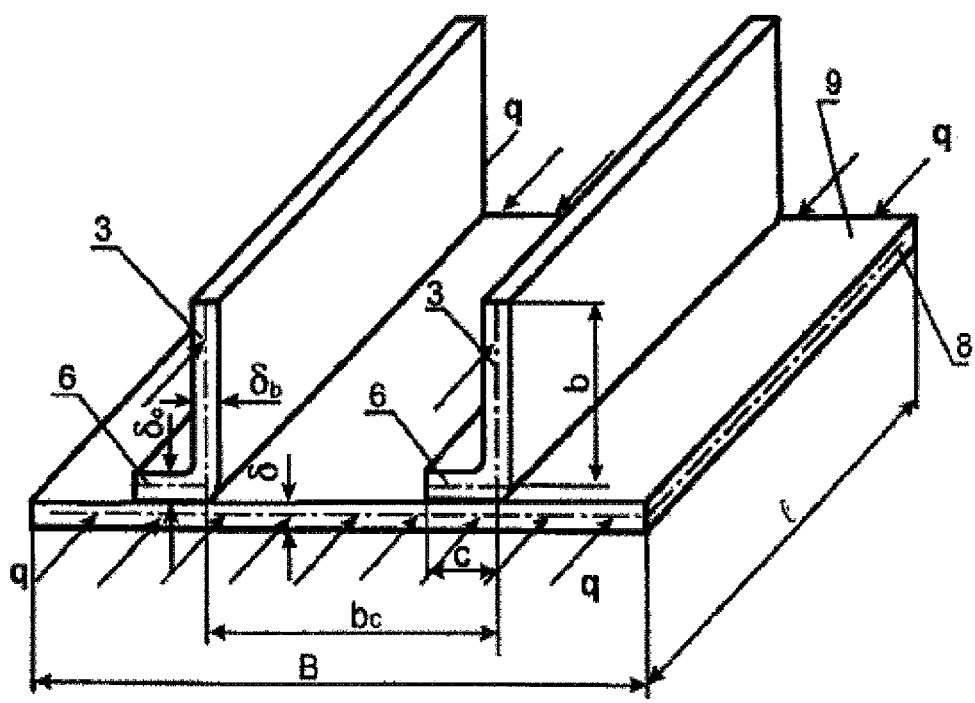
FIG. 10 is a cross-section perspective of a TPM-panel combination in accordance with a further embodiment of the present invention.

FIG. 10 is TPM-panel combination formed by joining an L-shaped TPM to a sheet in open cross-section configuration.

Figure 11:
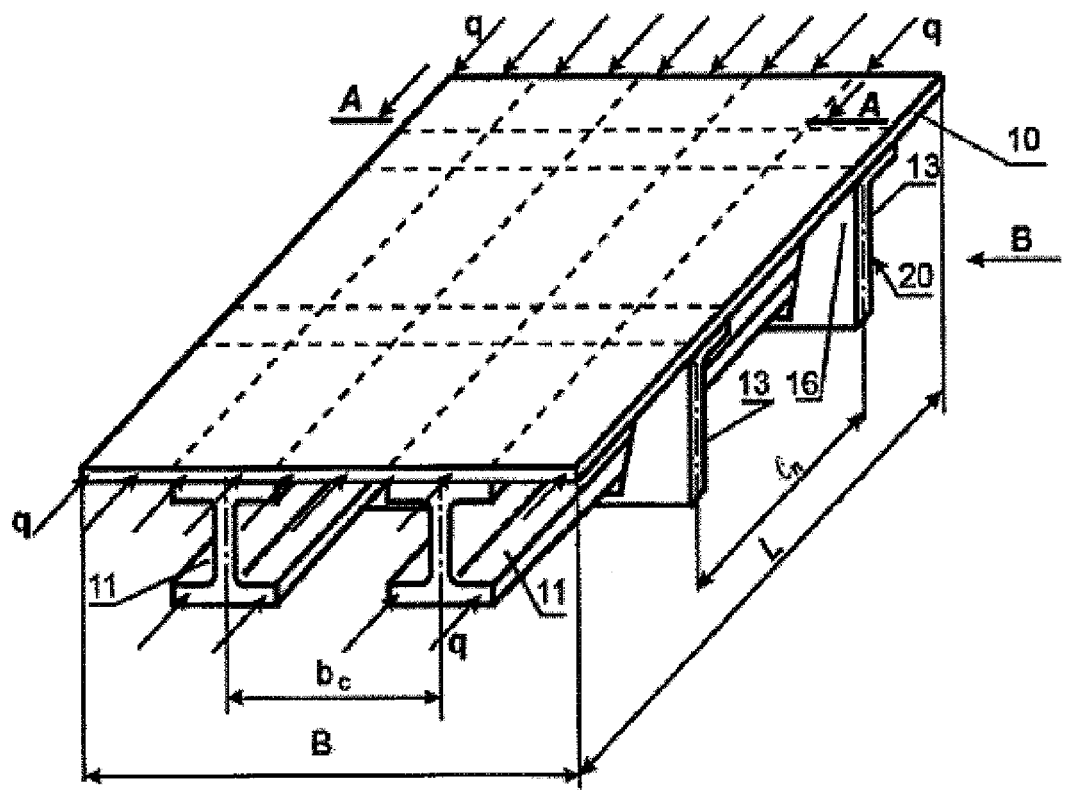
FIG. 11 is an inverted perspective of the configuration in FIG. 10 showing the I- and L-shaped TPMs positioning on the panel, which function to simultaneously reinforce the panel in the longitudinal and transverse directions, respectively.

FIG. 11 is an inverted perspective of the configuration in FIG. 10 showing more clearly the I- and L-shaped TPMs' positioning on the panel which function to simultaneously reinforce the panel in the longitudinal and transverse directions, respectively.

Figures 12, 13:
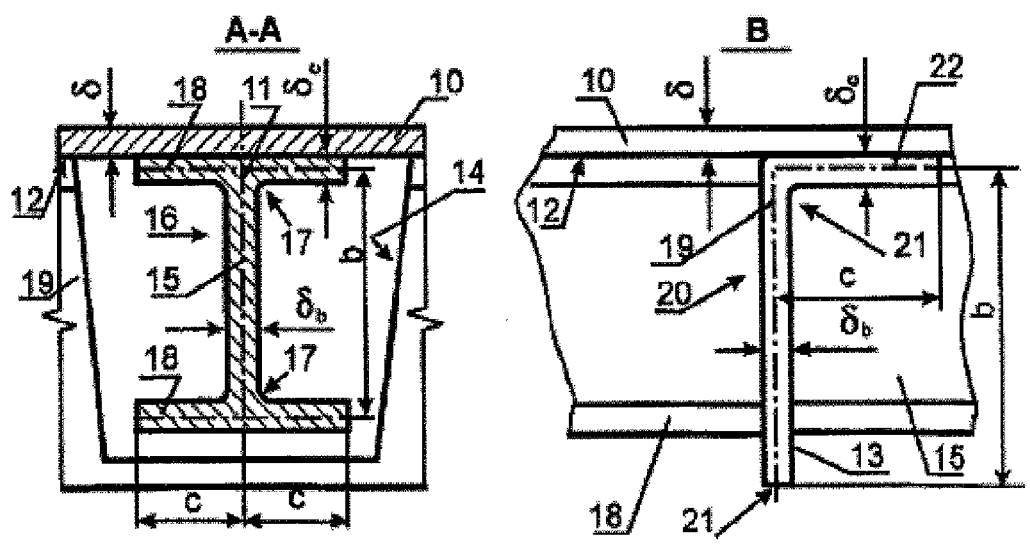
FIG. 12 is a sectional view of FIG. 11 taken along line "A-A."
FIG. 13 is a further sectional view as seen in the direction of arrow "B" in FIG. 11.

FIG. 12 is a sectional view of FIG. 11 taken along line "A-A".

FIG. 13 is a further sectional view as seen in the direction of arrow "B" in FIG. 11.

Figure 14:
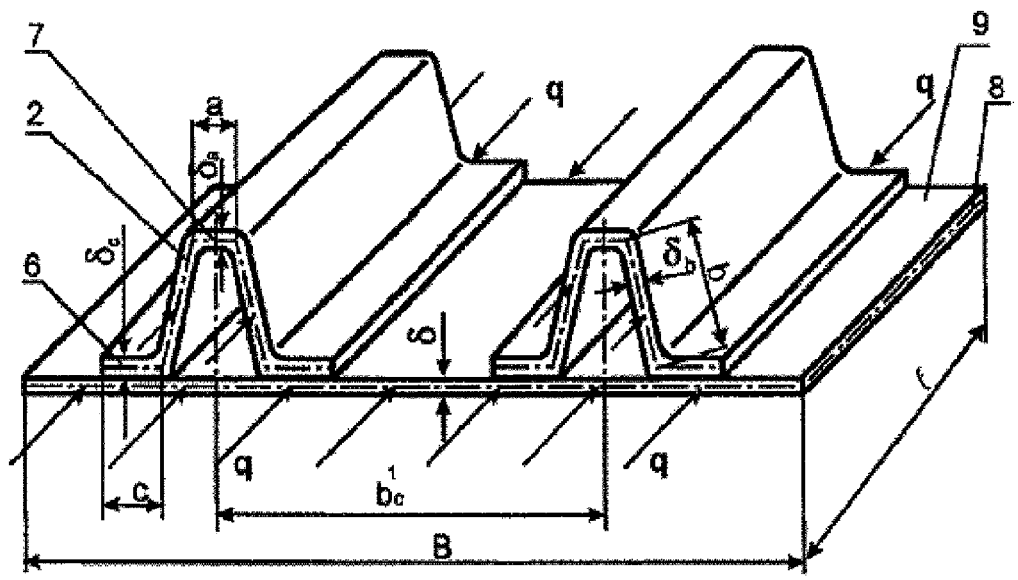
FIG. 14 is a cross-sectional perspective of a further TPM-panel configuration defined by a U-shaped TPM in accordance with a further embodiment.
Figure 15:
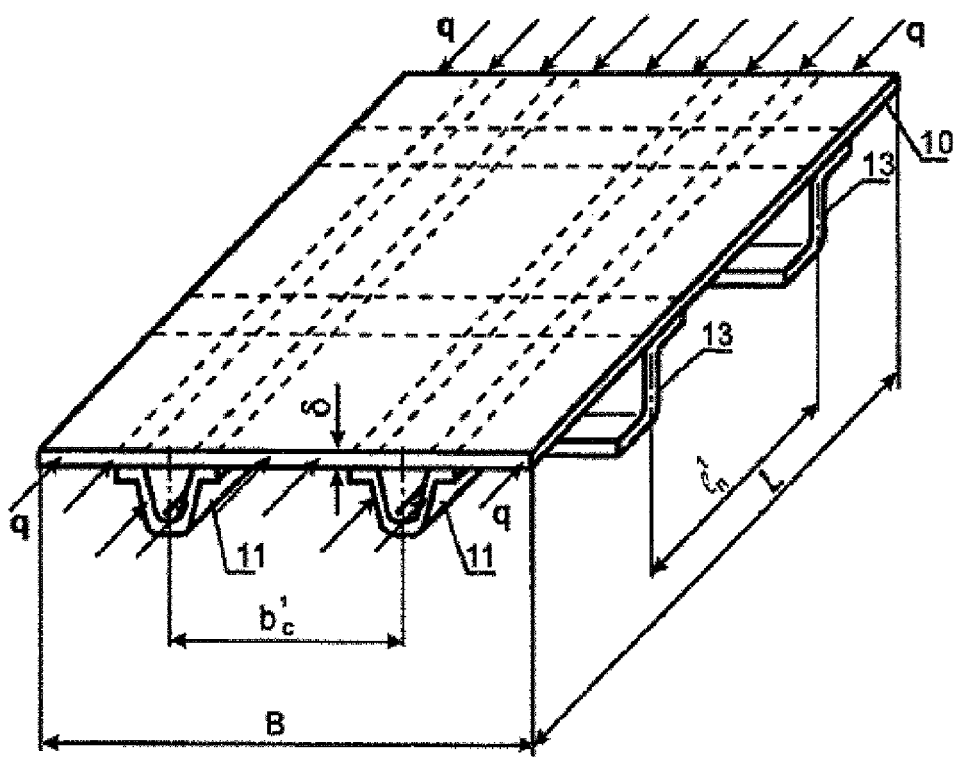
FIG. 15 is a further cross-sectional perspective of a TPM-panel configuration substantially as shown in FIG. 14 but including, in addition to the U-shaped TPM, a further Z-shaped TPM to cooperatively reinforce the panel in both longitudinal and transverse directions, respectively.

FIG. 14 is a cross-sectional perspective of a further TPM-panel configuration defined by a U-shaped TPM in accordance with a further embodiment;

FIG. 15 is a further cross-sectional perspective of a TPM-panel configuration substantially as shown in FIG. 14 but including, in addition to the U-shaped TPM, a further Z-shaped TPM to cooperatively reinforce the panel in both longitudinal and transverse directions, respectively.

The proposed TPM shape according to the variant I (hereinafter, TPM I) is characterized in that the ratio of the width of the additional strip with common reinforcing ribs to the width of the main strip satisfies the range:

$$a/b = 0.3 \text{ to } 0.7 \quad (1),$$

and the ratio of the thickness of additional strip with common reinforcing ribs to the thickness of the main strip satisfies the range:

$$\delta_a/\delta_b = 1.0 \text{ to } 3.0 \quad (2),$$

where:
a is the width of the additional strip with common reinforcing ribs;
b is the width of the main strip;
$\delta_a$ is the thickness of the additional strip with common reinforcing ribs; and
$\delta_b$ is the thickness of the main strip.

As provided, the stiffness of the main strip does not exceed the stiffness of the additional strip, specifically, $\delta_a/a \geq \delta_b/b$.

The proposed TPM according to the variant II (hereinafter, TPM II) is characterized in that the ratio of the width of the additional strip with the free reinforcing rib and the common reinforcing rib to the width of the main strip satisfies the range:

$$c/b = 0.05 \text{ to } 0.3 \quad (3),$$

and the ratio of the thickness of the additional strip with the free reinforcing rib and the common reinforcing rib to the thickness of the main strip satisfies the range:

$$\delta_c/\delta_b = 1.0 \text{ to } 3.0 \quad (4),$$

where:
b is the width of the main strip;
c is the width of the additional strip with the free reinforcing rib and the common reinforcing rib;
$\delta_b$ is the thickness of the main strip; and
$\delta_c$ is the thickness of the additional strip with the free reinforcing rib and the common reinforcing rib.

As provided, the stiffness of the main strip does not exceed the stiffness of the additional strip, specifically, $\delta_c/c \geq \delta_b/b$.

The proposed TPM according to the variant III (hereinafter, TPM III) is characterized in that the ratio of the width of the additional strip with common reinforcing ribs to the width of the main strip satisfies the range:

$$a/b = 0.3 \text{ to } 0.7 \quad (1),$$

and the ratio of the thickness of the additional strip with common reinforcing ribs to the thickness of the main strip satisfies the range:

$$\delta_a/\delta_b = 1.0 \text{ to } 3.0: \quad (2),$$

with this, the ratio of width of the additional strip with the free reinforcing rib and the common reinforcing rib to the width of the main strip satisfies the range:

$$c/b = 0.05 \text{ to } 0.3 \quad (3),$$

and the ratio of the thickness of the additional strip with the free reinforcing rib and the common reinforcing rib to the thickness of the main strip satisfies the range:

$$\delta_c/\delta_b = 1.0 \text{ to } 3.0 \quad (4),$$

where:
a is the width of the additional strip with common reinforcing ribs;
b is the width of the main strip;
c is the width of the additional strip with the free reinforcing rib and the common reinforcing rib;
$\delta_a$ is the thickness of the additional strip with common reinforcing ribs;
$\delta_b$ is the thickness of the main strip;
$\delta_c$ is the thickness of the additional strip with the free reinforcing rib and the common reinforcing rib;
with this, the stiffness of the main strip does not exceed the stiffness of the additional strip; specifically, $\delta_a/a \geq \delta_b/b$ and $\delta_c/c \geq \delta_b/b$.

Besides, in this variant of the TPM, the stiffness of the additional strip with common reinforcing ribs does not exceed the stiffness of the additional strip with the free reinforcing rib and the common reinforcing rib; specifically, $\delta_a/a \geq \delta_b/b$ and $\delta_c/c \geq \delta_b/b$, which follows from expressions (1), (2), (3) and (4).

The second type of subject of the group of inventions is two variants of TPM-panel configurations, IV and V (hereinafter, TPM-panel IV and TPM-panel V, or simply panel IV and panel V), based on all said variants of TPM, I, II and III.

The technological result of the panel according to the variant IV is achieved by that the panel comprises a sheet and a number of TPMs, having relations between the shape dimensions complying with the expressions in equations (1)-(4) above, which are installed across its width longitudinally with even pitch; with this, the main strip(s) and additional strip(s) are forming with the sheet an open cross-section configuration, wherein the thickness of the sheet of the panel according to the invention satisfies the following expression:

$$\delta = (0.0006 \text{ to } 0.0035)l \quad (5),$$

and the pitch of the longitudinal installation satisfies the expression:

$$b_c = (20 \text{ to } 65)\delta \quad (6),$$

where:
$\delta$ is the thickness of the sheet of the panel;
l is the length of the thin wall profile member forming with the sheet the open cross-section configuration; and
$b_c$ is the pitch of the longitudinal installation of thin wall profile members forming with the sheet the open cross-section configuration.

The stiffness of the main strip does not exceed the stiffness of the additional strip, and the stiffness of the additional strip with common reinforcing ribs does not exceed the stiffness of the additional strip with the free reinforcing rib and the common reinforcing rib; specifically, $\delta_b/b \leq \delta_a/a \leq \delta_c/c$.

Besides, the panel IV can be additionally equipped with the TPM installed transversally and having the above relations of the shape dimensions (1)-(4). With this, it is expedient to install these TPM with the pitch of transversal installation $$l_n = (10 \text{ to } 60)b_c \quad (7),$$

where: $l_n$ is the pitch of transversal installation of thin wall profile member for the case of longitudinally installed thin wall profile member forming with the sheet the open cross-section configuration;

$b_c$ is the pitch of the longitudinal installation of thin wall profile members forming with the sheet the open cross-section configuration.

The technological result of panel V is achieved by that the panel comprises a sheet and a number of TPMs, having relations between the shape dimensions complying with the expressions in equations (1)-(4), which are installed across its width longitudinally with even pitch; with this, the main strip(s) and additional strip(s) are joined with the sheet to form a closed cross-section configuration, wherein the thickness of the sheet of the panel according to the invention satisfies the following expression:

$$\delta = (0.0006 \text{ to } 0.0035)l \quad (5)$$

and the pitch of the longitudinal installation satisfies the expression:

$$b^1_c = (40 \text{ to } 130)\delta \quad (8),$$

where:
$\delta$ is the thickness of the sheet of the panel;
$l$ is the length of the thin wall profile members forming with the sheet the closed cross-section configuration; and
$b^1_c$ is the pitch of longitudinal installation of thin wall profile members forming with the sheet the closed cross-section configuration.

The stiffness of the main strip does not exceed the stiffness of the additional strip, and the stiffness of the additional strip with common reinforcing ribs does not exceed the stiffness of the additional strip with the free reinforcing rib and the common reinforcing rib, specifically, $\delta_b/b \leq \delta_a/a \leq \delta_c/c$.

Besides, the panel according to the variant V can be additionally equipped with the TPM installed transversally and having the above relations of the shape dimensions (1) to (4). With this, it is expedient to install these TPM with the pitch of transversal installation $$l^1_n = (1.5 \text{ to } 10)b^1_c \quad (9),$$

where:
$l^1_n$ is the pitch of transversal installation of thin wall profile members for the case of longitudinally installed thin wall profile member farming with the sheet the closed cross-section configuration; and
$b^1_c$ is the pitch of the longitudinal installation of thin wall profile members forming with the sheet the closed cross-section configuration.

Thus, to achieve an optimum weight TPM for a given set of constructive restrictions the process to be followed involves first providing a TPM having a cross-section that includes at least one of (1) at least two main strips and at least one additional strip having ends connecting with respective ends of two of the at least two main strips and selecting dimensions such that each main strip has a thickness $\delta_b$ and a width b and the additional strip has a thickness $\delta_a$ and a width a so that $\delta_b/b$ is not larger than $\delta_a/a$, and (2) at least one main strip and at least one additional strip having one end connecting with an end of the main strip and selecting dimensions such that the main strip has a thickness $\delta_b$ and a width b and the additional strip has a thickness $\delta_c$ and a width c and so that $\delta_b/b$ is not larger than $\delta_c/c$.

The next step involves selecting set of cross-section dimensions ratios values within established ranges values. A set of constructive restrictions is established that map to actual cross-section dimensions.

Then, based on the set of ratios values and constructive restrictions, a respective set of shape efficiency factors values $\Sigma_1, \Sigma_2 \ldots \Sigma_n$, is determined wherein each of the shape efficiency factor values is defined by:

$$\Sigma = K_f K_m,$$

where
$K_f = (i^2/F)^{2/5}$ is an overall stability factor,
$K_m = K^{1/5}/(b/\delta_b)^{2/5}$ is a local stability factor,
b, $\delta_b$ are the width and the thickness of the main strip, respectively,
i, F are the radius of gyration and the cross-section area, respectively, and
K is the coefficient in the known formula for local stability stress.

In a subsequent step, a maximum of the shape efficiency factor value $\Sigma_{max}$ is determined from within the respective set of determined shape efficiency factors values $\Sigma_1, \Sigma_2 \ldots \Sigma_n$.

Then based on this determination of the shape efficiency factor maximum value $\Sigma_{max}$, a next step is to ascertain TPM ratio values.

From this, a TPM pattern having cross-section dimensions and ratio values which result in a maximum shape efficiency factor value $\Sigma_{max}$ is identified. Implicitly, this same pattern also ensures the reliable operation and weight-optimized result of a TPM for the given set of desired, predefined constructive restrictions.

The proposed approach calculates maximum shape efficiency factor values for different shape TPMs. Once this is done, an overall maximum shape efficiency factor value $\Sigma_{0max}$ is identified as well as its associated shape. This shape determines among all TPM shapes the best TPM configuration to employ.

As previously explained, a TPM could be combined with two or more strips. In such cases, if buckling were to occur, it is most likely to occur first in the strips of the TPM. We can refer to this as "local failure mode", which is characterized by warp along one or more cross-sections in addition to any stresses produced linearly in relation to the position of common longitudinal ribs of the strips.

This local failure mode may result in overall buckling failure mode and collapse of the entire TPM subject to compressive forces. This in turn could lead or contribute to overall TPM-panel combination failure, which could result in severe system or device failure.

Optimization, therefore, as contemplated herein involves applying the techniques proposed to determine possible failure condition along a number of cross-sections of the TPM-panel combination.

The presently proposed approach therefore is a design optimization technique that algorithmically looks at alternative TPM and TPM-panel combinations, and on the basis of predefined constructive restrictions (structural, material and fabrication requirements) identifies a combination of variables from which cross-section dimensions are determined. By making incremental changes to cross-section dimensions, and for a given pattern, determining possible failure conditions, it is possible to arrive at a best result. This result it has been determined is a much more efficient and cost effective way to select a best pattern than has been done using conventional (usually iterative) techniques.

This next section will now set out to describe application of the suggested techniques to arrive at somewhat more complicated patterns involving reinforcing TPM-panel combinations IV and V. Here again the goal is to minimize panel weight with respect to a given set of constructive restrictions.

TPM-panel combinations IV and V are "wide column" structures, whereas TPMs I-III are all simple or "narrow column" structures, for purposes of discussion. Wide and narrow is used here to describe stability related attributes in overall and local terms. A configuration cross-section is "wide", for instance, when there is both TPM and panel simultaneously being subjected, at that cross-section, to various load-bearing stresses. In case of "narrow" design, only the TPM cross-section is considered to bear load stress.

"Local" is meant to refer to a "localized failure condition", i.e., a condition that is limited to the TPM cross-section (or TPM-panel combination) only. When the failure condition expands beyond the TPM cross-section (or TPM-panel) then there is said to be an "overall failure condition".

In the case of a TPM-panel combination, the sheet (which serves as the panel) provides substantial additional stability to the combination, which is one reason why it is provided. When referring to local stability, the benefit in stability of the sheet is not accounted for. However, in calculating overall stability, then the contribution in stability by the sheet is accounted for through appropriate calculations discussed below. This is achieved by treating wide cross-sections the same as narrow cross-sections when performing calculations. The aim is to arrive at a shape efficiency factor that is relevant.

Referring again to the variant TPM configurations shown in FIGS. 1 to 8, cross-section dimensions selection of each TPM will next be described by application of a set of ratios rules.

As should be appreciated, a TPM is configured to structurally be impacted when a compressive load P is applied. The following TPM configurations have been shown: closed rectangle (FIG. 1), closed triangle (FIG. 2), I-shaped (FIG. 3), Z-shaped (FIG. 4), C-shaped (FIG. 5), T-shaped (FIG. 6), L-shaped (FIG. 7), and U-shaped (FIG. 8).

A TPM may comprise one or more main web strips 2 (as shown in FIGS. 1-5 and 8); or one or more main flanges 3 (as shown in FIG. 6 and FIG. 7). Each TPM may further include one or more main strip(s) 4 characterized by two common longitudinal reinforcing ribs or one free longitudinal reinforcing rib and one common longitudinal reinforcing rib 5, respectively, as shown in FIGS. 10-15. Additional flange(s) 6 (shown in FIGS. 3 to 8) and web strip 7 (shown in FIGS. 1, 2 and 8) may be included and which are defined by (i) a width which is less than that of main strip 4 and (ii) a thickness not less than that of main strip 4.

Further rules that should be followed are set forth below.

For example, the stiffness of main strip 4 should not exceed that of the additional strip (flanges 6, web strips 7): specifically, $\delta_a/a \geq \delta_b/b$ and $\delta_c/c \geq \delta_b/b$. The stiffness of the additional strip with two common longitudinal reinforcing ribs, web 7 (FIG. 8), should not exceed the stiffness of the additional strip with one free longitudinal reinforcing rib and one common longitudinal reinforcing rib, flange 6 (FIG. 8): specifically, $\delta_a/a \leq \delta_c/c$.

The additional flange 6 or the additional web 7 can be located with respect to main strip 4 either at a 90° angle as in FIGS. 1, 3 to 7, or at a different angle as in FIGS. 2 and 8.

Width and thickness of main webs 2, flanges 3 and additional webs 7, flanges 6 in the cross-sections of TPM (FIGS. 1 to 8) should satisfy expressions (1), (3), (10):

$$a/b\ 0.3\ \text{to}\ 0.7 \quad (1),$$

$$c/b = 0.05\ \text{to}\ 0.3 \quad (3),$$

$$\delta_a/\delta_b = \delta_c/\delta_b = 1.0\ \text{to}\ 3.0 \quad (10),$$

where: a, b, c, $\delta_a$, $\delta_b$, and $\delta_c$ are, respectively, width and thickness of the additional web, the main web or flange and the additional flange.

For example, width a of additional web 7 has its length measured along a cross-section medial line (the line equidistant from longitudinal edge lines of cross-section) of the web 7 between the respective lines of main webs 2 adjacent to the web 7 (FIGS. 1, 2 and 8).

Width b of main web 2 or flange 3 has its length measured along the medial line of the cross-section of main web 2 or flange 3 between the respective lines of adjacent strips (FIGS. 1 to 8).

Width c of additional flange 6 has its length measured along the medial line of the cross-section of flange 6 from the medial line of main web 2 or flange 3 to the free longitudinal reinforcing rib of additional flange 6 (FIGS. 3 to 8).

Thickness $\delta_a$, $\delta_b$, and $\delta_c$ corresponding to dimensions a, b, c is defined as the distance measured between the edges of cross-sections of webs and flanges.

The above expressions (1), (3), (10) should be applied where variant TPM I, II or III are employed with following shapes: I-shape with one main web 2 and four additional flanges 6 (FIG. 3); Z-shape (FIG. 4) with two additional flanges 6 located both sides from the main web 2; C-shape with additional flanges 6 located the same side of the main web 2 (FIG. 5); U-shape with main webs 2, additional web 7 and additional flanges 6 (FIG. 8); T-(FIG. 6) and L-(FIG. 7) shapes with the main flange 3 and additional flange(s) 6; or closed rectangular (FIG. 1) and triangular (FIG. 2) shapes, as well as shapes with other arrangement and quantity of main and additional webs and flanges.

The ratio range values of widths and ratios of thicknesses of main webs 2 and flanges 3, additional flanges 6 and webs 7 are obtained using the generalizing parameter with various shapes of TPM. Reference was made to this earlier when referring to a "shape efficiency factor Σ, where $$\Sigma = K_f K_m,$$

where:
$K_f = (i^2/F)^{2/5}$ is an overall stability factor,
$K_m = K^{1/5}/(b/\delta_b)^{2/5}$ is a local stability factor,
b, $\delta_b$ are the width and the thickness of the main web 2 or flange 3, respectively;
i, F are the radius of gyration and the area of shape of any TPM shown in FIGS. 1 to 8, respectively; and
K is the coefficient in the known formula for local stability critical stress, depending on ratios (1), (3), (10) of TPM shape dimensions.

TPMs may be compared in terms of weight as well. The greater the maximum value of factor Σ for a particular shape, the less its TPM weight.

At the same time, within the specified ranges, maintaining the values of the above ratios, variation of shape absolute (actual) dimensions is possible which enables to provide for constructive restrictions not entailing a considerable increase of the weight of TPM. Beyond these ranges, the weight of TPM increases significantly.

The graphic illustration of the shape efficiency factor Σ versus the width b of the main strip is shown in FIG. 9. As can be seen from this plot, the factor Σ possesses, for each shape, a maximum value. For each TPM shape, a corresponding shape efficiency factor maximum value exits that falls inside a range of ratio values.

FIG. 9 therefore illustrates the significance of a shape efficiency factor. The wider a structural shape cross-sectional material is "distributed" (i.e., placed at the farthest distance from the neutral axis), the bigger the value of the overall stability factor $K_f$ and its overall stability.

At the same time, the local stability factor $K_m$ that characterizes local stability decreases. As a result, when functions of overall and local stability have equal values, the function of the shape efficiency factor has its maximum value (this being different for different TPM cross-section shapes). Furthermore, this maximum value ensures the minimum TPM shape cross-section area (and hence the minimum weight).

Different cross-section shapes can also be compared by their associated weight values. The bigger the maximal value of the shape efficiency factor Σ of a particular shape, the smaller its associated TPM shape weight value.

At the same time, it is possible to maintain, within specified ranges, the values of the above ratios through a variation of shape actual (absolute) cross-section dimensions. This has the benefit of, for a given set of constructive restrictions, being able to select actual cross-section dimensions without compromising considerably TPM weight. Inside the ranges, for each TPM shape, the values of the shape efficiency factor have insignificant deviation from its theoretical maximal values and thus insignificant deviation from its theoretical minimum weight values. Outside the ranges, the shape efficiency factor values decrease significantly, so the weight of the TPM increases significantly.

Having identified that a range of values for shape efficiency factor exists, it is not only possibly to select a best design TPM for a given application, it is now also possible to create many new TPMs which likewise are defined by a shape efficiency factor that varies only slightly within a desired range and with respect to weight, and much more significantly outside the range.

To minimize weight during design development, the idea is to use a programming tool that algorithmically reduces the design choice down to a best TPM selection based on pre-defined, or otherwise known, cross-section dimension ratio values falling with a desired range.

As a design is tweaked to meet other design constraints, the tool will recognize when certain cross-section dimensions ratios appear to have fallen outside a desired range of values and prompt the designer to select a different TPM, or change the material of the TPM. In the latter instance, a stronger material will necessarily change the shape efficiency factor for a TPM of a given shape.

The above-described principles are equally relevant when designing TPM-panel combinations.

FIG. 10 shows a TPM-panel combination of variant IV. This variant is based on the L-shaped variant TPM II described above and shown in FIG. 7. In a fully-deployed state, a TPM-panel will be subjected primarily to a compressive load q directed along a length l that's distributed across a width B of the TPM-panel. The TPM-panel includes sheet 8 and a variant type TPM II attached to one of the sides 9 of this sheet 8 across its width and installed longitudinally with even pitch. Multiple TPMs (variant II) are shown. Each TPM is integrably coupled to sheet 8 in an open cross-section configuration. Each TPM II is an L-shape type TPM and consists of main flange 3 and one additional flange 6.

Width b and c of main flanges 3 and of additional flanges 6 and the thickness of these, $\delta_b$ and $\delta_c$, respectively, satisfy the expressions:

$$c/b=0.05 \text{ to } 0.3 \quad (3),$$

$$\delta_c/\delta_b=1.0 \text{ to } 3.0 \quad (4).$$

The other dimensions of TPM-panel (variant IV) cross-section in FIG. 10 satisfy the following expressions:

$$\delta=(0.0006 \text{ to } 0.0035)l \quad (5),$$

$$b_c=(20 \text{ to } 65)\delta \quad (6),$$

where:
δ is the thickness of sheet 8;
$b_c$ is the pitch of the longitudinal installation of the TPMs resting on sheet 8 in the open cross-section configuration shown and described; and
l is the length of TPM II.

As provided, the stiffness of the main strip does not exceed the stiffness of the additional strip, specifically, $\delta_c/c \geq \delta_b/b$.

FIG. 14 shows a TPM-panel (variant V) which is based on a TPM of variant III of U-shape (as in FIG. 8). Here, the TPM is formed with sheet 8 in closed cross-section configuration. Each TPM III is characterized by main webs 2, additional web 7 and additional flanges 6.

The values of width a, b, c of additional webs 7, main webs 2, and additional flanges 6 and values of thickness corresponding to these dimensions, $\delta_a$, $\delta_b$, $\delta_c$ of the shape of TPM III of the TPM-panel V satisfy the following expressions:

$$a/b=0.3 \text{ to } 0.7 \quad (1),$$

$$c/b=0.05 \text{ to } 0.3 \quad (3),$$

$$\delta_a/\delta_b=\delta_c/\delta_b=1.0 \text{ to } 3.0 \quad (10).$$

The other dimensions of the panel V cross-section (FIG. 14) satisfy the following expressions:

$$\delta=(0.0006 \text{ to } 0.0035)l \quad (5),$$

$$b^1_c=(40 \text{ to } 130)\delta \quad (8),$$

where:
δ is the thickness of the sheet 8;
$b^1_c$ is the pitch of the longitudinal installation of thin wall profile members forming with the sheet 8 the closed cross-section configuration; and
l is the length of TPM III.

The stiffness of the main strip should not exceed the stiffness of the additional strip, and the stiffness of the additional strip with common reinforcing ribs should not exceed the stiffness of the additional strip with the free reinforcing rib and the common reinforcing rib, specifically, $\delta_b/b \leq \delta_a/a \leq \delta_c/c$.

To reinforce TPM-panels IV and V in longitudinal direction, additional TPMs of variant I, II and III are shown embodied. One skilled in the art would appreciate that this is done only for discussion purposes, and that other TPM shapes, including for example, Z-, T-, C-, rectangular, or triangular shapes.

The TPM-panels IV and V, shown in FIGS. 10 and 14 function as follows.

The distributed compressive load q is reacted by both TPM I, II, III and the sheet of TPM-panel 8. The load-bearing capacity of the TPM-panels IV, V is provided for by virtue of selection of optimum dimensions of cross-section of the panel: dimensions of shapes of TPM are selected basing on the expressions of equations (1), (3), (4) and (10); the thickness of sheet 8 and the pitch of TPM longitudinal installation that have been selected based on rules satisfying the expressions in equations (5), (6) and (8), respectively.

FIGS. 11-13 and 15 show panels IV, V with TPM II, III installed both longitudinally and transversally.

FIGS. 11 to 13 show panel IV based on longitudinally installed I-shaped TPM II and transversally installed L-shaped TPM II.

In its course of operation, a TPM-panel IV will react primarily to any compressive load q directed along length L of any longitudinally installed TPM (see pos. 11 in FIGS. 11 and 12). These same TPMs are attached to one of the sides 12 of sheet 10 across its width and formed integrally with sheet 10 in open cross-section configuration.

TPM 13 are installed transversally with even pitch across the length of the same side 12 of sheet 10 and are embodied with cut-outs 14 in which the longitudinally installed TPM 11 are located (FIGS. 11-13). TPM 11 possesses the main web 15 embodied as the main strip 16; at each of its reinforcing ribs 17, an additional flange 18 is formed with the width less than that of the strip 16 and with thickness not less than that of the strip 16 (FIG. 12).

The width b and c of main webs 15 and additional flanges 18, and thickness corresponding to these dimensions, $\delta_b$, $\delta_c$, respectively, of the shape of longitudinally installed TPM 11 satisfy the expressions:

$$c/b = 0.05 \text{ to } 0.3 \quad (3),$$

$$\delta_c/\delta_b = 1.0 \text{ to } 3.0 \quad (4),$$

With this, the stiffness of the main strip does not exceed the stiffness of the additional strip, specifically, $\delta_c/c \geq \delta_b/b$.

Each transversally installed TPM 13 is embodied as an L-shape and possesses a main flange 19 embodied as a main strip 20 across the width of which, at one of its longitudinal reinforcing ribs 21, an additional flange 22 is formed (FIG. 13).

Relations of shape dimensions of TPM 13 should also satisfy expressions (3) and (4).

The other dimensions of the cross-section of TPM-panel IV should satisfy the expressions:

$$\delta = (0.0006 \text{ to } 0.0035) L/n_n \quad (5),$$

$$b_c = (20 \text{ to } 65) \delta \quad (6),$$

where:
L is the length of the panel;
$n_n$ is the number of transversally installed TPM 13;
$\delta$ is the thickness of the sheet 10;
$b_c$ is the pitch of the longitudinal installation of TPM 11 forming with the sheet 10 the open cross-section configuration. In the panel IV with longitudinally installed TPM 11 of I-shape forming with the sheet 10 the open cross-section configuration, the pitch $l_n$ of the transversal installation of L-shaped TPM 13 (shown in FIG. 11), satisfies the expression:

$$l_n = (10 \text{ to } 60) b_c \quad (7).$$

FIG. 15 shows the TPM-panel V based on the longitudinally and transversally installed members 11 and 13, respectively. The longitudinally installed TPM 11 is embodied as a U-shape and formed with sheet 10 in closed cross-section configuration. The transversally installed member 13 is of a Z-shape.

The width a, b, c of additional webs, main webs, and additional flanges and thickness corresponding to these dimensions $\delta_a$, $\delta_b$, $\delta_c$ of the longitudinally and transversally installed TPM 11, 13 of the TPM-panel V shown in FIG. 15 satisfy the following expressions:

$$a/b = 0.3 \text{ to } 0.7 \quad (1),$$

$$c/b = 0.05 \text{ to } 0.3 \quad (3),$$

$$\delta_a/\delta_b = \delta_c/\delta_b = 1.0 \text{ to } 3.0 \quad (10).$$

The stiffness of the main strip should not exceed the stiffness of the additional strip, and the stiffness of the additional strip with common reinforcing ribs should not exceed the stiffness of the additional strip with the free reinforcing rib and the common reinforcing ribs, specifically, $\delta_b/b \leq \delta_a/a \leq \delta_c/c$.

The other cross-section dimensions of the panel V (FIG. 15) should satisfy the expressions:

$$\delta = (0.0006 \text{ to } 0.0035) L/n^1_n \quad (5),$$

$$b^1_c = (40 \text{ to } 130) \delta \quad (8),$$

where:
$\delta$ is the thickness of sheet 10;
$b^1_c$ is the pitch of installation of U-shaped TPM 11 formed with the sheet 10 in closed cross-section configuration;
L is the length of the panel; and
$n^1_n$ is the number of transversally installed TPMs 13.

The pitch $l^1_n$ of transversal installation of TPM 13 of TPM-panel V provided in the longitudinal installation of TPM 11 and formed with sheet 10 in closed cross-section configuration, should further satisfy the expression:

$$l^1_n = (1.5 \text{ to } 10) b^1_c \quad (9).$$

The width B of TPM-panels IV, V shown in FIGS. 10, 11, 14 and 15 is determined from the following expressions:

$$B = n_c \cdot b_c = n^1_c \cdot b^1_c \quad (11),$$

where $n_c$, $n^1_c$ are the numbers of longitudinally installed TPM of TPM-panels IV, V forming with the sheet the open and closed cross-section configuration, respectively.

The length L of TPM-panels IV, V shown in FIGS. 11 and 15 may be determined from the following expressions:

$$L = n_n \cdot l_n = n^1_n \cdot l_n \quad (12),$$

where $n_n$ and $n^1_n$ are the number of transversally installed TPMs for those longitudinal TPMs formed with the sheet in open and closed cross-section configurations, respectively.

For transversal and longitudinal reinforcing of TPM-panels IV and V, TPM of other shapes can also be employed.

In the course of operation of panels IV and V under the compressive load q, the load-bearing capacity of the panel is provided for by virtue of selection of the optimum dimensions of cross-sections of longitudinally and transversally installed TPM, thickness of the sheet, pitches of longitudinal and transversal installation corresponding to the minimum weight of the panel.

The presented examples and drawings illustrated herein are provided only by way of example. The shapes and configurations were selected due to their wide use in applications where thin wall profile structures are desirable. The illustrations are not meant to in any way limit the scope and spirit of application of the variants of the present invention. While a number of different variants of TPM-panel combinations have been shown and described, this too is not meant to be equally limited in any way.

It should further be stated that while TPM-panels are not as commonly used as simple TPM configurations, the mathematical relations expressed by (1), (3) and (10) are equally relevant to TPM-panels as they are to TPM-only configurations.

Thus, to achieve an optimum weight TPM for a given set of constructive restrictions the process to be followed involves first providing a TPM having a cross-section that includes at least one of (1) at least two main strips and at least one additional strip having ends connecting with respective ends of two of the at least two main strips and selecting dimensions such that each main strip has a thickness $\delta_b$ and a width b and the additional strip has a thickness $\delta_a$ and a width a so that $\delta_b/b$ is not larger than $\delta_a/a$, and (2) at least one main strip and at least one additional strip having one end connecting with an end of the main strip and selecting dimensions such that the main strip has a thickness $\delta_b$ and a width b and the additional strip has a thickness $\delta_c$ and a width c and so that $\delta_b/b$ is not larger than $\delta_c/c$.

The next step involves selecting set of cross-section dimensions ratios values within established ranges values. A set of constructive restrictions is established that map to actual cross-section dimensions.

Then, based on the set of ratios values and constructive restrictions, a respective set shape efficiency factors values $\Sigma_1, \Sigma_2 \ldots \Sigma_n$, are determined wherein each of the shape efficiency factor values is defined by:

$$\Sigma = K_f \cdot K_m,$$

where $K_f = (i^2/F)^{2/5}$ is an overall stability factor, $K_m = K^{1/5}/(b/\delta_b)^{2/5}$ is a local stability factor, b, $\delta_b$ are the width and the thickness of the main strip, respectively, i, F are the radius of gyration and the cross-section area, respectively, and K is the coefficient in the known formula for local stability stress.

In a subsequent step, a maximum of the shape efficiency factor value $\Sigma_{max}$ is determined from within the respective set of determined shape efficiency factors values $\Sigma_1, \Sigma_2 \ldots \Sigma_n$.

Then based on this determination of the shape efficiency factor maximum value $\Sigma_{max}$, a next step is to ascertain TPM ratio values.

From this, a TPM pattern having cross-section dimensions and ratio values which result in a maximum shape efficiency factor value $\Sigma_{max}$ is identified. Implicitly, this same pattern also ensures the reliable operation and weight-optimized result of a TPM for the given set of desired, predefined constructive restrictions.

The proposed approach calculates maximum shape efficiency factor values for different shape TPMs. Once this is done, an overall maximum shape efficiency factor value $\Sigma_{0max}$ is identified as well as its associated shape. This shape determines among all TPM shapes the best TPM configuration to employ.

TPM Computational Analysis—
High Level Operational Flow

Figure 16:
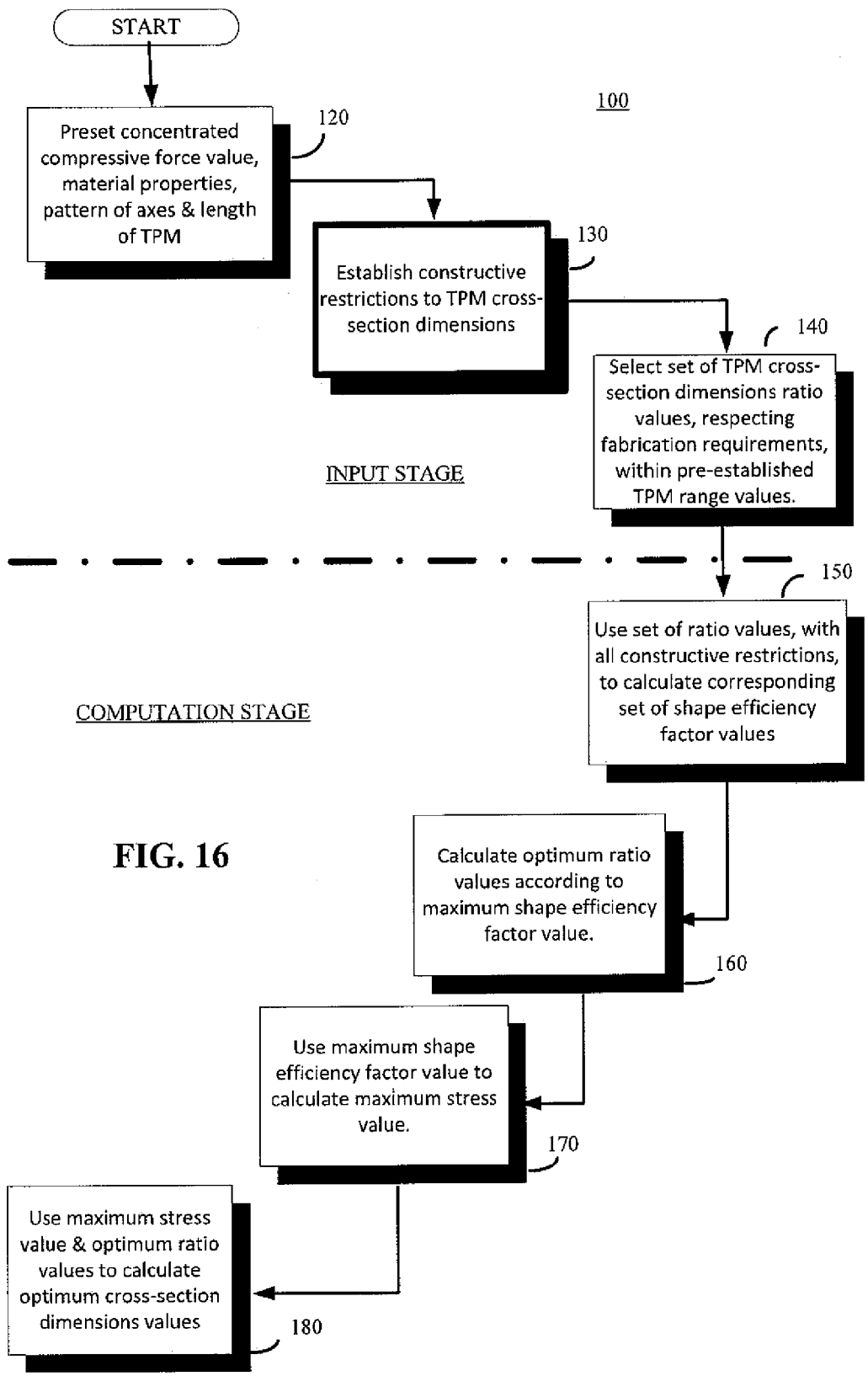
FIG. 16 is a flow diagram describing the operational flow of a model and analysis TPM design tool configured for selecting an optimum weight TPM in accordance with an exemplary embodiment.

FIG. 16 is a high-level flow diagram 100 describing the operation flow of a model and analysis TPM design tool configured for selecting an optimum weight TPM in accordance with an exemplary embodiment.

The proposed process of designing TPMs is facilitated by a model and analysis design tool. The tool performs computational analysis on relevant input variables. In this regard, we will functionally delineate process functions into an input stage and a computation stage.

The input stage, as the name implies, involves the designer inputting into the tool relevant design parameters (step 120). The relevant design parameters may include preset parameters such as concentrated compressive force value, material properties (compression yield stress value, compression proportionality limit value, tensile ultimate stress value, compression limiting stress value, compression normal modulus value), pattern of axes, length of the TPM and other relevant parameters.

The tool uses the received parameters to establish weight minimization parameters which include consideration of constructive restrictions (including fabricated restrictions) to TPM cross-section dimensions (step 130). Finally, the designer is asked to select from set of TPM cross-section dimension ratio values, respecting fabrication requirements of previous step, within pre-established TPM range values (step 140).

Having received all relevant input date, the tool must process the set of ratio values, respecting constructive restrictions, to obtain corresponding set of shape efficiency factor values (step 150).

The processing in the previous step results in identification of optimum ratio values according to maximum shape efficiency factor value (step 160).

The tool then calculates a maximum stress value using the maximum shape efficiency factor value to obtain maximum stress value (step 170). At step 180, the tool calculates optimum cross-section dimension values using maximum stress value and optimum ratio values.

TPM-Panel Computational Analysis—
High Level Operational Flow

Figure 17:
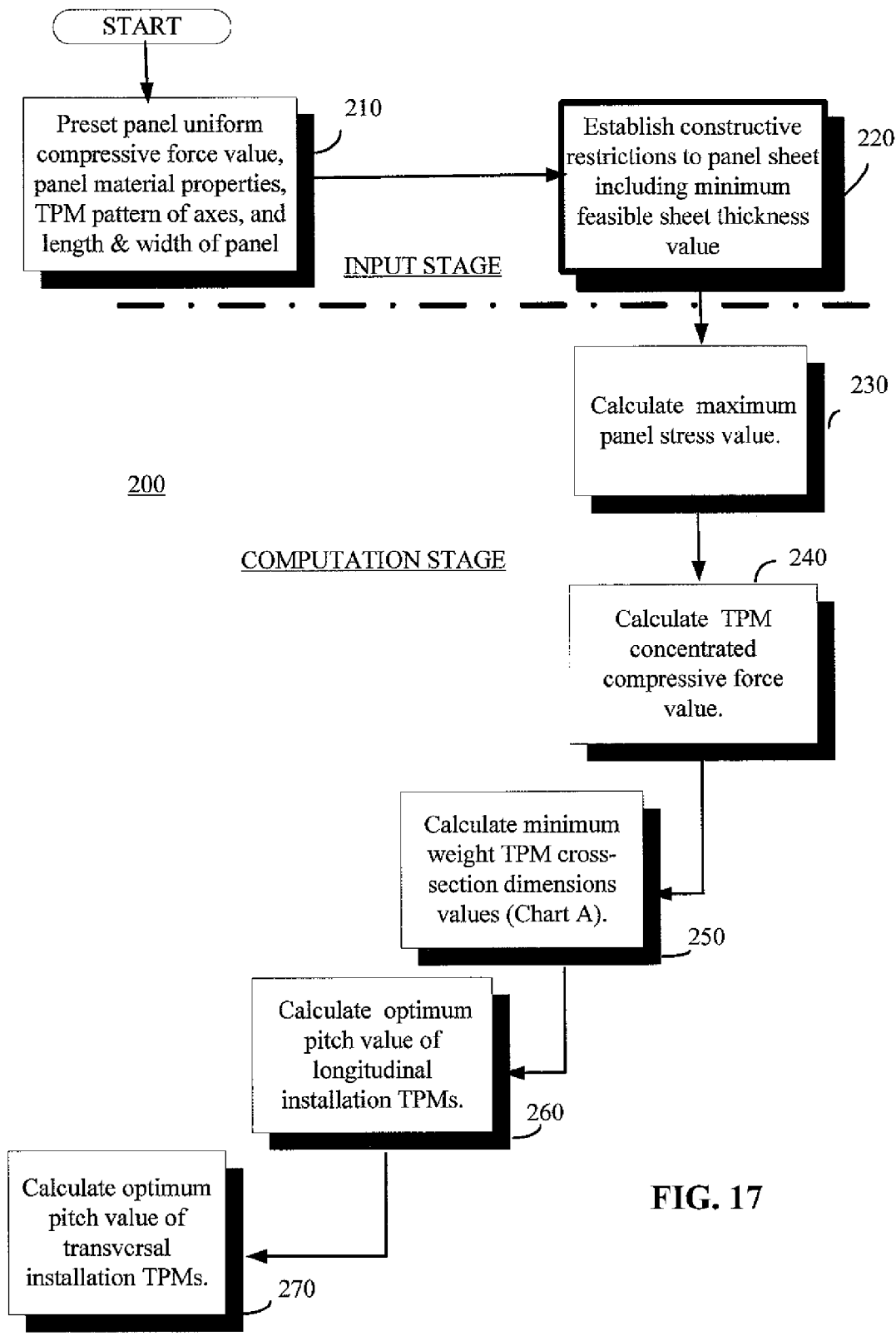
FIG. 17 is a flow diagram describing the operational flow of a model and analysis TPM design tool configured for selecting an optimum weight TPM-panel in accordance with a further exemplary embodiment.

FIG. 17 is a high-level flow diagram 200 describing the operation flow of a model and analysis TPM design tool configured for selecting an optimum weight TPM-panel in accordance with a further exemplary embodiment.

Referring to FIG. 17, a first step in design optimization of TPM-panel combinations involves receiving preset panel uniform compressive force value; panel material properties (TPM and sheet)—compression yield stress value, compression proportionality limit value, tensile ultimate stress value, compression limiting stress value, compression normal modulus value; pattern of axes (TPM shape); and panel length and width (step 210). Any constructive (including fabricated) restrictions to TPM-panel including minimum feasible sheet thickness value are established and entered into the tool to be used in its calculations (step 220). Steps 210 and 220 are part of the input stage functions performed by the tool.

Once the information has been collected the tool is ready to begin processing this information. This is performed by a calculations stage.

The first calculation is to generate a maximum panel stress value (step 230), followed by generating TPM concentrated compressive force value (step 240). This then is followed by generating minimum weight cross-section dimensions values using the methodology described in operational flow diagram 100 (step 250). The tool then calculates and generates an optimum pitch value of longitudinally installed TPMs (step 260). In the final step 270, the optimum pitch value of transversal installation TPMs is obtained.

The solution of the panel optimization problem is based on the existing methods of direct calculations of its strength, as well as on the results obtained in solution of the problem of the optimum compressive TPM.

The panel is considered as a "wide column" losing stability simultaneously in overall and local modes. It is assumed in the practice of TPM-reinforced panels that the link of TPM with skin is pivotal. In this assumption, in the local stability calculations, the mutual effect of TPM and skin is not accounted for, while in the overall stability calculations the effect of the skin is accounted for through the effective bending rigidity of the TPM. In the calculation scheme selected, the shape efficiency factor for a "wide column" shall be assumed the same as for the "simple (narrow) column".

For the example, the panel with Z-shape TPM (forming with the sheet an open configuration) shall be considered. For the panel with the U-shaped TPM (forming with the sheet a closed configuration), the final results are presented. The results of calculations are presented for panels with U-shaped, Z-shaped and L-shaped TPM.

To summarize, the computer-implemented methodology in accordance with an exemplary embodiment, involves the sequence of steps of:

a. identifying constructive restrictions associated with the panel sheet;
b. calculating a maximum panel stress value on the basis of the constructive restrictions;
c. calculating a TPM concentrated force value;
d. calculating for any TPM that is to be longitudinally disposed on the panel sheet, and for a first corresponding set of constructive restrictions, a first set of optimum cross-section dimensions ratio values;
e. calculating for any TPM that is to be transversally disposed on the panel sheet, and for a second corresponding set of constructive restrictions, a second set of optimum cross-section dimensions values;

f. calculating a first optimum pitch value to pitch position the TPMs to be longitudinally disposed on the panel sheet; and g. calculating a second optimum pitch value to pitch position the TPMs to be longitudinally disposed on the panel sheet.

As explained, the constructive restrictions associated with the panel sheet include a minimum feasible sheet thickness value, as well as at least one of a preset panel uniform compressive force value, panel material properties, TPM pattern of axes, and a length and width of panel.

Furthermore, the calculating of at least one of the first and second sets of optimum cross-section dimensions values of a corresponding TPM involves identifying a set of TPM cross-section dimensions ratio values, and calculating from a set of inter-dependent parameters, including the set of TPM cross-section dimensions ratio values, the optimum cross-section dimensions values of the TPM.

The set of inter-dependent parameters includes the corresponding one of the set of first and second constructive restrictions. Each of the first and second sets of constructive restrictions is determined from at least one of a preset concentrated compressive force value, material properties, pattern of axes, and a length of the associated TPM.

Furthermore, the calculating of the optimum cross-section dimensions ratio values of the TPM, involves:

a. calculating a corresponding set of shape efficiency factor values for the set of TPM cross-section dimensions ratio values, using the corresponding one of the first and second sets of constructive restrictions;

b. calculating a maximum shape efficiency factor value; and c. calculating optimum ratio values and a maximum stress value on the basis of the maximum shape efficiency factor value.

A further example of generating an optimum TPM design given a set of constructive restrictions utilizing the more common Z and I shapes, is now presented.

A Z shape is shown in FIG. 4 while an I shape is shown in FIG. 5. Consider these same TPMs with four variable shape dimensions b, $\delta_b$, c, and $\delta_c$. We first introduce relevant ratios:

(i) the ratio of the width of the additional strip with the free rib and the common rib to the width of the main strip: $a_1=c/b$, and (ii) the ratio of the thickness of the additional strip with the free rib and the common rib to the thickness of the main strip: $a_2=\delta_c/\delta_b$.

We then express the shape efficiency factor as a function of the two ratios $a_1$, $a_2$ and coefficient $K=K(a_1, a_2)$.

The theoretical maximum value of Z shape efficiency factor $\Sigma_{max}=0.538$ is obtained at the optimum ratio values at $a_1^{op}=0.15$ and at $a_2^{op}=2$, then the factor $K^{op}=6.0$.

The theoretical maximum value of I shape efficiency factor $\Sigma_{max}=0.556$ is obtained at the optimum ratio values at $a_1^{op}=0.05$ and at $a_2^{op}=2.5$, then the factor $K^{op}=6.2$.

Feasible ratios for Z shape taking into account constructive restrictions are presented below.

For Z shape, (at $\Sigma_{max}=0.538$) an optimum ratio value of $a_1^{op}=0.15$, the length of flange c at this optimum value is not sufficient to be able to successfully mount a rivet (c<2 cm). If the optimum thickness ratio value is increased to $a^{op}=2$, at this thickness $\delta_b$ may prove too thin (less than 1 mm). This makes it difficult to manufacture such a profile in mass-scale production. The most suitable for production is a constant thickness shape with $a_2^{op}=1$, but at some loads and material the value flange thickness $\delta_c$ may be less than the value of the thickness panel skin, and hence not recommended.

Given a different set of constructive restrictions, whereby $a_1=0.05$-$0.3$ and $a_2=1.0$-$3.0$, then in this scenario, a Z-shaped TPM may very well be a best option.

Going back to the previous example, it was explained that for a rivet to fit, an $a_1^{op}=0.3$ is desirable. With this, the maximum value $\Sigma=0.515$, at $a_2^{op}=2$, therefore $\Sigma=0.515$ will be less $\Sigma_{max}=0.538$ and weight of this variant Z shape will be more than for Z shape at theoretical value $\Sigma_{max}=0.538$ over 4.3% only. In the second example, again for a rivet could fit, we will assume that $a_1^{op}=0.3$, and that the most suitable for production is a constant thickness profile. Now assuming $a_2^{op}=1$, the resultant shape efficiency factor is only $\Sigma=0.50$. So, by changing slightly the design configurations the designer has to choose from, it is possible to address the problem of being able to provide clearance and thickness for the mounting of a rivet, at an additional marginal weight "cost" or "penalty" which is only 5.3% above a non-suitable for riveting configuration, but otherwise lighter in weight.

Beyond specifying ranges, the value of shape efficiency factor could decrease significantly. For example assuming values of ($a_1^{op}>0.3$ and $a_2^{op}<1.0$), which would allow fitting of a rivet, and assuming next that $a_1^{op}=0.4$ and that thickness $\delta_b$ can't prove too thin, it is assumed that $a_2^{op}=0.5$, corresponding value $\Sigma=0.425$, therefore weight of this variant profile will be more over 21.4% (comparing variant with theoretical value $\Sigma_{max}=0.538$).

Taking this a step further, with $a_1^{op}>0.3$ and $a_2^{op}>3.0$), again so a rivet could fit, and assuming that $a_1^{op}=0.4$ and that the value flange thickness $\delta_c$ should be more than the value of the thickness panel skin, and if we assume $a_2^{op}=3.5$, we arrive at a resultant $\Sigma=0.367$. At this $\Sigma$, a substantial weight increase of over 31.8 percent is realized.

Feasible ratios values and corresponding shape efficiency factor values for a Z-shaped TPM as a function of a given set of constructive restrictions is presented in Table 1 below.

TABLE 1

| | $a_1^{op}$ | $a_2^{op}$ | $\Sigma$ | % |
|---|---|---|---|---|
| | ($\Sigma_{max}$ = 0.538) | | | |
| 1. | 0.30 | 2.0 | 0.515 | 4.30 |
| 2. | 0.30 | 1.0 | 0.500 | 5.30 |
| 3. | 0.31 | 0.7 | 0.490 | 8.90 |
| 4. | 0.31 | 3.3 | 0.480 | 10, 8 |
| 5. | 0.40 | 0.5 | 0.425 | 21, 4 |
| 6. | 0.40 | 3.5 | 0.367 | 31, 8 |

Table 2 has similar calculations as those in Table 1 but this time for an I-shaped TPM.

TABLE 2

| | $a_1^{op}$ | $a_2^{op}$ | $\Sigma$ | % |
|---|---|---|---|---|
| | ($\Sigma_{max}$ = 0.556) | | | |
| 1. | 0.15 | 2.0 | 0.538 | 6.30 |
| 2. | 0.20 | 1.0 | 0.513 | 7.73 |
| 3. | 0.31 | 0.7 | 0.471 | 14, 9 |
| 4. | 0.31 | 3.3 | 0.412 | 25.9 |
| 5. | 0.40 | 0.5 | 0.415 | 25.4 |
| 6. | 0.40 | 3.3 | 0.379 | 31.8 |

As can be seen from the above tables, it is established that the proposed algorithmic process, coupled with suitable computing means and user selectable interfaces, it is possible to arrive at feasible ratio values that satisfy known constructive restrictions with optimum weight configuration.

Referring again back to Table 2, it is shown that the shape efficiency factor values and corresponding ratio values play a critical role in arriving at a TPM design that is weight optimized (as in items 1, 2 in Tables 1 and 2), near weight optimized (items 3, 4 in Table 1 only), and non-weight optimized (items 5, 6 in Table 1 and items 3-6 in Table 2).

It can be seen that the shape efficiency factor values of $\Sigma_5$ and of $\Sigma_6$ based on the ratios values in Variants 5 and 6, respectively, and which are significantly outside the ranges for the Z shape and the I shape TPMs, are significantly less than the theoretical maximum value $\Sigma_{max}$ for each shape.

It can be further seen from the shape efficiency factor values of $\Sigma_1$, $\Sigma_2$ based on the ratios values in Variants 1, 2, respectively, and which are within the ranges for the Z shape and the I shape TPMs, that the shape efficiency factor values are not significantly less than the theoretical maximum value $\Sigma_{max}$ for a given shape.

It is to be understood that each TPM shape is implicitly associated with a shape efficiency factor with a theoretical maximum value. For various TPM shapes, these theoretical maximum values fall inside specified ranges. Inside the ranges, for each TPM shape, the value of the shape efficiency factor has insignificant deviation from its theoretical maximum value and thus insignificant deviation from its theoretical minimum weight value. Outside the ranges, the values of the shape efficiency factor decrease significantly from the theoretical maximum values, as a consequence of which structural weight increases significantly. In all other regards, techniques for setting the ratios themselves to feasible and workable dimensions and which comply with a given set of constructive restrictions is known and beyond the scope of this invention.

In accordance with a further embodiment of the invention, various shapes of TPM can be compared in weight: the greater the maximum value of the shape efficiency factor $\Sigma$ for a particular shape, the less is the TPM weight. For selecting the most efficient TPM shape with minimum weight, for each TPM of a given shape a plurality of maximum shape efficiency factors values $\Sigma_{max}1, \Sigma_{max}2 \ldots \Sigma_{max}N$ are determined, an overall maximum shape efficiency factor value $\Sigma_{0max}$ is determined and the TPM of the shape having the overall maximum shape efficiency factor value $\Sigma_{0max}$ is produced by known methods.

The proposed method of producing minimum weight transversal and longitudinal reinforcing panels IV and V with respect to constructive restrictions comprising the steps similar to method of producing a minimum weight TPM and including expressions (1)-(9).

1. TPM Analysis 1.1 Detailed Computational Analysis—TPM Selection Analysis Scheme For explanation purposes, an analysis scheme for a representative thin wall profile member has been selected that is very close to the existing efficient calculation method. For a TPM, such a method is the theory of stability of compressed strips forming the TPM (with regard to their operation within supercritical range in respect of stability). The selected analysis scheme predetermines the character and sequence of destruction of a compressed TPM.

A TPM is considered as a solid-walled structural member consisting of plates (strips). Therefore it is possible that prior to the loss of the stability of the TPM as a whole (overall stability loss), the strips forming the TPM would have suffered (local) buckling (which is characterized by warp of the cross-section, linearity and position of common longitudinal ribs of the strips being maintained). This may result in destruction of the entire compressed TPM.

Geometrical irregularities (initial eccentricity of load application and bends) reduce critical stresses and, consequently, reduce the load-carrying capacity of the TPM. Calculations errors (of loads, stresses, deformations) and adopted assumptions of the selected analysis scheme are refined later in compliance with the Design Standards.

Optimization Model

What follows is a more detailed discussion of the operational flow described in FIG. 16.

As already explained, the drawback common to all known calculation methods of optimization is lack of a unified practical calculation method for multiple-parameter problems. In the thin wall systems optimum design theory, only those inverse problems of structural mechanics have been examined that are the simplest in their mathematical description with only few simultaneously varied parameters.

To reduce the number of simultaneously varied parameters, the proposed model uses the following design approaches: 1) proceeding from simple design schemes to more complicated ones basing on analysis of various forms of stability loss of the structure; 2) introduction of generalizing coefficients (shape efficiency factor et al.); 3) employment of equal stability principle; 4) introduction of constructive restrictions.

The suggested model using these design approaches enables analytical representation of the dimensions of cross-section (shape dimensions) of compressed TPM having the minimum weight.

The compressed TPM is considered as a "simple column" possessing high torsional rigidity. As a rule, in the TPM-based structures their high torsional rigidity is provided for. There are two kinds of stability loss—local and overall ones. Used to solve the problem is equating design and critical stresses for both kinds of stability loss. Initially, applying the conditions of G. Cohen's theorem, it is proved that the equations used ensure the minimum weight of a compressed TPM (GA. Cohen, "Optimum Design of Truss-Core Sandwich Cylinder Under Axial Compression", Aeronutronic Division, Ford Motor Company, Newport Beach; this work was performed in the 31$^{st}$ conference in NY in January 1963)

To equate the two kinds of stability loss as a criterion of the minimum weight, the following conditions formulated in Cohen's theorem are sufficient:

The effective thickness function $\tau_{ef}(x_i)$ shall be independent on one of the cross-section dimensions $x_i$, for example, $x_k$; $x_i$ are independent dimensions determining the cross-section, where i=1, 2 . . . n.

Therefore, $$\frac{\partial \overline{\tau}_{ef}}{\partial \overline{x}_k} = 0$$

where $\overline{\tau}_{ef} = t_{ef}/\overline{q}$, and $\overline{t}_{ef} = t_{ef}/l_{re}$, $\overline{q} = q/l_{re}$,
$t_{ef}$ being the effective thickness (area divided by unit length of cross-section).
Stresses $\sigma_{cr.1}(x_i)$ and $\sigma_{cr.tot}(x_i)$ shall be monotony decreasing with $x_k$.
Therefore, $$\frac{\partial \sigma_{cr.i}(x_i)}{\partial x_k} \neq 0; \quad \frac{\partial \sigma_{cr.tot}(x_i)}{\partial x_k} \neq 0.$$

Let us check applicability of Cohen's equation for a compressed TPM. For this, thickness function $\tau_{ef}(x_i)$ and critical stress functions $\sigma_{cr.l}(x_i)$ and $\sigma_{cr.tot}(x_i)$ should be expressed in terms of TPM shape dimensions $x_i$.

Let us introduce TPM dimensionless parameters $a_1, a_2 \ldots a_n$ as ratios of TPM shape dimensions to characteristic dimensions. Characteristic dimensions a, $\delta_a$ shall be defined as the dimensions of the main strip appearing in the formula of local stability critical stress.

Figure 18:
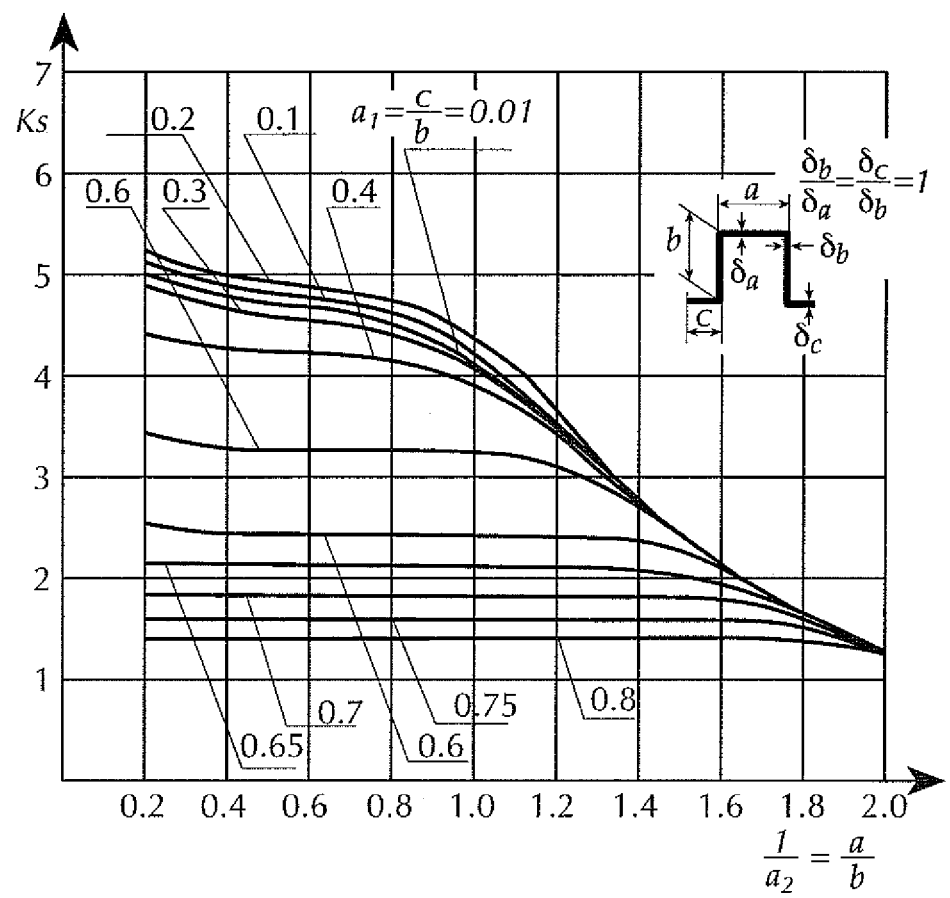
FIG. 18 is a plot showing factor Ks versus ratios of U-shaped TPM dimensions.

FIG. 18 is a plot showing factor $K_s$ versus ratios of U-shaped TPM dimensions.

Figure 19:
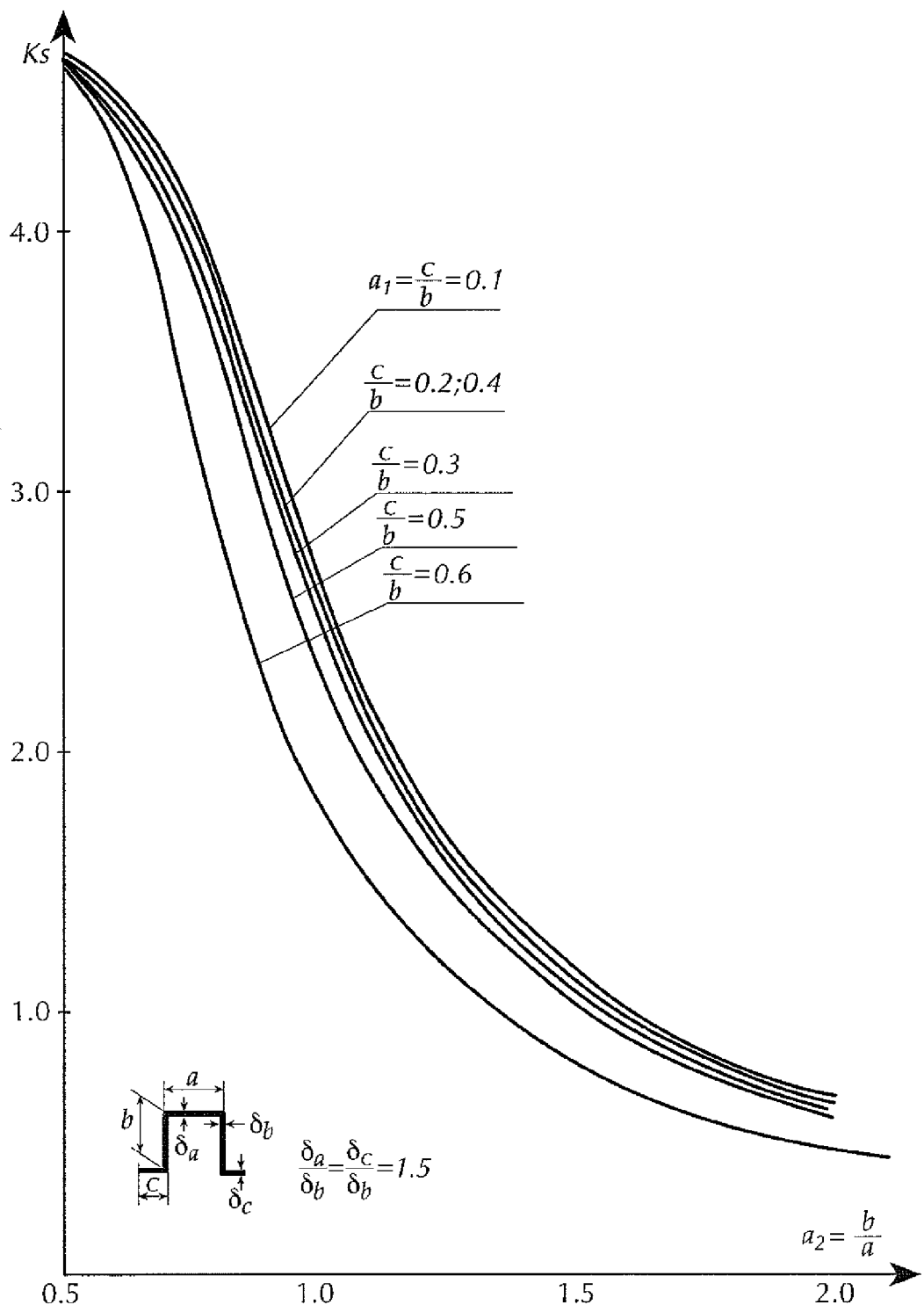
FIG. 19 is another plot showing factor Ks versus ratios of U-shaped TPM dimensions.

FIG. 19 is another plot showing factor $K_s$ versus ratios of U-shaped TPM dimensions.

Figure 20:
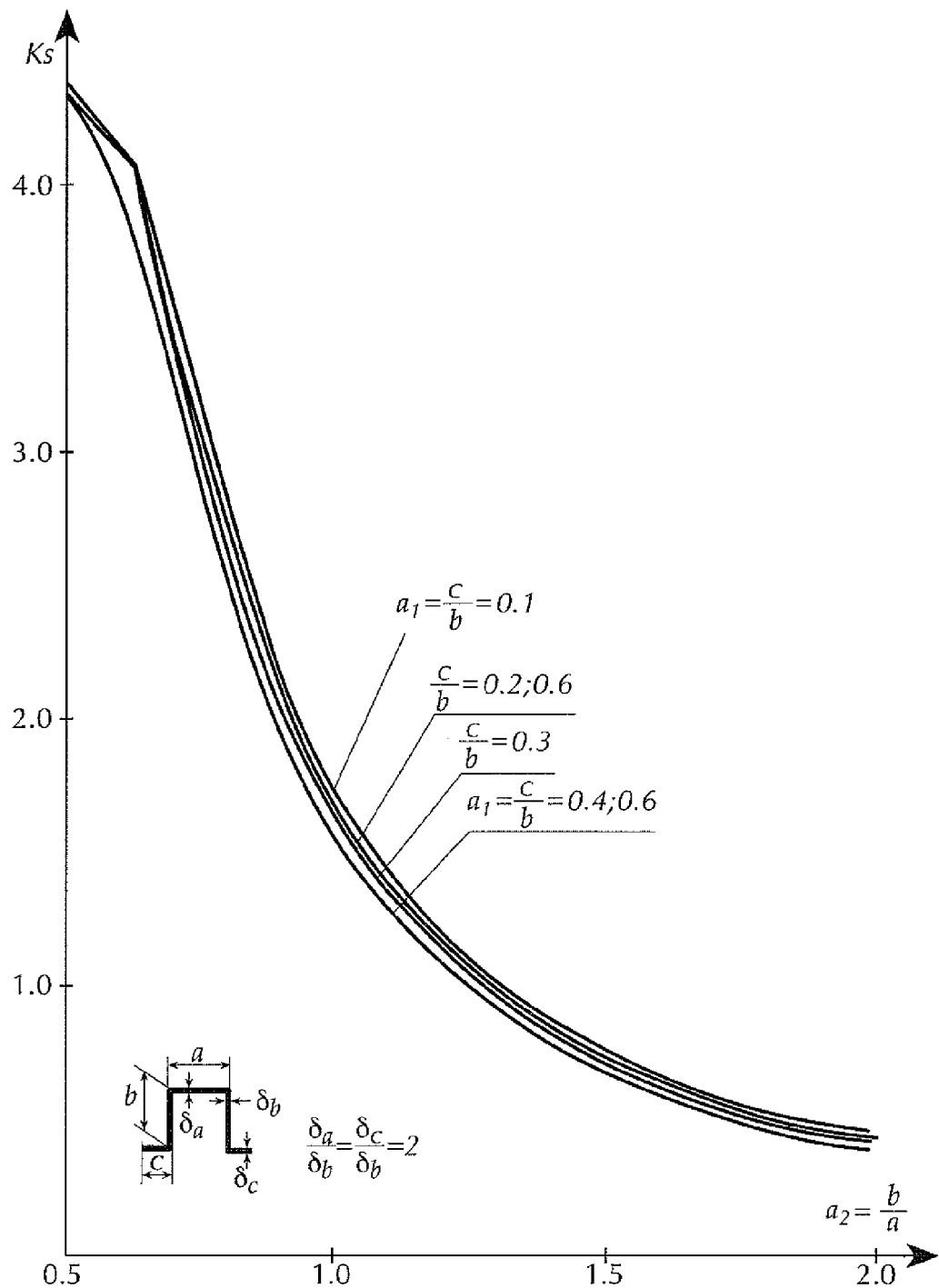
FIG. 20 is yet another plot showing factor Ks versus ratios of U-shaped TPM dimensions.

FIG. 20 is yet another plot showing factor $K_s$ versus ratios of U-shaped TPM dimensions.

Figure 21:
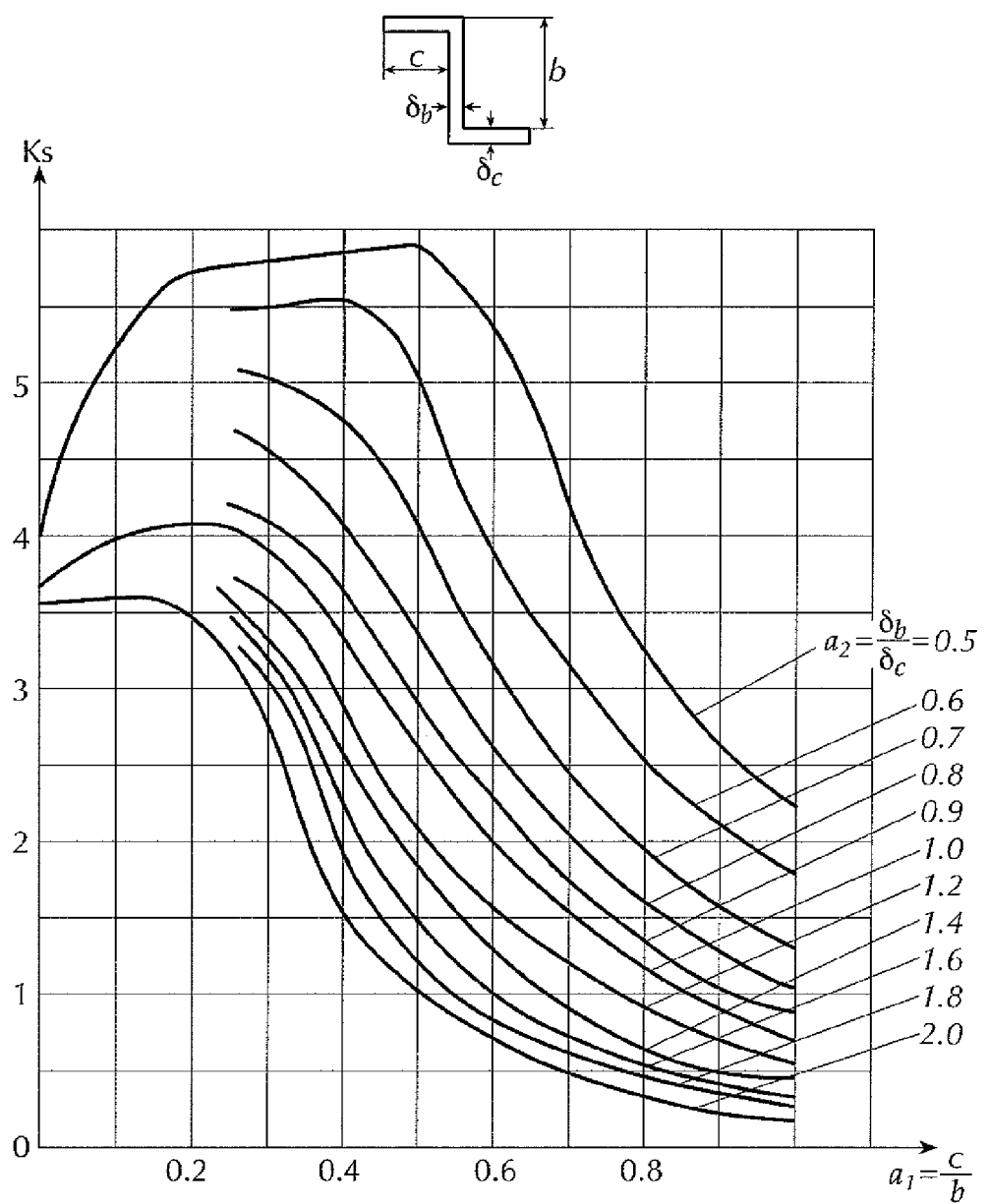
FIG. 21 is a plot showing factor Ks versus ratios of Z-shaped TPM dimensions.

FIG. 21 is a plot showing factor $K_s$ versus ratios of Z-shaped TPM dimensions.

Figure 22:
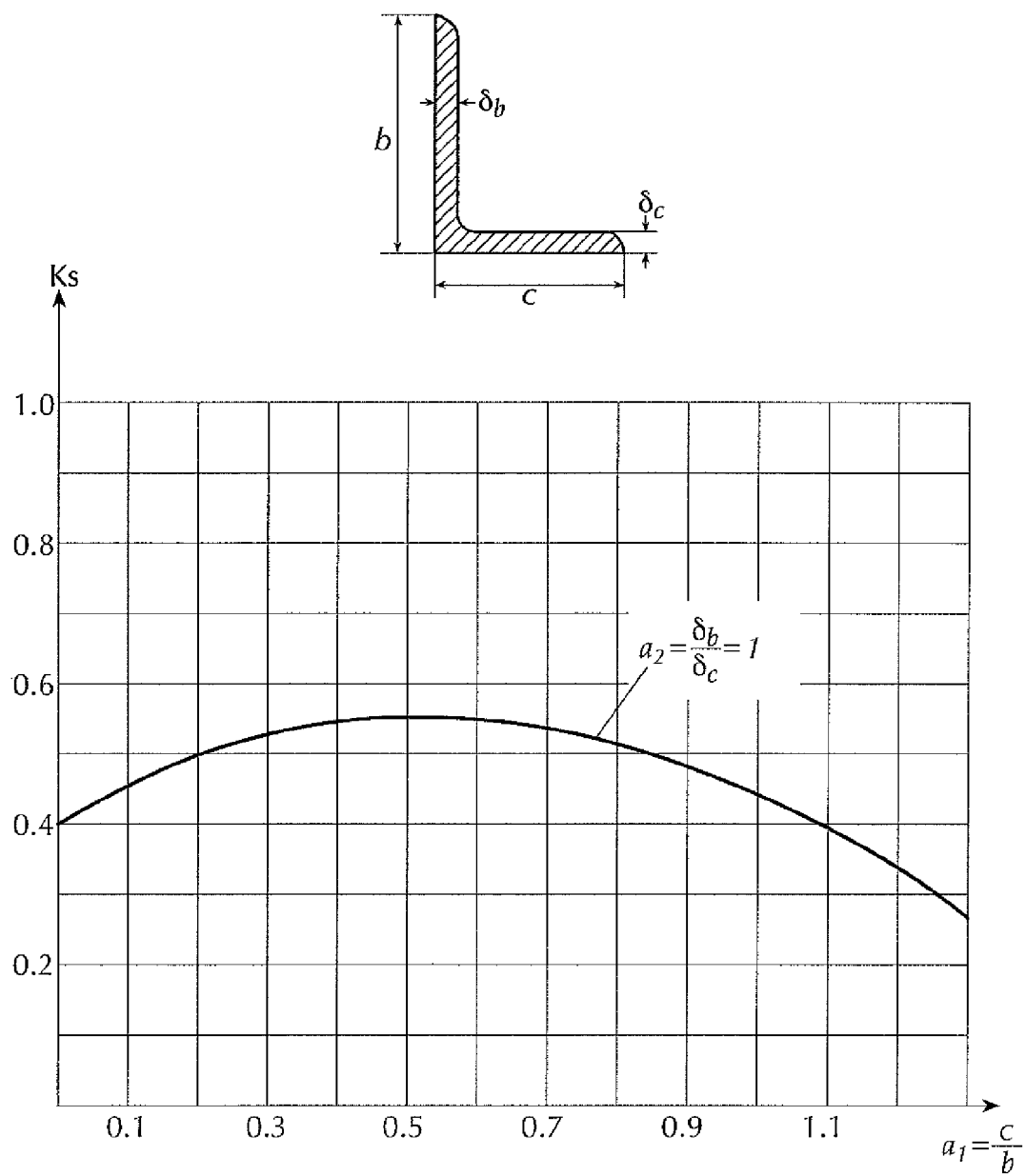
FIG. 22 is a plot showing factor Ks versus ratios of L-shaped TPM dimensions.

FIG. 22 is a plot showing factor $K_s$ versus ratios of L-shaped TPM dimensions.

Figure 23:
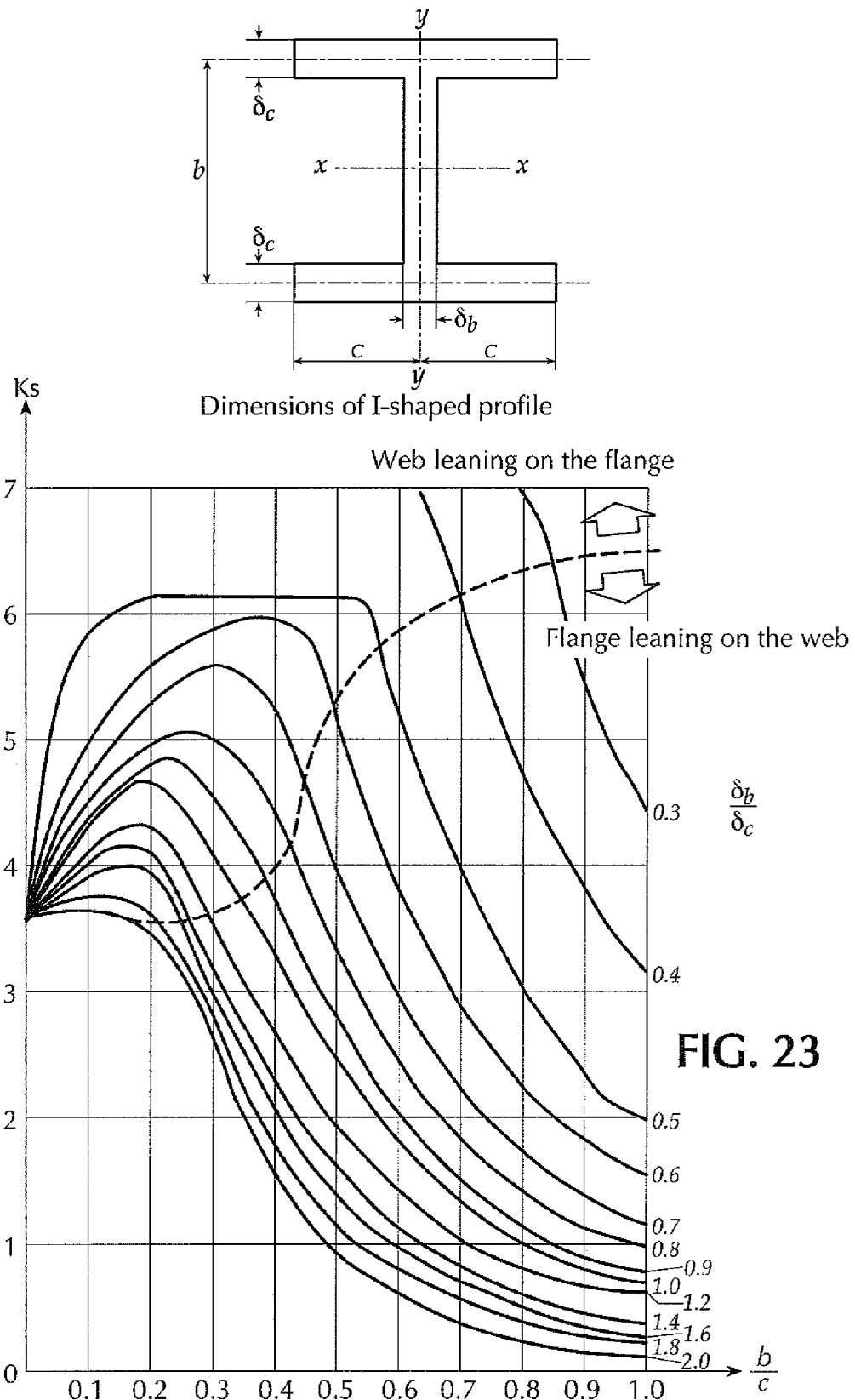
FIG. 23 is a plot showing factor Ks versus ratios of I-shaped TPM dimensions.

FIG. 23 is a plot showing factor $K_s$ versus ratios of I-shaped TPM.

Let us express geometric characteristics of the profile in the dimensionless form through characteristic dimensions and dimensionless parameters:

$$\overline{F}_s = \overline{a} \cdot \overline{\delta}_a \cdot f_1(a_1, a_2 \ldots, a_n) \tag{1.1.1}$$

$$\overline{J}_s = \overline{a}^3 \cdot \overline{\delta}_a \cdot f_2(a_1, a_2 \ldots, a_n) \tag{1.1.2}$$

$$\overline{P}_s = \overline{a}^2 \cdot f_3(a_1, a_2 \ldots, a_n) \tag{1.1.3}$$

where $$\overline{F}_s = \frac{F_s}{l_{re}^2}; \overline{J}_s = \frac{J_s}{l_{re}^4}; \overline{i} = \frac{i_s}{l_{re}}; \overline{a} = \frac{a}{l_{re}}; \overline{\delta}_a = \frac{\delta_a}{l_{re}},$$

$f_1(a_1, a_2, \ldots a_n), f_2(a_1, a_2, \ldots a_n), f_3(a_1, a_2, \ldots a_n)$ are functions of dimensionless parameters of the TPM shape.
Then: the effective thickness $$\overline{t}_{ef} = \frac{\overline{F}_s}{\overline{a}} = \overline{\delta}_a \cdot f_1(a_1, a_2 \ldots, a_n), \tag{1.1.4}$$

the effective thickness function:

$$\overline{\tau}_{ef} = \frac{\overline{\delta}_a \cdot f_1(a_1, a_2 \ldots, a_n)}{\overline{q}_c}, \tag{1.1.5}$$

the local stability critical stress $$\sigma_{cr.l} = \frac{K_s \cdot E}{(\overline{a}/\overline{\delta}_a)^2} \cdot \sqrt{\eta_\delta}, \tag{1.1.6}$$

$K_s$ is the local stability factor of TPM shape:
$K_s = K_S(a_1, a_2 \ldots, a_n)$, FIGS. 18-23:
the overall stability critical stress $$\sigma_{cr.tot} = \frac{\pi^2 \cdot E}{\lambda_s^2} \cdot \eta_\sigma = \pi^2 \cdot E \cdot \overline{a}^2 \cdot f_3(a_1, a_2, \ldots a_n) \cdot \eta_\sigma, \tag{1.1.7}$$

where $\lambda_s$ is TPM flexibility, $\lambda_s = l_{re}/i$

Assuming $x_k = a$ and writing the partial derivatives as $$\frac{\partial \overline{\tau}_{ef}}{\partial \overline{a}}$$

$$\frac{\partial \sigma_{cr.i}}{\partial \overline{a}}$$

and $$\frac{\partial \sigma_{cr.tot}}{\partial \overline{a}},$$

we see the Cohen's theorem conditions 1 and 2 are fulfilled. Therefore, equality of the critical stresses of local and overall stability for the TPM ensures its minimum weight.

1.2 Accounting for Material Properties at Elasticity Area (Derivation of Analytical Dependence for Elastic Ductility Factor)

To derive analytical formula for the elastic ductility (plasticity) factor for aluminum alloys, the following linear law of variation of stress $\sigma$ with flexibility $\lambda_s$ is assumed:

$$\sigma = \sigma_0 - \frac{\sigma_0 - \sigma_{pr}}{\lambda_s^*} \cdot \lambda_s, \tag{1.2.1}$$

where $\lambda_s^*$ is the limiting flexibility of TPM, $$\lambda_s^* = \pi \cdot \sqrt{\frac{E}{\sigma_{pr}}}.$$

On the other hand, TPM stress can be expressed in terms of flexibility by equation (1.1.7). Excluding flexibility $\lambda_s$ from equations (1.1.7) and (1.2.1), we obtain the ductility factor as follows:

$$\eta_\sigma = \frac{\sigma}{\sigma_{pr}} \cdot \left(\frac{\sigma_0 - \sigma}{\sigma_0 - \sigma_{pr}}\right)^2. \tag{1.2.2}$$

It follows from (1.2.2) that the ductility factor $\eta_\sigma$ depends on stress $\sigma$. To determine $\eta_\sigma$ usually the successive approximation method is used, which complicates the solution making the design process rather time consuming. To avoid usage of this method, let us present critical stress (1.1.6) and (1.1.7) in the following way:

$$\sigma_{cr.l} = \sigma_{cr.l(\eta_\sigma=1)} \cdot \sqrt{\eta_{\sigma.l}}, \tag{1.2.3}$$

$$\sigma_{cr.tot} = \sigma_{cr.tot(\eta_\sigma=1)} \cdot \eta_{\sigma.tot} \tag{1.2.4},$$

where: $\sigma_{cr.l(\eta_\sigma=1)}$ is local stability critical stress (1.1.7) determined at ductility factor equal to 1;
$\sigma_{cr.tot(\eta_\sigma=1)}$ is overall stability critical stress (1.1.6) determined at ductility factor equal to 1.

Solving (1.2.2) together with (1.2.3) and (1.2.4), respectively, and taking into account equations $\sigma_{cr.l} = \sigma_{cr.tot} = \sigma$, we obtain:

$$\eta_{cr.l} = \left\{ \frac{\left[ \sqrt{\sigma_{pr} \cdot (\sigma_0 - \sigma_{pr})^2 + 4 \cdot \sigma_{cr.l(\eta_\sigma=1)}^2 \cdot \sigma_0} - \sigma_{pr}^{1/2} \cdot (\sigma_0 - \sigma_{pr}) \right]^2}{4 \cdot \sigma_{cr.l(\eta_\sigma=1)}^3} \right\}^2, \quad (1.2.5)$$

$$\eta_{\sigma.tot} = \frac{\sigma_0}{\sigma_{cr.tot(\eta_\sigma=1)}} - \frac{\sigma_0 - \sigma_{pr}}{\sigma_{cr.tot(\eta_\sigma=1)}} \cdot \left( \frac{\sigma_{pr}}{\sigma_{cr.tot(\eta_\sigma=1)}} \right)^{1/2}. \quad (1.2.6)$$

The sequence of determination of local and total critical stresses for TPM is as follows. First, the critical stress is determined at ductility factor value equaling 1(one) $\sigma_{cr.l\,(\eta_\sigma=1)}$, $\sigma_{cr.tot(\eta_\sigma=1)}$. If the obtained values of critical stress are less than $\sigma_{pr}$, the calculation is considered completed; if the value is greater, then using equations (1.2.5) and (1.2.6) the elastic ductility factor is determined. After that, using equations (1.2.3) and (1.2.4) the sought-for value of critical stress is determined.

The similar sequence can be used to determine the analytical dependence for elastic ductility factors of other materials. For example, for steel alloys these dependencies take on the form:

$$\eta_{\sigma.l} = \frac{\sigma_{0,2} \cdot \sigma_{cr.l(\eta_\sigma=1)} - (\sigma_{0,2} - \sigma_{pr}) \cdot \sigma_{pr}}{\sigma_{cr.l(\eta_\sigma=1)}^2}, \quad (1.2.7)$$

$$\eta_{\sigma.tot} = \frac{\sigma_{0,2} \cdot \sigma_{cr.tot(\eta_\sigma=1)}}{(\sigma_{0,2} - \sigma_{pr}) \cdot \sigma_{pr} + \sigma_{cr.tot(\eta_\sigma=1)}}. \quad (1.2.8)$$

1.3 Procedure for Designing Optimum Compressive TPM

We shall, in the present example, use equations for critical and design values of stress in order to determine the optimum characteristic dimensions $\bar{a}$, $\bar{\delta}_a$, $$\sigma_c = \sigma_{cr.l} = \sigma_{cr.tot} \quad (1.3.1),$$

where the design stress $$\sigma_s = \frac{\overline{P}_s}{\overline{F}_s} = \frac{\overline{P}_s}{\bar{a} \cdot \bar{\delta}_a \cdot f_1(a_1, a_2, \dots a_n)}, \quad (1.3.2)$$

$$\overline{P}_s = \frac{P_s}{l_{re}^2}$$

is the TPM stress factor.

Substituting (1.1.6), (1.1.7) and (1.3.2) into equations (1.3.1) and solving them in respect to $\bar{a}$, $\bar{\delta}_a$, we obtain:

$$\bar{a} = \left( \frac{\overline{P}_s}{\pi \cdot \sigma_s} \right)^{1/3} \cdot \frac{A_1}{\eta_\sigma^{1/12}}, \quad (1.3.3)$$

$$\bar{\delta}_a = \left( \frac{\overline{P}_s^2 \cdot \pi}{\sigma_s^2} \right)^{1/3} \cdot \eta_\sigma^{1/12} \cdot A_2, \quad (1.3.4)$$

$A_1$, $A_2$ are functions of dimensionless parameters.

The functions of dimensionless parameters expressed through geometric characteristics of the shape and characteristic dimensions have the following general form:

$$A_1 = \left( \frac{K_s \cdot \bar{a}^4 \cdot \bar{\delta}_a^2}{\overline{F}_s \cdot \overline{J}_s} \right)^{1/6}, \quad (1.3.5)$$

$$A_2 = \left( \frac{\bar{a}^2 \cdot \bar{\delta}_a^4 \cdot \overline{J}_s}{K_s \cdot \overline{F}_s^5} \right)^{1/6}. \quad (1.3.6)$$

Substituting equations (1.3.3) and (1.3.4) into (1.1.6) and taking into account (1.3.2), we obtain the value of optimum stress $$\sigma_s = (E^3 \cdot \pi^4 \cdot \overline{P}_s^2)^{1/5} \cdot \sqrt[5]{\eta_\sigma} \cdot A \quad (1.3.7),$$

A is the shape efficiency factor, which is the function of dimensionless parameters $a_1, a_2, \dots, a_n$.

Here, the ductility factor $\eta_\sigma$ is obtained from the formula (1.2.5) by replacing $\sigma_{cr.l(\eta_\sigma=1)}$ with $\sigma_{s(\eta_\sigma=1)}$.

Expressing A through geometrical characteristics of TPM and characteristic dimensions, we obtain:

$$A = \left[ \left( \frac{\overline{J}_s}{\overline{F}_s} \right)^2 \cdot \frac{K_s}{(\bar{a}/\bar{\delta}_a)^2} \right]^{1/5}. \quad (1.3.8)$$

The dimensionless weight of TPM can be expressed as:

$$\overline{G}_s = \frac{\overline{P}_s}{\sigma_s}, \quad (1.3.9)$$

where $$\overline{G}_s = \frac{G_s}{l_{re}^2 \cdot l_s \cdot \gamma}.$$

As one can see from (1.3.9), the minimum weight is obtained at the maximum stress in TPM. It follows from (1.3.7) that the only way to increase $\sigma_s$ is to increase the shape efficiency factor A.

Let us consider the physical meaning of the shape efficiency factor. The ratio $$f_s = \frac{J_s}{F_s^2}$$

is called the TPM "shape factor". The more is the material "spaced" (that is, the higher is its distance from the neutral axis), the higher is its shape factor $f_s$. On the other hand, however, the value $$\frac{K_s}{(a/\delta_a)^2}$$

characterizing the TPM local stability is thereby reduced. As a result, the shape efficiency factor possesses a maximum.

Specifying a series of values $a_1, a_2 \ldots, a_n$, it is possible to determine the maximum value $A_{max}$ and optimum (in weight) values of dimensionless parameters $a_1^{op}, a_2^{op} \ldots, a_n^{op}$ corresponding to it. Substituting the maximum values of the shape efficiency factor $A_{max}$ into equation (1.3.7), we obtain the maximum stress, and using (1.3.9), the minimum weight.

Then, substituting the optimum values of dimensionless parameters $a_1^{op}, a_2^{op} \ldots, a_n^{op}$ and values $K_s^{op} = K_s^{op}(a_1^{op}, a_2^{op} \ldots, a_n^{op})$ corresponding to these into equations (1.3.3) and (1.3.4), we can find the optimum characteristic dimensions $a^{op}, \delta_a^{op}$. The other of TPM shape dimensions are essentially functions of characteristic dimensions $a^{op}, \delta_a^{op}$ and dimensionless parameters $a_1^{op}, a_2^{op} \ldots, a_n^{op}$.

Slight deviations of A with respect to $A_{max}$ (i.e. small deviations of weight with respect to $G_{min}$) could entail considerable difference in TPM shape absolute dimensions. This important conclusion can be employed to meet constructive restrictions as to the dimensions of the shape provided maximum material saving.

1.4 Determination of Optimum Parameters of
Compressive TPM of the Most Common Shapes In this section, we describe results of determination of parameters of U-, Z-, L-shape TPMs for two aluminum alloys D16-T and B-95 (Table 1.1 in FIG. 41), and some parameters I-shaped TPM for steel.

FIG. 41 is a table showing feasible dimensions of U-shaped TPM.

The results are presented in the form of plots of optimum parameters versus stress factor, which enables to easily find the optimum actual cross-section dimensions and minimum weight of TPM.

Figure 24:
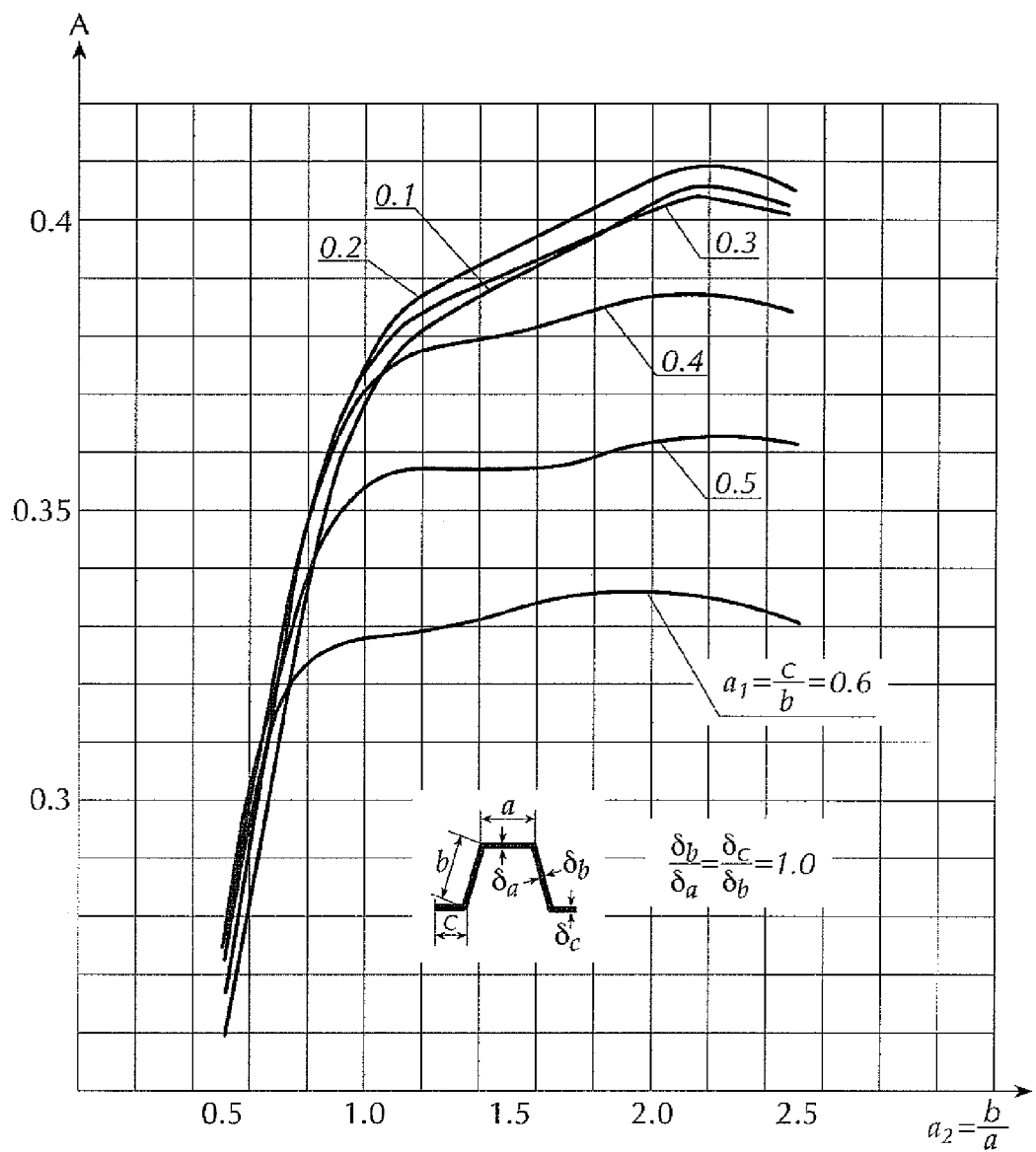
FIG. 24 is a plot of shape efficiency factor A versus ratios of U-shaped TPM dimensions.
Figure 25:
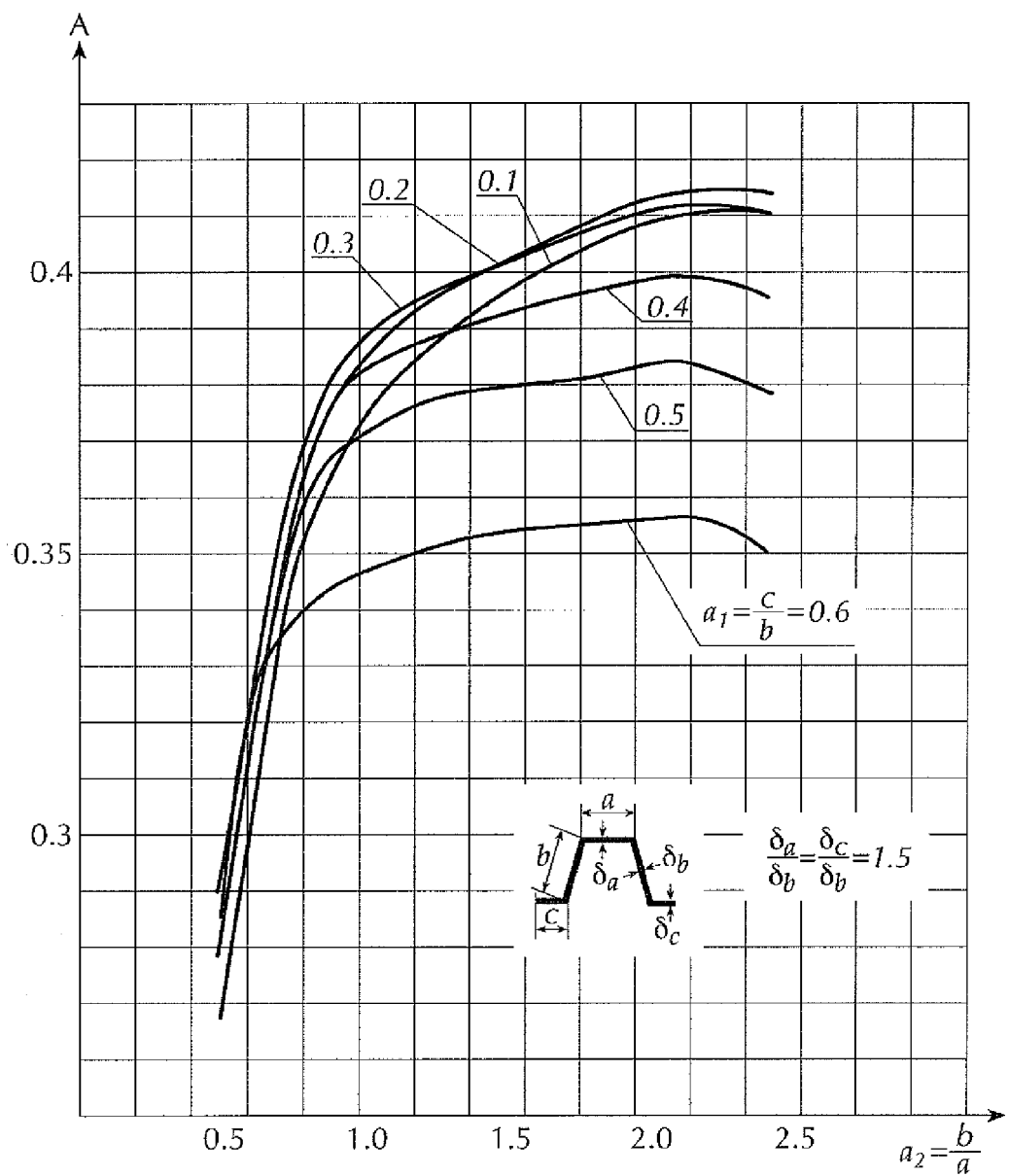
FIG. 25 is another plot showing shape efficiency factor A versus ratios of U-shaped TPM dimensions.
Figure 26:
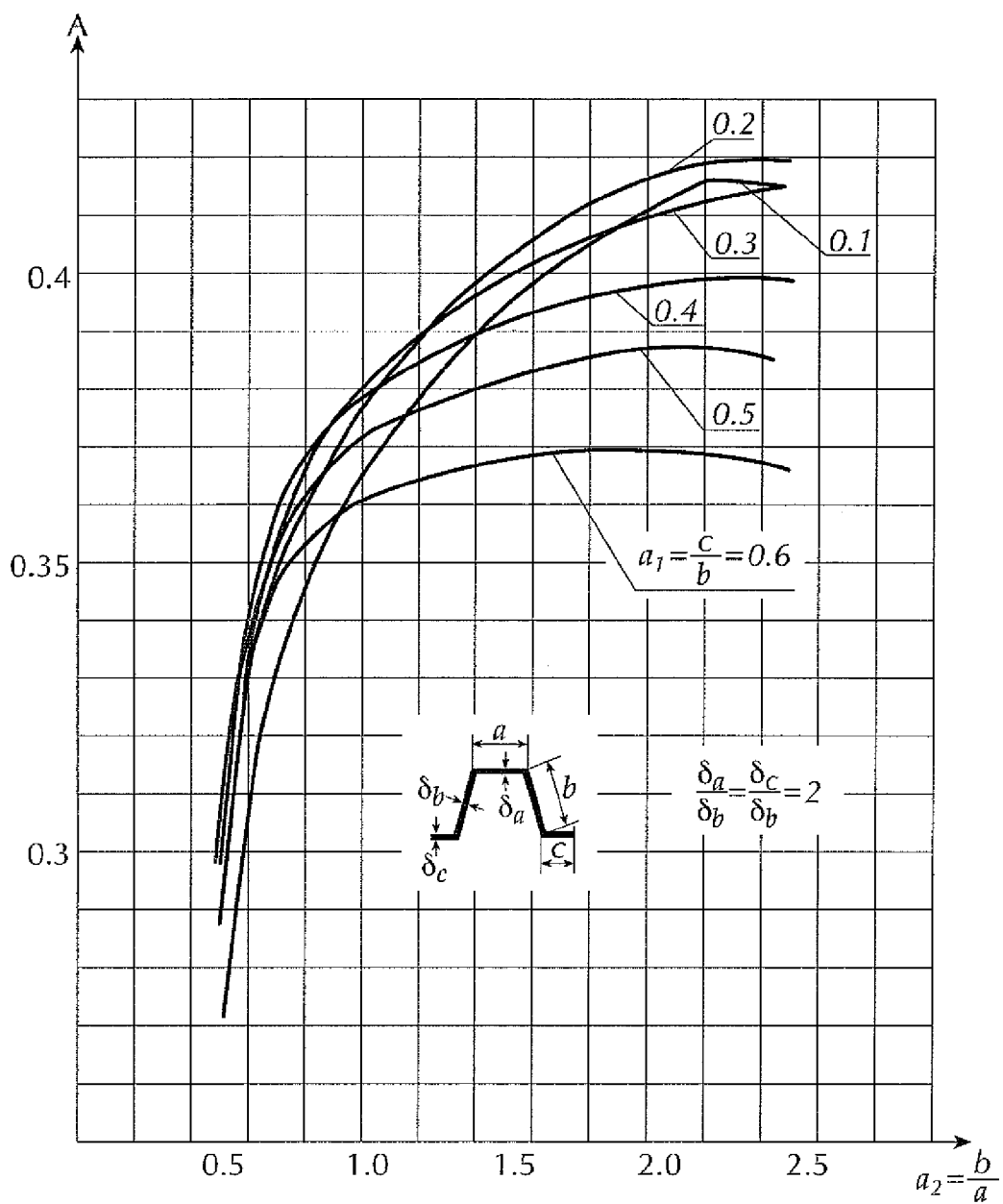
FIG. 26 is yet another plot showing shape efficiency factor A versus ratios of U-shaped TPM dimensions.

The results of calculation of the shape efficiency factor for the U-shaped TPM according to equation (1.3.8) are illustrated in the plots shown in FIGS. 24-26.

FIG. 24 is a plot showing shape efficiency factor A versus ratios of U-shaped TPM dimensions.

FIG. 25 is plot showing shape efficiency factor A versus ratios of U-shaped TPM dimensions.

FIG. 26 is yet plot showing shape efficiency factor A versus ratios of U-shaped TPM dimensions.

Figure 27:
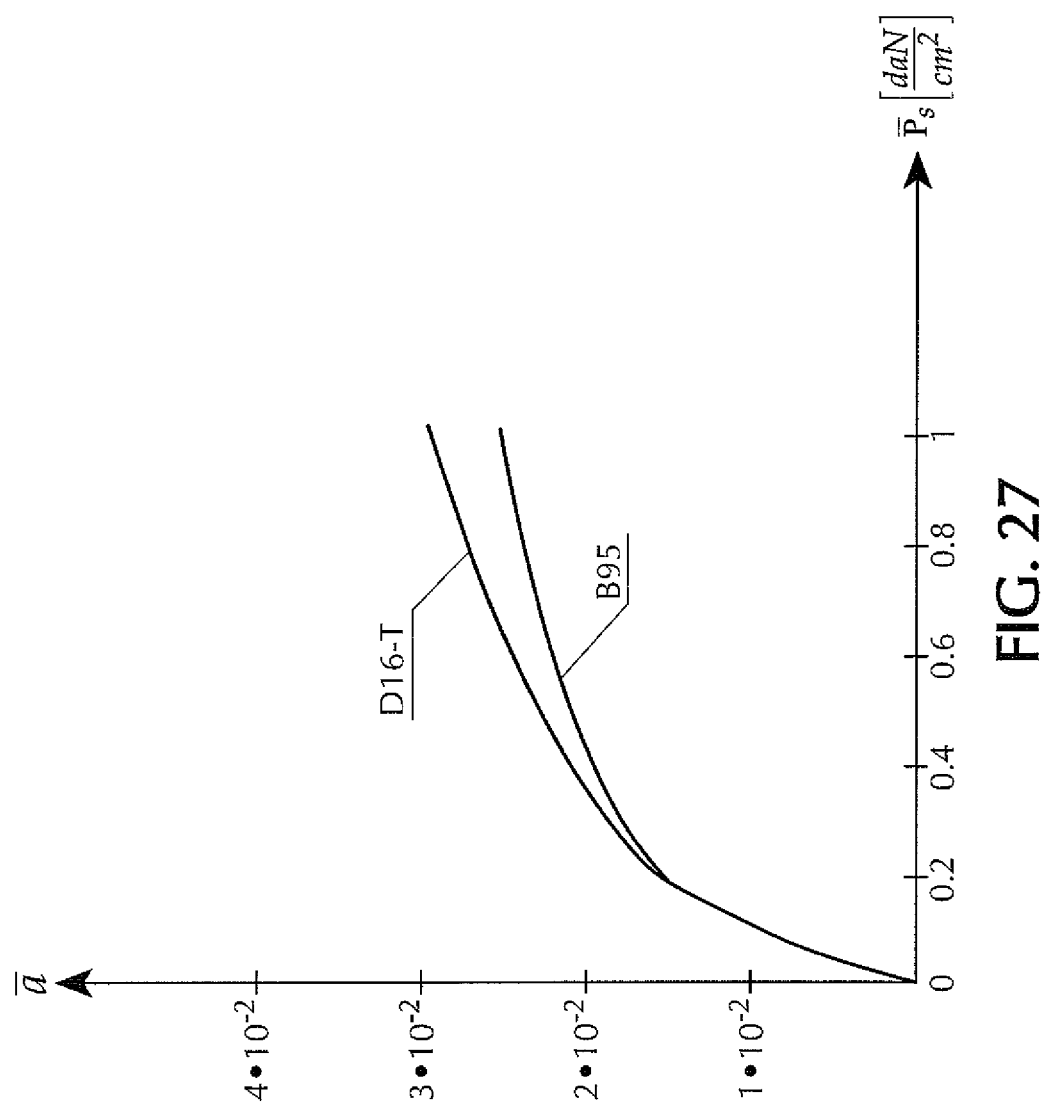
FIG. 27 is a plot showing scaled (dimensionless) characteristic dimension $$\overline{a} = \frac{a}{l_{re}}$$

FIG. 27 is a plot showing scaled (dimensionless) characteristic dimension $$\bar{a} = \frac{a}{l_{re}}$$

versus TPM stress factor $$\bar{P}_s = \frac{P_s}{l_{re}^2},$$

U-shaped TPM.

FIG. 28 is a plot showing scaled (dimensionless) characteristic dimension $$\bar{\delta}_a = \frac{\delta_a}{l_{re}}$$

versus TPM stress factor $$\bar{P}_s = \frac{P_s}{l_{re}^2},$$

U-shaped TPM.

FIG. 29 is a plot showing optimum stress $\sigma_s$ versus TPM stress factor $$\bar{P}_s = \frac{P_s}{l_{re}^2},$$

U-shaped TPM.

FIG. 30 is a plot showing dimensionless weight $$\bar{G}_s = \frac{G_s}{l_s \cdot l_{re}^2 \cdot \gamma}$$

versus TPM stress factor $$\bar{P}_s = \frac{P_s}{l_{re}^2},$$

U-shaped TPM.

To meet the constructive restrictions provided small variations of shape efficiency factor A (and hence, of TPM weight) as compared with its maximum value $A_{max}$, the TPM shape dimensions could be varied.

Feasible dimensions for U-shaped TPM taking into account certain constructive restrictions are presented in Table 1.1 (FIG. 41).

For TPM stress factors used in aviation $\bar{P}_s = (0.2-1)$ daN/cm², at an optimum value of $$a_1^{op} = \frac{c}{b} = 0.2,$$

the length of a flange c can be insufficient to mount a rivet (c<2 cm), so a feasible value of $a_1^{op} = 0.3$ is selected. Provided optimum relationship between thickness values $$a_3^{op} = \frac{1}{a_4^{op}} = \frac{\delta_c}{\delta_b} = \frac{\delta_a}{\delta_b} = 2,$$

thickness $\delta_b$ can prove too low value (less than 1 mm), which makes it difficult to manufacture such a profile in mass scale production. The most suitable for production is a constant thickness profile with $$a_3 = \frac{1}{a_4^{op}} = \frac{\delta_c}{\delta_b} = \frac{\delta_a}{\delta_b} = 1,$$

(profile No. 1, Table 1.1), but at some stress factors value the flange thickness value $\delta_c$ may be less of the skin thickness value, which is not recommended. Therefore, profile No. 2 is selected as the most feasible one.

At low values of the TPM stress factor, the thickness of the U-shaped TPM webs can to be very low value and technologically not feasible. If this is the case, Z-shaped and L-shaped profiles with the configuration open with the skin sheet should be selected.

Let us consider Z-shaped TPM with four variable dimensions b, $\delta_b$, c, $\delta_c$.

FIG. 31 is a plot showing shape efficiency factor A versus ratios of Z-shaped TPM dimensions.

The plot of shape efficiency factor A for various values of $a_1$, $a_2$ are presented in FIG. 31.

Respecting constructive restrictions, for example, so that a rivet could fit, it is assumed that $a_1^{op}$=0.3. With this, the maximum value $A_{max}$=0.515; $a_2^{op}$=2. Then the factor $K_s^{op}$=5.8 (FIG. 31).

The calculation results are presented in plots shown in FIGS. 32 to 35.

FIG. 32 is a plot showing scaled (dimensionless) characteristic dimension $$\bar{b} = \frac{b}{l_{re}}$$

versus TPM stress factor $$\bar{P}_s = \frac{P_s}{l_{re}^2},$$

Z-shaped TPM.

FIG. 33 is a plot showing scaled (dimensionless) characteristic dimension $$\bar{\delta}_b = \frac{\delta_b}{l_{re}}$$

versus TPM stress factor $$\bar{P}_s = \frac{P_s}{l_{re}^2},$$

Z-shaped TPM.

FIG. 34 is a plot showing optimum stress $\sigma_s$ versus TPM stress factor $$\bar{P}_s = \frac{P_s}{l_{re}^2},$$

Z-shaped TPM.

FIG. 35 is a plot showing dimensionless weight $$\bar{G}_s = \frac{G_s}{l_s \cdot l_{re}^2 \cdot \gamma}$$

versus TPM stress factor $$\bar{P}_s = \frac{P_s}{l_{re}^2},$$

Z-shaped TPM.

FIG. 36 is a plot showing shape efficiency factor A versus ratio of L-shaped TPM dimensions.

The plot for the shape efficiency factor for L-shaped TPM is presented in FIG. 36. Basing on design reasons, namely, rivets mounting conditions, it is assumed that: $a_1^{op}$=0.3. With this, the maximum value $A_{max}$=0.328; $a_2^{op}$=1. Then the factor $K_s^{op}$=0.55 (FIG. 22).

Further, calculated are the factors $A_1^{op}$=1.2; $A_2^{op}$=0.641. Using equations (1.3.7), (1.3.3), (1.3.4) and (1.3.9), we can determine the optimum stress, characteristic dimensions and minimum weight.

FIG. 37 is a plot showing scaled (dimensionless) characteristic dimension $$\bar{b} = \frac{b}{l_{re}}$$

versus TPM stress factor $$\bar{P}_s = \frac{P_s}{l_{re}^2},$$

L-shaped TPM.

FIG. 38 is a plot showing scaled (dimensionless) characteristic dimension $$\bar{\delta}_b = \frac{\delta_b}{l_{re}}$$

versus TPM stress factor $$\bar{P}_s = \frac{P_s}{l_{re}^2},$$

L-shaped TPM.

FIG. 39 is a plot showing optimum stress as versus TPM stress factor $$\bar{P}_s = \frac{P_s}{l_{re}^2},$$

L-shaped TPM.

FIG. 40 is a plot showing dimensionless weight $$\overline{G}_s = \frac{G_s}{l_s \cdot l_{re}^2 \cdot \gamma}$$

versus TPM stress factor $$\overline{P}_s = \frac{P_s}{l_{re}^2},$$

L-shaped TPM.

The similar procedure is used to determine the optimum parameters of TPM of I shape.

The values of the factor $K_s$ are presented in FIG. 23.

2. TPM-Panel Analysis

Detailed Computational Analysis: TPM-Panel Selection 2.1 Analysis Scheme—Stringer Panel with Buckling Skin For explanation purposes, an analysis scheme for a representative stringer panel with buckling skin is presented.

Panel design comes down to finding of six dimension of its cross-section b, $\delta_b$, c, $\delta_c$, $b_s$, $\delta$ given the linear compressive force $q_p$, overall dimensions B, l and panel material.

FIG. 42 shows a panel with Z-shaped TPM.

Selection of the panel cross-section dimensions allows for infinite number of solution variants. Out of these, the one is selected meeting the minimum weight panel condition.

TPM shape dimensions b, $\delta_b$, c, $\delta_c$ are determined according to equations (1.3.3), (1.3.4), given the force $P_s$ per one stringer. The unknown variables in this case would be pitch of TPM installation $b_s$, skin thickness $\delta$ and force $P_s$ per one stringer.

The panel weight $G_{s,p}$ is determined by the sum of weight of TPM (stringers) $G_s$ and the weight of the skin $G_{sk}$ according to the equation:

$$G_{s.p.} = G_s + G_{sk} = \left(\frac{P_s}{\sigma_s \cdot b_s} + \delta\right) \cdot l_s \cdot B \cdot \gamma. \quad (2.1.1)$$

Let us express the panel weight (2.1.1) in the dimensionless form:

$$\overline{G}_{s.p.} = \frac{\overline{P}_s}{\sigma_s \cdot \overline{b}_s} + \overline{\delta}, \quad (2.1.2)$$

where $$\overline{G}_{s.p.} = \frac{G_{s.p.}}{l_s \cdot l_{re} \cdot B \cdot \gamma}, \overline{\delta} = \frac{\delta}{l_{re}}, \overline{b}_s = \frac{b_s}{l_{re}}.$$

The force per one stringer is related to the panel parameters by the expression:

$$P_s = q_p \cdot b_s \cdot \delta \cdot b_s \cdot \sigma_{av} \quad (2.1.3),$$

$\sigma_{av}$ being the average stress in the skin between TPM.

Rewriting (2.1.3) in the dimensionless form, we obtain the TPM stress factor as:

$$\overline{P}_s = \overline{b}_s \cdot (\overline{q}_p - \overline{\delta} \cdot \sigma_{av}) \quad (2.1.4)$$

$\overline{q}_p$ is the panel stress factor:

$$\overline{q}_p = \frac{q_p}{l_{re}}$$

The value $\sigma_{av}$ is determined according to the formula:

$$\sigma_{av} = \sqrt{\sigma_s \cdot \sigma_{cr.sk}} \quad (2.1.5),$$

where $$\sigma_{cr.sk.} = \frac{K_p \cdot E}{(b_s/\delta)^2}, \quad (2.1.6)$$

Here, the factor $K_p = 3.6$ for pivoted leaning of the skin.

Let us eliminate from the expression (2.1.4) the average skin stress $\sigma_{av}$. For this purpose, substitute (2.1.5) into (2.1.4), taking into consideration (2.1.6); we get $$\overline{P}_s = \overline{q}_p \cdot \overline{b}_s - \overline{\delta}^2 \cdot \sqrt{K_p \cdot E \cdot \sigma_s} \quad (2.13).$$

The stress in the compressed isolated TPM $\sigma_s$ is related to the stress factor $\overline{P}_s$ by the expression (1.3.7). Equation (1.3.7) enables to consider as a sought-for parameter the stringer stress $\sigma_s$ rather than the stress factor $\overline{P}_s$.

Substituting (2.1.7) into (1.3.7), we get the constraint equation for the three sought-for parameters $\sigma_s$, $\overline{b}_s$, $\overline{\delta}$:

$$\sigma_s = [E^3 \cdot \pi^4 \cdot (\overline{q}_p \cdot \overline{b}_s - \overline{\delta}^2 \cdot \sqrt{K_p \cdot E \cdot \sigma_s})^2]^{1/5} \cdot \sqrt{\eta_\sigma} \cdot A \quad (2.1.8).$$

The obtained equation can be rewritten in the form (1.2.3):

$$\sigma_s = \sigma_{s(\eta_\sigma=1)} \cdot \sqrt{\eta_\sigma},$$

then the ductility factor $\eta_\sigma$ can be obtained from the equation (1.2.5), replacing therein $\eta_{\sigma.l}$ with $\eta_\sigma$ and $\sigma_{cr.l(\eta_\sigma=1)}$ with $\sigma_{s(\eta_\sigma=1)}$.

Equation (2.1.8) cannot be solved with respect to $\sigma_s$. Given the values $\overline{b}_s$ and $\overline{\delta}$ from (2.1.8), one can numerically determine the value of $\sigma_s$ and then calculate $\overline{P}_s$ through (1.3.7). Substituting values of $\sigma_s$ and $\overline{P}_s$ into (2.1.1), we obtain the panel weight.

Numerical solution of (2.1.8) with respect to $\sigma_s$ is rather complicated and does not enable to obtain an analytical expression for the weight. The analytical expression for the panel weight as a function of two parameters $\sigma_s$ and $\overline{\delta}$ could be obtained as follows.

Solving (2.1.8) with respect to $\overline{b}_s$, we get:

$$\overline{b}_s = \frac{1}{\overline{q}_p} \cdot \left[\sqrt{\left(\frac{\sigma_s}{\sqrt{\eta_\sigma} \cdot A}\right)^5 \cdot \frac{1}{E^3 \cdot \pi^4}} + \overline{\delta}^2 \cdot \sqrt{K_p \cdot E \cdot \sigma_s}\right]. \quad (2.1.9)$$

From (1.3.7) we get the TPM stress factor:

$$\overline{P}_s = \sqrt{\left(\frac{\sigma_s}{\sqrt{\eta_\sigma} \cdot A}\right)^5 \cdot \frac{1}{E^3 \cdot \pi^4}}. \quad (2.1.10)$$

Substituting (2.1.9) and (2.1.10) into (2.1.2), we get the analytical expression for the dimensionless panel weight as a function of $\sigma_s$ and $\overline{\delta}$ in the following form:

$$\overline{G}_{s.p.} = \frac{\overline{q}_p \cdot \sigma_s}{(\pi \cdot E)^2 \cdot \overline{\delta}^2 \cdot K_p^{\frac{1}{2}} \cdot (\sqrt{\eta_\sigma} \cdot A)^{\frac{5}{2}} + \sigma_s^2} + \overline{\delta}. \qquad (2.1.11)$$

The ductility factor $\eta_\sigma$ in (2.1.11) for $\sigma_s > \sigma_{pr}$ is determined from the equation (1.2.5) replacing therein $\sigma_{cr.l(\eta_\sigma=1)}$ with $\sigma_{s(\eta_\sigma=1)}$.

FIG. 43 is a graph showing dimensionless panel weight $$\overline{G}_s = \frac{G_s}{l_s \cdot l_{re}^2 \cdot \gamma}$$

versus TPM stress $\sigma_s$, U-shaped TPM.

Some of the results of calculations according to (2.1.11) are presented in FIG. 43.

The TPM shape efficiency factor used, A is that for the Z-shaped profile, A=0.515. The value of the shape efficiency factor varies insignificantly with changing of the TPM shape and does not affect considerably the results of calculations according to (2.1.11).

As these calculations demonstrate, with the dimensionless skin thickness values typical for aircraft industry, $\overline{\delta}=0.001$-$0.005$, the minimum panel weight is obtained for the minimum TPM stress $\sigma_s$.

Proceeding from the stress to the design panel cross-section dimensions, we see that with reducing $\sigma_s$, the distance between TPMs (pitch of stringer longitudinal installation) (2.1.9) is also less, and the dimensions of the TPM shape are also reduced, due to reduction of the TPM shape factor (2.1.10). Therefore, to reduce the panel weight one should seek to increase the number of TPMs (reduction of the pitch of stringer longitudinal installation) and reduce the TPM shape cross-section dimensions.

The lower limit value for the pitch of longitudinal installation of TPM is determined by the value of the critical skin stress $\sigma_{cr.sk}$ (2.1.6). The critical stress in the skin cannot exceed the critical stress in the TPM. Therefore, the optimum panel weight is achieved provided equality of critical stresses of skin and TPM, that is, ruling out skin buckling.

The lower limit value for reducing TPM shape dimensions is determined by the minimum TPM shape moment of inertia, providing for the wavelength (in stability loss) in the panel width equal to or less than the distance between the rivet joint of TPM fastening to the skin. Reduction of TPM shape dimensions is evidently restricted also by the constructive restrictions to TPM.

2.2 Design Procedure for Stringer

Panel of Theoretical Minimum Weight

It has been proved in 2.1 that the stringer panel reaches the minimum in weight provided equality of critical stress for skin and stringer, viz. if:

$$\sigma_{cr.sk} = \sigma_s = \sigma \qquad (2.2.1).$$

Taking (2.2.1) into account, the dimensionless width of the skin between the rivet joints of TPM fastening (for the open-configuration TPM equal to its dimensionless pitch of longitudinal installation) shall be written as (2.1.6):

$$\overline{b}_{sk} = \overline{b}_s = \overline{\delta} \cdot \sqrt{\frac{K_p \cdot E}{\sigma}}. \qquad (2.2.2)$$

The dimensions of the panel cross-section have been shown in 2.1 to be functions of three parameters $\sigma_s$, $\overline{b}_s$ and $\overline{\delta}$. Let us determine these parameters using the derived equations (2.2.1) and (2.2.2).

The TPM stress factor (2.1.4) taking into account (2.2.1) shall be written as:

$$\overline{P}_s = \overline{b}_s \cdot (\overline{q}_p - \overline{\delta} \cdot \sigma) \qquad (2.2.3).$$

Taking into consideration (2.2.3), the expression for the panel weight takes on the form:

$$\overline{G}_{s.p.} = \frac{\overline{q}_p}{\sigma}. \qquad (2.2.4)$$

Expression (2.2.4) implies that for a panel with the non-buckling skin, the minimum weight is reached at the maximum panel stress.

For the maximum stress, the yield stress for the panel material is adopted:

$$\sigma = \sigma_{0.2} \qquad (2.2.5).$$

Henceforth, one of the sought-for parameters, the panel stress $\sigma$, has been determined.

Given the panel stress $\sigma$, one can determine the TPM shape dimensions. To this end, we shall find the TPM stress factor (2.1.10) taking into account (2.2.5) and (2.2.1):

$$\overline{P}_s = \sqrt{\left(\frac{\sigma_{0,2}}{\sqrt{\eta_\sigma} \cdot A}\right)^5 \cdot \frac{1}{E^3 \cdot \pi^4}}. \qquad (2.2.6)$$

It follows from (2.2.6) that given the material and the shape efficiency factor A, the TPM stress factor $\overline{P}_s$, is a constant.

The optimum characteristic dimensions of the shape, taking into account (2.2.6), shall be determined from equations (1.3.3) and (1.3.4). The characteristic dimensions of the TPM shape are constant values, while absolute dimensions depend linearly from the panel length (1.1.1)-(1.1.3).

The second sought-for parameter, the dimensionless pitch of longitudinal installation $\overline{b}_s$, can be determined from the equation (2.2.2), should the third sought-for parameter be found, namely, the dimensionless skin thickness $\overline{\delta}$. Expressions (2.2.1) and (2.2.5) enable finding the dimensionless skin thickness.

Substituting (2.2.2) into the constraint equation (2.1.8) and taking into consideration (2.2.5), we get:

$$\left(\frac{\sigma_{0,2}}{\sqrt{\eta_\sigma} \cdot A}\right)^{\frac{5}{2}} \cdot \frac{1}{E^{\frac{3}{2}} \cdot \pi^2} = \overline{\delta} \cdot \left(\frac{K_p \cdot E}{\sigma_{0,2}}\right)^{\frac{1}{2}} \cdot (\overline{q}_p - \overline{\delta} \cdot \sigma_{0,2}). \qquad (2.2.7)$$

Solution of (2.2.7) with respect to $\overline{\delta}$ leads to the square equation of the kind:

$$\lambda \cdot \overline{\delta}^2 - \beta \cdot \overline{\delta} + \gamma = 0 \qquad (2.2.8),$$

where:

$$\lambda = (K_p \cdot E \cdot \sigma_{0.2})^{1/2},$$

$$\beta = \overline{q}_p \cdot \left(\frac{K_p \cdot E}{\sigma_{0,2}}\right)^{\frac{1}{2}}, \gamma = \left(\frac{\sigma_{0,2}}{\sqrt{\eta_\sigma} \cdot A}\right)^{\frac{5}{2}} \cdot \frac{1}{E^{\frac{3}{2}} \cdot \pi^2}.$$

Solution of (2.2.8) is $$\overline{\delta}_{1,2} = \frac{\beta}{2 \cdot \lambda} \pm \left(\frac{\beta}{4 \cdot \lambda^2} - \frac{\gamma}{\lambda}\right)^{\frac{1}{2}}. \qquad (2.2.9)$$

Substituting into (2.2.9) the values of $\lambda$, $\beta$, $\gamma$, we get:

$$\overline{\delta}_{1,2} = \frac{\overline{q}_p}{2 \cdot \sigma_{0,2}} \pm \sqrt{\frac{\overline{q}_p^2}{4 \cdot \sigma_{0,2}^2} - \left(\frac{\sigma_{0,2}}{E \cdot \pi}\right)^2 \cdot \frac{1}{\left(A \cdot \sqrt{\eta_\sigma}\right)^{\frac{5}{2}} \cdot K_p^{\frac{1}{2}}}}. \qquad (2.2.10)$$

It follows from (2.2.10) that for the same load there exist two values of the dimensionless skin thickness corresponding to the panel minimum weight.

FIG. 45 is a stringer panel with U-shaped TPM.

For the U-shaped (forming with the sheet a closed configuration) TPM, the dimensionless pitch of longitudinal installation of TPM is determined from the following equation:

$$\overline{b}_s = \overline{b}_{re} + \overline{a} + \overline{c} = \overline{\delta} \cdot \left(\frac{K_p \cdot E}{\sigma}\right)^{\frac{1}{2}} + \overline{a} + \overline{c}. \qquad (2.2.11)$$

Then the constraint equation (2.1.8) for the closed profile shall take on the form:

$$\left(\frac{\sigma}{\sqrt{\eta_\sigma} \cdot A}\right)^{\frac{5}{2}} \cdot \frac{1}{E^{\frac{3}{2}} \cdot \pi^2} = \left[\overline{\delta} \cdot \left(\frac{K_p \cdot E}{\sigma}\right)^{\frac{1}{2}} + \overline{a} + \overline{c}\right] \cdot (\overline{q}_p - \overline{\delta} \cdot \sigma). \qquad (2.2.12)$$

The formula to determine the dimensionless thickness of the skin for TPM forming with the sheet a closed configuration shall take on the form:

$$\overline{\delta}_{1,2} = \frac{\overline{q}_p}{2 \cdot \sigma_{0,2}} - \frac{\overline{a} + \overline{c}}{2} \cdot \left(\frac{\sigma_{0,2}}{K_p \cdot E}\right)^{\frac{1}{2}} \pm$$

$$\pm \sqrt{\left[\frac{\overline{q}_p}{2 \cdot \sigma_{0,2}} - \frac{\overline{a} + \overline{c}}{2} \cdot \left(\frac{\sigma_{0,2}}{K_p \cdot E}\right)^{\frac{1}{2}}\right]^2 - \frac{1}{E^2 \cdot \pi^2 \cdot \left(\sqrt{\eta_\sigma} \cdot A\right)^{\frac{5}{2}} \cdot K_p^{\frac{1}{2}}} + \frac{\overline{q}_p \cdot (\overline{a} + \overline{c})}{(K_p \cdot E \cdot \sigma_{0,2})^{\frac{1}{2}}}}. \qquad (2.2.13)$$

The analysis of the radicands in (2.2.10) and (2.2.13) gives the range of admissible values of the panel stress for which optimum values for the skin thickness can be obtained.

FIG. 57 are tables showing (i) a range of allowable values for stringer panel stress factors, and (ii) features of real and optimum-design panels.

It follows from the Table 2.1 shown in FIG. 57 that for TPM forming with the sheet a closed configuration the range of admissible values for the panel stress factors is narrower than that for the open profiles. Actually, the feasible range for the panel stress factors shall be even less, as the optimum dimensionless values for the skin thickness obtained from equations (2.2.10) and (2.2.13) could prove so small that their manufacturing would be impractical.

The panel stress factors pertinent to the most part of aircraft designs constitute $q_p = (20\text{-}60)$ daN/cm$^2$. It follows from Table 2.1 that feasible stress factor for a minimum weight panel exceeds the above values. In the following chapter it will be shown how to find the optimum panel parameters for any feasible stress factor values.

2.3 Design Procedure for Stringer Panel of Feasible Minimum Weight

If a stringer panel shall be designed for any feasible linear compressive loads $q_p$, or if dimensions of the panel cross-section do not meet the constructive restrictions, then the optimum stress shall be considered the stress $\sigma_n$, which would be less than the yield stress, that is, $\sigma_n < \sigma_{0,2}$. In this case the panel would possess the least feasible weight rather than theoretical minimum weight (i.e. the minimum weight accounting for said restrictions). The value of the stress $\sigma_n$ should be as close to $\sigma_{0,2}$ as possible (2.2.4), with this, the TPM stress factor $\overline{P}_s$ would approach its maximum value (2.2.6). This maximum value of the TPM stress factor $\overline{P}_s$ provided panel stress factor $\overline{q}_p$ being constant and panel stress $\sigma$ being at its maximum is only possible with the minimum dimensionless skin sheet thickness $\overline{\delta} = \overline{\delta}_{min}$ (2.2.3).

Let us determine the stress for the least feasible weight panel. To this end, in the equation (2.2.7) the equations $\sigma_{0,2} = \sigma_n$ and $\overline{\delta} = \overline{\delta}_{min}$ shall be accounted for; for the TPM forming with the sheet an open configuration we get:

$$\left(\frac{\sigma_n}{\sqrt{\eta_\sigma} \cdot A}\right)^{\frac{5}{2}} \cdot \frac{1}{E^{\frac{3}{2}} \cdot \pi^2} = \overline{\delta}_{min} \cdot \left(\frac{K_p \cdot E}{\sigma_n}\right)^{\frac{1}{2}} \cdot (\overline{q}_p - \overline{\delta}_{min} \cdot \overline{\sigma}_n), \qquad (2.3.1)$$

$\sigma_n$ being the maximum feasible panel stress provided minimum skin thickness $\delta_{min}$.

Solving (2.3.1) with respect to $\sigma_n$, we get the cubic equation of the type $$\sigma_n^3 + 3 \cdot U \cdot \sigma_n + 2 \cdot V = 0 \qquad (2.3.2),$$

where $$U = \tfrac{1}{3} \cdot (\sqrt{\eta_\sigma} \cdot A)^{5/2} \cdot K_p^{1/2} \cdot (E \cdot \pi)^2 \cdot \overline{\delta}_{min}^2,$$

$$V = -\tfrac{1}{2} \cdot (\sqrt{\eta_\sigma} \cdot A)^{5/2} \cdot K_p^{1/2} \cdot (E \cdot \pi)^2 \cdot \overline{\delta}_{min} \cdot \overline{q}_p.$$

The discriminant of (2.3.2) is determined from the equation:

$$D = V^2 + U^3 \qquad (2.3.3).$$

The discriminant (2.3.3) is positive; therefore equation (2.3.2) shall have the single real root determined from Cardan formula:

$$\sigma_n = \beta + \gamma \qquad (2.3.4),$$

where $$\beta=(\sqrt{V^2+U^3}-V)^{1/3}, \gamma=(-\sqrt{V^2+U^3}-V)^{1/3}.$$

The ductility factor $\eta_\sigma$ appearing in the equation for the stress (2.3.4) shall be determined from equation (1.2.2), replacing therein $\sigma$ with $\sigma_n$; we get $$\eta_\sigma = \frac{\sigma_n}{\sigma_{pr}} \cdot \left(\frac{\sigma_0 - \sigma_n}{\sigma_0 - \sigma_{pr}}\right)^2. \quad (2.3.5)$$

One can deduce from (2.3.5) that the ductility factor $\eta_\sigma$ appearing in the formula for the sought-for stress $\sigma_n$ (2.3.4), in its turn, is dependent from the stress $\sigma_n$. Therefore, $\sigma_n$ and $\eta_\sigma$ are sought for by the successive approximation method in the following way.

In the first approximation, we assume $\eta_{\sigma 1}=1$, and through the equation (2.3.4) we determine the first approximation of the TPM stress $\sigma_{n1}$. If $\sigma_{n1} < \sigma_{pr}$, then given $\sigma_{n1}$, from (2.3.5) we get the second approximation for the ductility factor $\eta_{\sigma 2}$, and so on. The calculation is terminated provided successive approximations for stress $\sigma_n$ (or $\eta_\sigma$) would differ by a preset value.

For the TPM forming with the sheet a closed configuration, the expression (2.2.12) takes on the form:

$$\left(\frac{\sigma_n}{\sqrt{\eta_\sigma} \cdot A}\right)^{\frac{5}{2}} \cdot \frac{1}{E^{\frac{3}{2}} \cdot \pi^2} = 2 \cdot \overline{\delta}_{min} \cdot \left(\frac{K_p \cdot E}{\sigma_n}\right)^{\frac{1}{2}} \cdot (\overline{q}_p - \overline{\delta}_{min} \cdot \sigma_n), \quad (2.3.6)$$

it is assumed here that $$\overline{b}_s = 2 \cdot \overline{b}_{re}. \quad (2.3.7)$$

The values of coefficients U and V of the cubic equation (2.3.2) for the U-shaped TPM will be twice higher.

The maximum feasible panel stress for the minimum skin thickness $\overline{\delta}_{min}$ shall be determined, similarly to that of the open profiles, from equation (2.3.4).

The equation (2.3.4) enables finding the panel stress given the minimum dimensionless skin thickness, hence, determining all the other parameters of the panel cross-section.

The minimum dimensionless skin thickness is determined from the expression $$\overline{\delta}_{min} = \frac{\delta_{min}}{l_{re}}.$$

Here, $l_{re}=l_s$ (for the factor accounting for stringer leaning on rib c=1), while the skin thickness is assumed $\delta_{min}=(0.8-1)$ mm. For smaller skin thickness the countersunk-headed rivets are not employed, as they do not ensure adequate skin fastening strength. Cup-headed rivets are not employed due to aerodynamic restrictions.

2.4 Calculation of Optimum Parameters for a Stringer Panel

Considered here are algorithms for design of stringer panel of optimum weight. Some of the calculation results are presented as plots of optimum parameters versus the panel stress factor. The plots are presented for U-shaped, Z-shaped and L-shaped profiles.

Algorithm of Design for the Theoretical Minimum Weight Stringer Panel

1. An array of panel stress factor values $\overline{q}_p$ is preset.

2. The ductility factor is calculated through equation (1.2.2) replacing therein a with $\sigma_{0.2}$.
3. TPM stress factor is calculated through equation (2.2.6).
4. Optimum characteristic scaled (dimensionless) shape dimensions for TPM are calculated through equations (1.3.3) and (1.3.4) (with $\sigma_s = \sigma_{0.2}$). The absolute shape dimensions are obtained multiplying the scaled dimension values by $l_{re}$ (1.1.3).
5. From equations (2.2.10) and (2.2.13), the optimum dimensionless skin thickness is calculated.
6. From equations (2.2.2) and (2.2.11), the optimum dimensionless pitch of stringer installation is calculated (with $\sigma = \sigma_{0.2}$).
7. From equation (2.2.4), the optimum dimensionless minimum weight of the stringer panel is calculated (with $\sigma = \sigma_{0.2}$).

FIG. 44 is a graph showing dimensionless skin thickness $$\overline{\delta} = \frac{\delta}{l_{re}}$$

versus the panel stress factor $$\overline{q}_p = \frac{q_p}{l_{re}},$$

material D16-T (minimum weight panel).

FIG. 46 is a graph showing dimensionless distance between stringers $$\overline{b}_s = \frac{b_s}{l_{re}}$$

versus the panel stress factor $$\overline{q}_p = \frac{q_p}{l_{re}},$$

material D16-T (minimum weight panel).

The plots of optimum value of the skin thickness $\overline{\delta}$ and pitch of stringer installation $\overline{b}_s$ are presented in FIGS. 44 and 46. Out of the two values of the optimum dimensionless skin thickness $\overline{\delta}$ and pitch of stringer installation $\overline{b}_s$ given a particular value of the panel stress factor, those values of $\overline{\delta}$ and $\overline{b}_s$ are selected that meet the constructive restrictions the best.

FIG. 47 is a plot showing TPM shape width a, b, c versus the panel stress factor $$\overline{q}_p = \frac{q_p}{l_{re}},$$

material D16-T (minimum weight panel).

FIG. 48 is a plot showing TPM shape thickness $\delta_a$, $\delta_b$, $\delta_c$ versus the panel stress factor $$\overline{q}_p = \frac{q_p}{l_{re}},$$

material D16-T (minimum weight panel).

The plots of optimum absolute dimensions of profiles a, b, c, $\delta_a$, $\delta_b$, $\delta_c$ are presented in FIGS. 47, 48.

FIG. 49 is a plot showing dimensionless panel weight $$\overline{G}_s = \frac{G_s}{l_s \cdot l_{re}^2 \cdot \gamma}$$

versus the panel stress factor $$\overline{q}_p = \frac{q_p}{l_{re}},$$

materials D16-T and B95 (least feasible weight panel).

The plot of the dimensionless minimum weight of the stringer panel $\overline{G}_{s.p.}$ with TPM of any shape is presented in FIG. 49.

Algorithm of Design for the Minimum Feasible Weight Stringer Panel

1. An array of panel stress factor values $q_p$ is preset.
2. The minimum dimensionless skin thickness is calculated:

$\delta_{min} = \delta_{min}/l_{re}$

Assumed for the calculation are: $l_{re}=1$ m, $\delta_{min}=1$ mm, minimum dimensionless skin thickness $\overline{\delta}_{min}=0.001$.

3. From equation (2.3.4), stress $\sigma_n$ is determined (if $\sigma_n > \sigma_{pr}$, then $\sigma_n$ is determined through the consecutive approximations method through formula (2.3.5).
4. From equation (2.1.10) the stress factor $\overline{P}_s$ for TPM is calculated (here, $\sigma_s = \sigma_n$).
5. From equations (1.3.3) and (1.3.4), the optimum characteristic scaled TPM shape dimensions are calculated (here, $\sigma_s = \sigma_n$).
6. The optimum dimensionless distance (pitch) between stringers is calculated through equations (2.2.2) and (2.2.11) (here, $\sigma = \sigma_n$).
7. The minimum panel weight is calculated from equation (2.2.4) (here, $\sigma = \sigma_n$).

Some of the calculation results are presented in plots, FIGS. 50 to 54.

FIG. 50 is a plot showing dimensionless distance between stringers $$\overline{b}_s = \frac{b_s}{l_{re}}$$

versus the panel stress factor $$\overline{q}_p = \frac{q_p}{l_{re}},$$

material D16-T (minimum feasible weight panel).

FIG. 51 is a plot showing dimensionless length of TPM shapes $$\overline{a} = \frac{a}{l_{re}},$$

$$\overline{b}_s = \frac{b}{l_{re}}$$

versus the panel stress factor $$\overline{q}_p = \frac{q_p}{l_{re}},$$

material D16-T (minimum feasible weight panel).

FIG. 52 is a plot showing dimensionless length of TPM shapes $$\overline{b}_s = \frac{b}{l_{re}},$$

$$\overline{c} = \frac{c}{l_{re}}$$

versus the panel stress factor $$\overline{q}_p = \frac{q_p}{l_{re}},$$

material D16-T (minimum feasible weight panel).

FIG. 53 is a plot showing dimensionless thickness of U-shaped TPM $$\overline{\delta}_a = \frac{\delta_a}{l_{re}}, \overline{\delta}_b = \frac{\delta_b}{l_{re}}, \overline{\delta}_c = \frac{\delta_c}{l_{re}}$$

versus panel stress factor $$\overline{q}_p = \frac{q_p}{l_{re}^2},$$

material D16-T (minimum feasible weight panel).

FIG. 54 is a plot showing dimensionless thickness of TPM $$\overline{\delta}_b = \frac{\delta_b}{l_{re}}, \overline{\delta}_c = \frac{\delta_c}{l_{re}}$$

versus panel stress factor $$\overline{q}_p = \frac{q_p}{l_{re}^2},$$

material D16-T (minimum feasible weight panel).

2.5 Determining Optimum Inclination Angle of U-Shaped TPM Lateral Web and Optimum Pitch of Rivets for TPM Fastening to Skin FIG. 55 is a stringer panel with U-shaped TPM possessing inclined lateral web.

For the best utilization of the skin within the U-shaped TPM, the lateral webs of the latter are inclined to reach the equality of $b_{sk2}=b_{re}$.

The optimum inclination angle of the lateral web is:

$$\alpha = \arcsin\frac{\overline{b}_{sk} - \overline{a} - \overline{c}}{2}, \quad (2.5.1)$$

where $\overline{b}_{sk}$ is determined from equation (2.2.2).

For the minimum weight panel, $\sigma_s = \sigma_{0.2}$; for the minimum feasible weight panel, $\sigma_s = \sigma_n$. Due to design restrictions, the angle $\alpha$ should be $0 \leq \alpha \leq 60°$.

With this, the pitch of stringer installation is determined from the equation $$\overline{b}_s = \overline{b}_{sk} + \overline{c} + \overline{a} + 2 \cdot \overline{b} \cdot \sin\alpha \quad (2.5.2),$$

where $b_{sk}$ is determined from (2.2.2).

In (2.5.2), the dimensions of the profile $\overline{a}, \overline{b}, \overline{c}$ are dependent on the TPM stress factor $\overline{P}_s$, which, in its turn, is dependent on $\overline{b}_s$ (2.2.3). Therefore, the distance between stringers (pitch of stringer installation) is sought for through consecutive approximation approach. In the first approximation it is assumed that $\overline{b}_s = 2 \cdot b_{re}$.

For the panels of minimum and minimum feasible weight, the optimum pitch $t_{riv}$ shall be selected for TPM fastening to the skin.

The pitch $t_{riv}$ is determined basing on equality of the overall stability critical stress for the skin between the rivets $\sigma_{cr.riv}$ and the stringer critical stress $\sigma_s$, that is $$\sigma_{cr.riv} = \sigma_s \quad (2.5.3),$$

where $$\sigma_{cr.riv} = \frac{c \cdot \pi^2 \cdot E}{(\overline{t}_{riv}/\overline{i}_{sk})^2} \cdot \eta_\sigma, \quad (2.5.4)$$

$\overline{i}_{sk} = \delta/\sqrt{12}$ is the skin radius of gyration.

Solving (2.5.3) accounting for (2.5.4) with respect to $\overline{t}_{riv}$, we get $$\overline{t}_{riv} = \overline{i}_{sk} \cdot \pi \cdot \sqrt{\frac{c \cdot E \cdot \eta_\sigma}{\sigma_s}} = \frac{\delta}{2} \cdot \pi \cdot \left(\frac{c \cdot E \cdot \eta_\sigma}{3 \cdot \sigma_s}\right)^{\frac{1}{2}}. \quad (2.5.5)$$

The equation (2.5.5) holds for both theoretical minimum and minimum feasible weight panels. For the theoretical minimum weight panel, $\sigma_s = \sigma_{0.2}$, while for the minimum feasible weight panel $\sigma_s = \sigma_n$; for both panels, the ductility factor $\eta_\sigma$ is calculated through equation (1.2.2).

Should the pitch of rivets exceed the optimum one (2.5.5), the average stress value in the panel skin (2.1.5) would decrease. Then the cross-section dimensions, hence the panel weight value, would increase.

The absolute dimensions of the TPM shape could prove not to meet the constructive restrictions; in this case, the dimensionless TPM parameters $a_1 = c/b$; $a_2 = b/a$; $a_3 = \delta_c/\delta_b$; $a_4 = \delta_b/\delta_a$ shall be altered in compliance with the method stipulated in section 1. With this, the panel weight increases, though by the minimum feasible value.

2.6 Comparative Analysis of Weight Savings for Stringer Panels

Presented is investigation of possible weight savings for compressed stringer panels of a real torsion wing box, said panels designed by the iterative method. Benchmark data from these panels is utilized to determine weight savings from method outlined in 2.3. With this purpose, compressed stringer panels designed by the iterative method are compared with calculated optimum weight compressed stringer panels using the method outlined in 2.3.

The benchmark data were obtained for panels of torsion box wings of the airliner TU-154. For the purpose of comparative analysis, two panels considerably differing in compressive loads are regarded. The panels were designed for the compressive load $q_p$ constituting, respectively, 934 daN/cm and 555 daN/cm. The overall dimensions of panels are: length $l_s = 45$ and 40 cm, respectively; widths B are 31.4 cm and 33.4 cm.

The longitudinal set (stringers) of these panels is manufactured out of the standard Z-shaped profiles: Pr 105-9 and Pr 105-1. The profiles were fastened to the skin with rivets. The profiles in the amount of five and six pieces were evenly distributed across the panel width with the pitch $b_s = 70$ mm and 58 mm, respectively.

Based on the above benchmark data, optimum weight panels were designed in compliance with the technology outlined in 2.3.

FIG. 56 shows real and optimum design stringer panels.

For the purpose of visualization, portions of cross-sections of the real and optimum design panels are represented superimposed in FIG. 56.

Dimensions of profiles, skin thickness values, pitches of stringer installation, stresses and cross-section areas for real and optimum design panels are summarized in the Table 2.2 (FIG. 57).

Design of optimum weight panels using method in 2.3 decreased panel weight by 19.1% and 19.2%, respectively.

INDUSTRIAL APPLICABILITY

TPM and TPM-panels as contemplated herein may be of any known grade of structural metallic alloys and/or non-metal material so long as suitable to satisfy desired constructive restrictions. The proposed techniques for improved efficiency in designing TPM and TPM-panel configurations for industrial applications, with the intent of their being fitted into a further manufactured profile or system design and taking any feasible to design shape, including fully monolithic TPM-panels, and sandwich TPM-panels with longitudinal load-bearing filler, corrugated components and other shapes depending on specific conditions.

It is believed that TPM and TPM-panels which utilize the proposed modeling and analysis tool will often result in a reduction of structure weight improvement of between 5 and 35 percent or more, as compared to conventional techniques.

It will be understood that each of the elements described above, or two or more together, may also find a useful application in other types of methods differing from the type described above.

While the invention has been illustrated and described as embodied in a method of producing thin wall profile members, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A computer-implemented method to determine optimum cross-section dimensions values of a thin wall profile member (TPM) from a weight-optimization perspective, the TPM having at least one main strip and having at least one additional strip with a free reinforcing rib, the computer-implemented method comprising:

identifying a set of TPM cross-section dimensions ratio values including c/b and $\delta_c/\delta_b$, where c/b is the ratio of a width c of the at least one additional strip with a free reinforcing rib to a width b of the at least one main strip and satisfies the requirement that c/b falls in a range of values between 0.05 and 0.3, and where $\delta_c/\delta_b$ is the ratio of a thickness $\delta_c$ of the at least one additional strip with a free reinforcing rib to a thickness $\delta_b$ of the at least one main strip and satisfies the requirement that $\delta_c/\delta_b$ falls in a range of values between 1.0 and 3.0; and performing computational analysis on a set of inter-dependent parameters, including the identified set of TPM cross-section dimensions ratio values, to calculate optimum cross-section dimensions values of the TPM.

2. The computer-implemented method of claim 1, wherein the set of inter-dependent parameters includes a set of constructive restrictions.

3. The computer-implemented method of claim 2, wherein the step of identifying the set of TPM cross-section dimensions ratio values further comprises:

identifying preset design parameters for the TPM, including at least one of a concentrated compressive force value, material properties, pattern of axes, and a length of the TPM; and establishing the set of constructive restrictions on the basis of the identified preset design parameters.

4. The computer-implemented method of claim 3, wherein the step of performing computational analysis further comprises:

calculating a set of shape efficiency factor values $\Sigma_1$, $\Sigma_2 \ldots \Sigma_n$ using the identified set of TPM cross-section dimensions ratio values and the established set of constructive restrictions, each of the shape efficiency factor values being determined as $\Sigma = K_f K_m$, where $K_f = (i^2/F)^{2/5}$ is an overall stability factor, $K_m = K^{1/5}/(b/\delta_b)^{2/5}$ is a local stability factor, b is the width of the at least one main strip, $\delta_b$ is the thickness of the at least one main strip, i is the radius of gyration of a cross section of the TPM, F is the area of the TPM cross section, and K is the coefficient in the known formula for local stability critical stress;

calculating optimum ratio values on the basis of a maximum shape efficiency factor value obtained from among the calculated set of shape efficiency factor values;

calculating a maximum stress value using the obtained maximum shape efficiency factor value; and calculating the optimum cross-section dimensions values using the calculated optimum ratio values and the calculated maximum stress value.

5. The computer-implemented method of claim 4, wherein the TPM is to be used in a TPM and panel combination (TPM-panel).

6. The computer-implemented method of claim 1, wherein the at least one main strip has a stiffness $\delta_b/b$ that does not exceed a stiffness $\delta_c/c$ of the at least one additional strip with a free reinforcing rib.

7. The computer-implemented method of claim 1, wherein the TPM has at least one additional strip with common reinforcing ribs; and wherein the identified set of TPM cross-section dimensions ratio values further includes a/b and $\delta_a/\delta_b$, where a/b is the ratio of a width a of the at least one additional strip with common reinforcing ribs to the width b of the at least one main strip and satisfies the requirement that a/b falls in a range of values between 0.3 and 0.7, and where $\delta_a/\delta_b$ is the ratio of a thickness $\delta_a$ of the at least one additional strip with common reinforcing ribs to the thickness $\delta_b$ of the at least one main strip and satisfies the requirement that $\delta_a/\delta_b$ falls in a range of values between 1.0 and 3.0.

8. The computer-implemented method of claim 7, wherein the at least one main strip has a stiffness $\delta_b/b$ that does not exceed a stiffness $\delta_a/a$ of the at least one additional strip with common reinforcing ribs and that does not exceed a stiffness $\delta_c/c$ of the at least one additional strip with a free reinforcing rib.

9. A non-transitory computer readable medium including a non-transitory computer program product for determining optimum cross-section dimensions values of a thin wall profile member (TPM) from a weight-optimization perspective, the TPM having at least one main strip and having at least one additional strip with a free reinforcing rib, the computer readable medium having instructions that cause a computer to:

identify a set of TPM cross-section dimensions ratio values including c/b and $\delta_c/\delta_b$, where c/b is the ratio of a width c of the at least one additional strip with a free reinforcing rib to a width b of the at least one main strip and satisfies the requirement that c/b falls in a range of values between 0.05 and 0.3, and where $\delta_c/\delta_b$ is the ratio of a thickness $\delta_c$ of the at least one additional strip with a free reinforcing rib to a thickness $\delta_b$ of the at least one main strip and satisfies the requirement that $\delta_c/\delta_b$ falls in a range of values between 1.0 and 3.0; and perform computational analysis on a set of inter-dependent parameters, including the identified set of TPM cross-section dimensions ratio values, to calculate optimum cross-section dimensions values of the TPM.

10. The non-transitory computer readable medium of claim 9, wherein the set of inter-dependent parameters includes a set of constructive restrictions.

11. The non-transitory computer readable medium of claim 10, wherein the instruction to identify the set of TPM cross-section dimensions ratio values further comprises instructions to:

identify preset design parameters for the TPM, including at least one of a concentrated compressive force value, material properties, pattern of axes, and a length of the TPM; and establish the set of constructive restrictions on the basis of the identified preset design parameters.

12. The non-transitory computer readable medium of claim 11, wherein the instruction to perform computational analysis further comprises instructions to:

calculate a set of shape efficiency factor values $\Sigma_1, \Sigma_2 \ldots \Sigma_n$ using the identified set of TPM cross-section dimensions ratio values and the established set of constructive restrictions, each of the shape efficiency factor values being determined as $\Sigma = K_f \cdot K_m$, where $K_f = (i^2/F)^{2/5}$ is an overall stability factor, $K_m = K^{1/5}/(b/\delta_b)^{2/5}$ is a local stability factor, b is the width of the at least one main strip, $\delta_b$ is the thickness of the at least one main strip, i is the radius of gyration of a cross section of the TPM, F is the area of the TPM cross section, and K is the coefficient in the known formula for local stability critical stress;

calculate optimum ratio values on the basis of a maximum shape efficiency factor value obtained from among the calculated set of shape efficiency factor values;

calculate a maximum stress value using the obtained maximum shape efficiency factor value; and calculate the optimum cross-section dimensions values using the calculated optimum ratio values and the calculated maximum stress value.

13. The non-transitory computer readable medium of claim 12, wherein the TPM is to be used in a TPM and panel combination (TPM-panel).

14. The non-transitory computer readable medium of claim 9, wherein the at least one main strip has a stiffness $\delta_b/b$ that does not exceed a stiffness $\delta_c/c$ of the at least one additional strip with a free reinforcing rib.

15. The non-transitory computer readable medium of claim 9, wherein the TPM has at least one additional strip with common reinforcing ribs; and wherein the identified set of TPM cross-section dimensions ratio values further includes a/b and $\delta_a/\delta_b$, where a/b is the ratio of a width a of the at least one additional strip with common reinforcing ribs to the width b of the at least one main strip and satisfies the requirement that a/b falls in a range of values between 0.3 and 0.7, and where $\delta_a/\delta_b$ is the ratio of a thickness $\delta_a$ of the at least one additional strip with common reinforcing ribs to the thickness $\delta_b$ of the at least one main strip and satisfies the requirement that $\delta_a/\delta_b$ falls in a range of values between 1.0 and 3.0.

16. The non-transitory computer readable medium of claim 15, wherein the at least one main strip has a stiffness $\delta_b/b$ that does not exceed a stiffness $\delta_a/a$ of the at least one additional strip with common reinforcing ribs and that does not exceed a stiffness $\delta_c/c$ of the at least one additional strip with a free reinforcing rib.

17. A computing device for determining optimum cross-section dimensions values of a thin wall profile member (TPM) from a weight-optimization perspective, the TPM having at least one main strip and having at least one additional strip with a free reinforcing rib, the computing device comprising:

a memory configured to store instructions; and a processor configured to execute instructions stored in the memory to perform a method comprising:

identifying a set of TPM cross-section dimensions ratio values including c/b and $\delta_c/\delta_b$, where c/b is the ratio of a width c of the at least one additional strip with a free reinforcing rib to a width b of the at least one main strip and satisfies the requirement that c/b falls in a range of values between 0.05 and 0.3, and where $\delta_c/\delta_b$ is the ratio of a thickness $\delta_c$ of the at least one additional strip with a free reinforcing rib to a thickness $\delta_b$ of the at least one main strips and satisfies the requirement that $\delta_c/\delta_b$ falls in a range of values between 1.0 and 3.0; and performing computational analysis on a set of inter-dependent parameters, including the identified set of TPM cross-section dimensions ratio values, to calculate optimum cross-section dimensions values of the TPM.

18. The computing device of claim 17, wherein the set of inter-dependent parameters includes a set of constructive restrictions.

19. The computing device of claim 18, wherein the identifying the set of TPM cross-section dimensions ratio values further comprises:

identifying preset design parameters for the TPM including at least one of a concentrated compressive force value, material properties, pattern of axes, and a length of the TPM; and establishing the set of constructive restrictions on the basis of the identified preset design parameters.

20. The computing device of claim 19, wherein the performing computational analysis further comprises:

calculating a set of shape efficiency factor values $\Sigma_1, \Sigma_2 \ldots \Sigma_n$ using the identified set of TPM cross-section dimensions ratio values and the established set of constructive restrictions, each of the shape efficiency factor values being determined as $\Sigma=K_f K_m$, where $K_f=(i^2/F)^{2/5}$ is an overall stability factor,
$K_m=K^{1/5}/(b/\delta_b)^{2/5}$ is a local stability factor,
b is the width of the at least one main strip,
$\delta_b$ is the thickness of the at least one main strip,
i is the radius of gyration of a cross section of the TPM,
F is the area of the TPM cross section, and
K is the coefficient in the known formula for local stability critical stress;

calculating optimum ratio values on the basis of a maximum shape efficiency factor value obtained from among the calculated set of shape efficiency factor values;

calculating a maximum stress value using the obtained maximum shape efficiency factor value; and calculating the optimum cross-section dimensions values using the calculated optimum ratio values and the calculated maximum stress value.

21. The computing device of claim 20, wherein the TPM is to be used in a TPM and panel combination (TPM-panel).

22. The computing device of claim 17, wherein the at least one main strip has a stiffness $\delta_b/b$ that does not exceed a stiffness $\delta_c/c$ of the at least one additional strip with a free reinforcing rib.

23. The computing device of claim 17, wherein the TPM has at least one additional strip with common reinforcing ribs; and wherein the identified set of TPM cross-section dimensions ratio values further includes a/b and $\delta_a/\delta_b$, where a/b is the ratio of a width a of the at least one additional strip with common reinforcing ribs to the width b of the at least one main strip and satisfies the requirement that a/b falls in a range of values between 0.3 and 0.7, and where $\delta_a/\delta_b$ is the ratio of a thickness $\delta_a$ of the at least one additional strip with common reinforcing ribs to the thickness $\delta_b$ of the at least one main strip and satisfies the requirement that $\delta_a/\delta_b$ falls in a range of values between 1.0 and 3.0.

24. The computing device of claim 23, wherein the at least one main strip has a stiffness $\delta_b/b$ that does not exceed a stiffness $\delta_a/a$ of the at least one additional strip with common reinforcing ribs and that does not exceed a stiffness $\delta_c/c$ of the at least one additional strip with a free reinforcing rib.

* * * * *

UNITED STATES PATENT AND TRADEMARK OFFICE
CERTIFICATE OF CORRECTION

| | |
|---|---|
| PATENT NO. | : 8,924,187 B1 |
| APPLICATION NO. | : 13/842488 |
| DATED | : December 30, 2014 |
| INVENTOR(S) | : Aleksandr I. Kamenomostkiy |

It is certified that error appears in the above-identified patent and that said Letters Patent is hereby corrected as shown below:

IN THE TITLE PAGE:

Item (54):

Change "TOOL FOR OPTIMIZED THIN WALL PROFILE MEMBER (TPM) AND TPM-PANEL DESIGN AND SELECTION" TO -- TOOL FOR MINIMUM WEIGHT DESIGN OF THIN WALL PROFILE MEMBERS --.

Item (56), first line under PUBLICATIONS:

Change "A. J." to -- A. I. --.

In the designated figure:

Change "$\delta_a$" to -- $\delta_a$ --.

Change the reference, character "a" to -- $a$ --.

The unclear designation for the double-headed arrow located at the lower right side of the figure and oriented perpendicular to the double-headed arrow "a" should be -- $l$ --.

IN THE DRAWINGS:

Figure 1:

Change "$\delta_a$" to -- $\delta_a$ --.

Change the reference character "a" to -- $a$ --.

Signed and Sealed this
Eighth Day of March, 2016

Michelle K. Lee
*Director of the United States Patent and Trademark Office*

IN THE DRAWINGS: (cont.)

The unclear designation for the double-headed arrow located at the lower right side of the figure and oriented perpendicular to the double-headed arrow "a" should be -- $l$ --.

Figure 2:

Change "$\delta_\mathrm{a}$" to -- $\delta_a$ --.

Change the reference character "a" to -- $a$ --.

The unclear designation for the double-headed arrow located at the lower right side of the figure and oriented perpendicular to the double-headed arrow "a" should be -- $l$ --.

Figure 3:

The unclear designation for the double-headed arrow located at the lower right side of the figure and oriented perpendicular to the double-headed arrow "c" should be -- $l$ --.

Figure 4:

The unclear designation for the double-headed arrow located at the lower right side of the figure and oriented perpendicular to the double-headed arrow "c" should be -- $l$ --.

Figure 5:

The unclear designation for the double-headed arrow located at the lower right side of the figure and oriented perpendicular to the double-headed arrow "c" should be -- $l$ --.

Figure 6:

The unclear designation for the double-headed arrow located at the lower right side of the figure and oriented perpendicular to the double-headed arrow "c" should be -- $l$ --.

Figure 7:

The unclear designation for the double-headed arrow located at the lower right side of the figure and oriented perpendicular to the double-headed arrow "c" should be -- $l$ --.

Figure 8:

Change "$\delta_\mathrm{a}$" to -- $\delta_a$ --.

Change the reference character "a" to -- $a$ --.

IN THE DRAWINGS: (cont.)

The unclear designation for the double-headed arrow located at the lower right side of the figure and oriented perpendicular to the double-headed arrow "a" should be -- $l$ --.

Figure 10:

The unclear designation for the double-headed arrow located at the lower right side of the figure and oriented perpendicular to the double-headed arrow "B" should be -- $l_s$ --.

Change "$b_c$" to -- $b_s$ --.

Figure 11:

The unclear designation for the double-headed arrow located directly above and parallel to the double-headed arrow "L" should be -- $l_r$ --.

Change "$b_c$" to -- $b_s$ --.

Figure 14:

The unclear designation for the double-headed arrow located at the lower right side of the figure and oriented perpendicular to the double-headed arrow "B" should be -- $l_s$ --.

Change "$b^1_c$" to -- $b^1_s$ --.

Change "$\delta_a$" to -- $\delta_a$ --.

Change the reference character "a" to -- $a$ --.

Figure 15:
The unclear designation for the double-headed arrow located directly above and parallel to the double-headed arrow "L" should be -- $l^1_r$ --.

Change "$b^1_c$" to -- $b^1_s$ --.

Figure 43:

Change "$\bar{\sigma}_s$" with the overline on the horizontal axis to -- $\sigma_s$ -- without an overline.

Figure 51:

Change " $\bar{b}_s$ " to -- $\bar{b}$ --.

IN THE DRAWINGS: (cont.)

Figure 57:

Change "Range of allowable values for the stringer panel stress factors" to -- (*i*) Range of allowable values for the stringer panel stress factors --.

Change "Features of real and optional-design panels" to -- (*ii*) Features of real and optional-design panels --.

IN THE SPECIFICATION:

Col. 1, in the title, change "TOOL FOR OPTIMIZED THIN WALL PROFILE MEMBER (TPM) AND TPM-PANEL DESIGN AND SELECTION" TO -- TOOL FOR MINIMUM WEIGHT DESIGN OF THIN WALL PROFILE MEMBERS --.

Col. 4, between lines 25 and 30, change " $\bar{b}_s$ " to -- $\bar{b}$ --.

Col. 5, ln. 15, change " $\bar{b}_s$ " to -- $\bar{b}$ --.

Col. 6, ln. 36, change "a" to -- $a$ --.

Col. 7, ln. 15, change "ā = a/$l_{re}$" to -- $\bar{a} = a/l_{re}$ --.

Col. 7, ln. 20, change " $\bar{b}_s = b/l_{re}$ " to -- $\bar{b} = b/l_{re}$ --.

Col. 7, ln. 53, delete " $\bar{\delta}_a =$ ".

Col. 7, ln. 57, insert -- $\bar{\delta}_a =$ -- before "$\delta_a/l_{re}$".

Col. 9, ln. 2, change "minimum" to -- constant --.

Col. 9, ln. 51, change "l" to -- $L$ --.

Col. 9, ln. 58, change "l$_s$" to -- $l$, $l_s$, or $l_r$ --.

Col. 9, ln. 59, change both instances of "l$_{re}$" to -- $l_{re}$ --, change "l$_s$" to -- $l_s$ --, and change "√ cs" to -- $\sqrt{c_s}$ --.

Col. 9, ln. 60, change "l$_r$" to -- $l_r$ --.

Col. 9, ln. 62, change "a" to -- $a$ --.

CERTIFICATE OF CORRECTION (continued)
U.S. Pat. No. 8,924,187 B1

Page 5 of 12

IN THE SPECIFICATION: (cont.)

Col. 10, ln. 4, insert -- (tangential) -- between the terms "shear" and "stress".

Col. 10, ln. 5, change both instances of the subscript "$c$" to the subscript -- $s$ -- and change "$P/l_{re}^2$" to -- $P_s/l_{re}^2$ --.

Col. 10, ln. 6, in the formula change the "$P_p$" with the overline to a -- $q_p$ -- with an overline, and change "$P/(B \cdot l_{re}) = q/l_{re}$" to -- $P_s/(B \cdot l_{re}) = q/l_{re}$ --.

Col. 10, between lns. 20-25, change to "$\eta_\omega$" to -- $\eta_\sigma$ -- and change "$K_w$" to -- $K_\sigma$ --.

Col. 12, ln. 48, change "Dit" to -- $D/t$ --.

Col. 15, ln. 24, change first instance of "a" to -- $a$ --.

Col. 15, ln. 31, change last instance of "a" to -- $a$ --.

Col. 16, ln. 7, change first instance of "a" to -- $a$ --.

Col. 16, ln. 18, change last instance of "a" to -- $a$ --.

Col. 16, ln. 24, change "$\delta_a/a \geq \delta_b/b$ and $\delta_c \geq \delta_b/b$" to -- $\delta_a/a \leq \delta_c/c$ --.

Col. 16, ln. 40, formula (5), change "$l$" to -- $l_r$ --.

Col. 16, ln. 44, change "$b_c$" to -- $b_s$ --.

Col. 16, ln. 48, change "l" to -- $l_r$ --.

Col. 16, ln. 50, change "$b_c$" to -- $b_s$ --.

Col. 16, ln. 57, change "$\delta_b/b \leq \delta_a/a \leq \delta_a/a \leq \delta_c/c$" to -- $\delta_b/b \leq \delta_a/a \leq \delta_c/c$ --.

Col. 16, ln. 63, formula (7), change "$b_c$" to -- $b_s$ -- and change to "$l_n$" to -- $l_r$ --.

Col. 16, ln. 64, change "$l_n$" to -- $l_r$ --.

Col. 17, ln. 1, change "$b_c$" to -- $b_s$ --.

Col. 17, ln. 13, formula (5), change "$l$" to -- $l_r$ --.

Col. 17, ln. 18, formula (8), change "$b^1_c$" to -- $b^1_s$ --.

Col. 17, ln. 21, change "l" to -- $l_r$ --.

CERTIFICATE OF CORRECTION (continued)
U.S. Pat. No. 8,924,187 B1

IN THE SPECIFICATION: (cont.)

Col. 17, ln. 23, change "$b^1_c$" to -- $b^1_s$ --.

Col. 17, ln. 30, change the last instance of "a" to -- $a$ --.

Col. 17, ln. 36, formula (9), change "$b^1_c$" to -- $b^1_s$ -- and change "$l^1_n$" to -- $l^1_r$ --.

Col. 17, ln. 38, change "$l^1_n$" to -- $l^1_r$ --.

Col. 17, ln. 42, change "$b^1_c$" to -- $b^1_s$ --.

Col. 17, ln. 52, change the instance of "a" between the terms "width" and "so" to -- $a$ --.

Col. 17, ln. 53, change the third instance of "a" to -- $a$ --.

Col. 19, ln. 34, change "10-15" to -- 1-8 --.

Col. 19, ln. 42, change second instance of "a" to -- $a$ --.

Col. 19, ln. 47, change first instance of "a" to -- $a$ --.

Col. 19, ln. 55, formula (1), change "$a/b$" to -- $a/b =$ --.

Col. 19, ln. 60, change first instance of "a" to -- $a$ --.

Col. 19, ln. 63, change second instance of "a" to -- $a$ --.

Col. 20, ln. 9, change last instance of "a" to -- $a$ --.

Col. 20, ln. 28, change "$\Sigma$" to -- $\Sigma,$ --.

Col. 21, ln. 57, formula (5), change "$l$" to -- $l_r$ --.

Col. 21, ln. 59, formula (6), change "$b_c$" to -- $b_s$ --.

Col. 21, ln. 62, change "$b_c$" to -- $b_s$ --.

Col. 21, ln. 65, change "l" to -- $l_r$ --.

Col. 22, ln. 6, change the second instance of "a" to -- $a$ --.

Col. 22, ln. 17, formula (5), change "l" to -- $l_r$ --.

Col. 22, ln. 20, formula (8), change "$b^1_c$" to -- $b^1_s$ --.

CERTIFICATE OF CORRECTION (continued)
U.S. Pat. No. 8,924,187 B1

IN THE SPECIFICATION: (cont.)

Col. 22, ln. 23, change "$b^1_c$" to -- $b^1_s$ --.

Col. 22, ln. 26, change "l" to -- $l_r$ --.

Col. 22, ln. 31, change the last instance of "a" to -- $a$ --.

Col. 23, ln. 20, formula (5), change "$n_n$" to -- $n_r$ --.

Col. 23, ln. 22, formula (6), change "$b_c$" to -- $b_s$ --.

Col. 23, ln. 25, change "$n_n$" to -- $n_r$ --.

Col. 23, ln. 27, change "$b_c$" to -- $b_s$ --.

Col. 23, ln. 31, change "$l_n$" to -- $l_r$ --.

Col. 23, ln. 35, formula (7), change "$l_n$" to -- $l_r$ -- and change "$b_c$" to -- $b_s$ --.

Col. 23, ln. 42, change the first instance of "a" to -- $a$ --.

Col. 23, ln. 56, change the last instance of "a" to -- $a$ --.

Col. 23, ln. 61, formula (5), change "$n^1_n$" to -- $n^1_r$ --.

Col. 23, ln. 63, formula (8), change "$b^1_c$" to -- $b^1_s$ --.

Col. 23, ln. 66, change "$b^1_c$" to -- $b^1_s$ --.

Col. 24, ln. 2, change "$n^1_n$" to -- $n^1_r$ --.

Col. 24, ln. 3, change "$l^1_n$" to -- $l^1_r$ --.

Col. 24, ln. 8, formula (9), change "$b^1_c$" to -- $b^1_s$ -- and change "$l^1_n$" to -- $l^1_r$ --.

Col. 24, ln. 12, formula (11), change "$B = n_c \cdot b_c = n^1_c \cdot b^1_c$" to -- $B = n_r \cdot b_s = n^1_r \cdot b^1_s$ --.

Col. 24, ln. 13, change "$n_c, n^1_c$" to -- $n_r, n^1_r$ --.

Col. 24, ln. 19, formula (12), change "$L = n_n \cdot l_n = n^1_n \cdot l^1_n$" to -- $L = n_r \cdot l_r = n^1_r \cdot l_r$ --.

Col. 24, ln. 20, change "$n_n$" to -- $n_r$ -- and change "$n^1_n$" to -- $n^1_r$ --.

Col. 24, ln. 52, change seventh instance of "a" to -- $a$ --.

CERTIFICATE OF CORRECTION (continued)
U.S. Pat. No. 8,924,187 B1

IN THE SPECIFICATION: (cont.)

Col. 24, ln. 53, change "$\delta_a/a$" to -- $\delta_a/a$ --.

Col. 27, ln. 43, change "$a_1$" to -- $a_1$ --.

Col. 27, ln. 47, change "$a_2$" to -- $a_2$ --.

Col. 27, ln. 49, change both instances of "$a_1, a_2$" to -- $a_1, a_2$ --.

Col. 27, ln. 52, change "$a_1^{op}$" to -- $a_1^{op}$ --.

Col. 27, ln. 52, change "$a_2^{op}$" to -- $a_2^{op}$ --.

Col. 27, ln. 55, change "$a_1^{op}$" to -- $a_1^{op}$ --.

Col. 27, ln. 55, change "$a_2^{op}$" to -- $a_2^{op}$ --.

Col. 27, ln. 59, change "$a_1^{op}$" to -- $a_1^{op}$ --.

Col. 27, ln. 61, change "$a^{op}$" to -- $a_2^{op}$ --.

Col. 27, ln. 65, change "$a_2^{op}$" to -- $a_2^{op}$ --.

Col. 28, ln. 2, change "$a_1$" to -- $a_1$ -- and change "$a_2$" to -- $a_2$ --.

Col. 28, ln. 5, change "$a_1^{op}$" to -- $a_1^{op}$ --.

Col. 28, ln. 6, change "$a_2^{op}$" to -- $a_2^{op}$ --.

Col. 28, ln. 10, change "$a_1^{op}$" to -- $a_1^{op}$ --.

Col. 28, ln. 11, change "$a_2^{op}$" to -- $a_2^{op}$ --.

Col. 28, ln. 21, change "$a_1^{op}$" to -- $a_1^{op}$ --.

Col. 28, ln. 21, "$a_2^{op}$" to -- $a_2^{op}$ --.

Col. 28, ln. 22, change "$a_1^{op}$" to -- $a_1^{op}$ --.

Col. 28, ln. 23, change "$a_2^{op}$" to -- $a_2^{op}$ --.

Col. 28, ln. 27, change "$a_1^{op}$" to -- $a_1^{op}$ --.

Col. 28, ln. 27, change "$a_2^{op}$" to -- $a_2^{op}$ --.

CERTIFICATE OF CORRECTION (continued)
U.S. Pat. No. 8,924,187 B1

IN THE SPECIFICATION: (cont.)

Col. 28, ln. 28, change "a$_1^{op}$" to -- $a_1^{op}$ --.

Col. 28, ln. 30, change "a$_2^{op}$" to -- $a_2^{op}$ --.

Col. 28, Table 1, change "a$_1^{op}$" to -- $a_1^{op}$ --.

Col. 28, Table 1, change "a$_2^{op}$" to -- $a_2^{op}$ --.

Col. 28, Table 2, change "a$_1^{op}$" to -- $a_1^{op}$ --.

Col. 28, Table 2, change "a$_2^{op}$" to -- $a_2^{op}$ --.

Col. 30, ln. 54, change both instances of "l$_{re}$" to -- $l_{re}$ --.

Col. 30, formula between lines 60 and 65, change "$cr.i$" to -- $cr.l$ --.

Col. 31, ln. 3, change "$a_1, a_2$" to -- $a_1, a_2$ --.

Col. 31, ln. 4, change "a$_n$" to -- $a_n$ --.

Col. 31, ln. 5, change third instance of "a" to -- $a$ --.

Col. 31, ln. 28, formula (1.1.3), change "$i^2_s$" to -- $i^2_s$ -- with an overline.

Col. 31, ln. 36, change the three instances of "$a_1, a_2$" to -- $a_1, a_2$ --.

Col. 31, ln. 36, change the three instances of "a$_n$" to -- $a_n$ --.

Col. 31, between lns. 45 and 50, formula (1.1.5), delete the subscript "$c$" in the denominator of the formula.

Col. 31, ln. 60, change "$a_1, a_2$" to -- $a_1, a_2$ --.

Col. 31, ln. 60, change "a$_n$" to -- $a_n$ --.

Col. 32, ln. 1, change first instance of "a" to -- $a$ --.

Col. 32, ln. 5, insert a -- , -- immediately after the formula.

Col. 32, ln. 10, change the subscript "$i$" in the numerator of the formula to -- $l$ -- and insert a -- , -- immediately after the formula.

Col. 32, ln. 19, delete "1 and 2".

CERTIFICATE OF CORRECTION (continued)
U.S. Pat. No. 8,924,187 B1

IN THE SPECIFICATION: (cont.)

Col. 32, ln. 66, change "σ" to -- $\sigma_s$ --.

Col. 33, ln. 42, change "ā" to -- $\bar{a}$ --.

Col. 33, ln. 44, formula (1.3.1), change "$\sigma_c$" to -- $\sigma_s$ --.

Col. 33, ln. 60, change "ā" to -- $\bar{a}$ --.

Col. 34, ln. 36, change "$a_1, a_2$" to -- $a_1, a_2$ --.

Col. 34, ln. 36, change "$a_n$" to -- $a_n$ --.

Col. 35, ln. 14, change "$a_1, a_2..., a_n$" to -- $a_1, a_2..., a_n$ --.

Col. 35, ln. 16, change "$a_1^{op}, a_2^{op}..., a_n^{op}$" to -- $a_1^{op}, a_2^{op}..., a_n^{op}$ --.

Col. 35, ln. 21, change "$a_1^{op}, a_2^{op}..., a_n^{op}$" to -- $a_1^{op}, a_2^{op}..., a_n^{op}$ --.

Col. 35, ln. 21, change last instance of "$a_1^{op}$" to -- $a_1^{op}$ --.

Col. 35, ln. 22, change "$a_2^{op}..., a_n^{op}$" to -- $a_2^{op}..., a_n^{op}$ --.

Col. 35, ln. 24, change "$a^{op}$" to -- $a^{op}$ --.

Col. 35, ln. 25, change "$a^{op}$" to -- $a^{op}$ --.

Col. 35, ln. 26, change "$a_1^{op}, a_2^{op}..., a_n^{op}$" to -- $a_1^{op}, a_2^{op}..., a_n^{op}$ --.

Col. 35, ln. 37, delete "(Table 1.1 in FIG. 41)".

Col. 36, ln. 47, change "Table 1.1 (FIG. 41)" to -- FIG. 41 --.

Col. 36, ln. 56, change "$a_1^{op}$" to -- $a_1^{op}$ --.

Col. 37, ln. 6, change "Table 1.1" to -- FIG. 41 -- and change "factors value" to -- factor values --.

Col. 37, ln. 21, change "$a_1, a_2$" to -- $a_1, a_2$ --.

Col. 37, ln. 23, change "$a_1^{op}$" to -- $a_1^{op}$ --.

Col. 37, ln. 24, change "$a_2^{op}$" to -- $a_2^{op}$ --.

Col. 37, ln. 25, change "31" to -- "21" --.

IN THE SPECIFICATION: (cont.)

Col. 38, ln. 20, change "$a_1^{op}$" to -- $a_1^{op}$ --.

Col. 38, ln. 21, change "$a_2^{op}$" to -- $a_2^{op}$ --.

Col. 38, ln. 59, change "as" to -- $\sigma_s$ --.

Col. 39, ln. 25, change "$l$" to -- $l_s$ --.

Col. 40, ln. 23, change "(2.13)" to -- (2.1.7) --.

Col. 40, between lns. 30 and 35, formula (2.1.8), change to "$[$" to -- [ --.

Col. 41, ln. 32, change "shape" to -- stress --.

Col. 43, ln. 65, change "Table 2.1" to -- ($i$) --.

Col. 44, lns. 7-8, change "Table 2.1" to -- ($i$) FIG. 57 --.

Col. 44, ln. 35, formula (2.3.1), change the "$\sigma_n$" with the overline at the end of the formula to -- $\sigma_n$ -- without an overline.

Col. 46, ln. 2, change second instance of "a" to -- $\sigma$ --.

Col. 46, ln. 8, change "$l_{re}$" to -- $l_{re}$ --.

Col. 46, ln. 51, change third instance of "a" to -- $a$ --.

Col. 47, ln. 1, change second instance of "a" to -- $a$ --.

Col. 47, ln. 24, change "$l_{re}$" to -- $l_{re}$ --.

Col. 47, ln. 65, change " $\overline{b_s}$ " to -- $\overline{b}$ --.

Col. 48, formula between lines 10 and 15, change " $\overline{b_s}$ " to -- $\overline{b}$ --.

Col. 49, ln. 17, change "$\bar{a}$" to -- $\bar{a}$ --.

Col. 49, ln. 58, change "$a_1$", "$a_2$", "$a_3$", and "$a_4$" to -- $a_1$ --, -- $a_2$ --, -- $a_3$ --, and -- $a_4$ --, respectively.

Col. 50, ln. 11, change "$l_s$" to -- $l_s$ --.

Col. 50, ln. 28, change "the Table 2.2" to -- ($ii$) --.

CERTIFICATE OF CORRECTION (continued)
U.S. Pat. No. 8,924,187 B1

IN THE CLAIMS:

Claim 7, col. 53, ln. 23, change "a/$b$" to -- $a/b$ --.

Claim 7, col. 53, ln. 24, change "a/b" to -- $a/b$ -- and change "width a" to -- width $a$ --.

Claim 7, col. 53, ln. 26, change "a/$b$" to -- $a/b$ --.

Claim 8, col. 53, ln. 34, change "$\delta_a$/a" to -- $\delta_a/a$ --.

Claim 15, col. 54, ln. 42, change both instances of "a/b" to -- $a/b$ -- and change "width a" to -- width $a$ --.

Claim 15, col. 54, ln. 45, change "a/b" to -- $a/b$ --.

Claim 16, col. 54, ln. 52, change "$\delta_a$/a" to -- $\delta_a/a$ --.

Claim 17, col. 55, ln. 6, change "strips" to -- strip --.

Claim 23, col. 56, ln. 22, change both instances of "a/b" to -- $a/b$ --.

Claim 23, col. 56, ln. 23, change "width a" to -- width $a$ --.

Claim 23, col. 56, ln. 25, change "a/b" to -- $a/b$ --.

Claim 24, col. 56, ln. 33, change "$\delta_a$/a" to -- $\delta_a/a$ --.